United States Patent
Sasaoka et al.

(10) Patent No.: US 6,462,265 B1
(45) Date of Patent: *Oct. 8, 2002

(54) TERMINAL LEAD-OUT STRUCTURE AND SOLAR-CELL APPARATUS PROVIDED WITH SUCH STRUCTURE

(75) Inventors: Makoto Sasaoka, Kyoto; Kimitoshi Fukae, Nara; Masahiro Mori, Kyoto; Yuji Inoue, Nara; Fumitaka Toyomura, Kyoto, all of (JP)

(73) Assignee: Canon Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/694,582

(22) Filed: Aug. 9, 1996

(30) Foreign Application Priority Data

| Aug. 15, 1995 | (JP) | 7-208255 |
| Aug. 15, 1995 | (JP) | 7-208256 |
| Aug. 15, 1995 | (JP) | 7-208257 |
| Sep. 19, 1995 | (JP) | 7-263662 |
| Sep. 19, 1995 | (JP) | 7-263663 |
| Oct. 26, 1995 | (JP) | 7-300502 |
| Jan. 4, 1996 | (JP) | 8-014773 |
| Jan. 4, 1996 | (JP) | 8-014774 |

(51) Int. Cl.$^7$ .............................................. H01L 31/05
(52) U.S. Cl. ..................... 136/251; 136/256; 174/50; 174/52.2; 361/726; 361/730
(58) Field of Search ................... 136/251, 256; 361/726, 730; 174/52.2, 50

(56) References Cited

U.S. PATENT DOCUMENTS

| 4,295,181 A | * | 10/1981 | Chang et al. ............... 361/732 |
| 4,457,578 A | * | 7/1984 | Taylor ......................... 136/251 |
| 4,830,038 A | * | 5/1989 | Anderson et al. ........... 136/251 |
| 4,899,257 A | * | 2/1990 | Yamamoto .................. 361/732 |
| 5,001,603 A | * | 3/1991 | Villaneuva, III et al. ... 361/730 |
| 5,110,369 A | * | 5/1992 | Tornstrom et al. .......... 136/251 |
| 5,217,540 A | * | 6/1993 | Ogura ......................... 136/251 |
| 5,280,133 A | * | 1/1994 | Nath ........................... 136/251 |
| 5,383,098 A | * | 1/1995 | Ma et al. .................... 361/759 |
| 5,409,549 A |   | 4/1995 | Mori ........................... 136/244 |
| 5,568,362 A | * | 10/1996 | Hansson ..................... 361/736 |

FOREIGN PATENT DOCUMENTS

| EP | 521189 A | * | 1/1993 | ................ 136/251 |
| JP | 165364 | * | 12/1981 | ................ 136/251 |
| JP | 43580 | * | 3/1983 | ................ 136/251 |
| JP | 54972 | * | 3/1987 | ................ 136/251 |

* cited by examiner

Primary Examiner—Nam Nguyen
Assistant Examiner—Steven H. Versteeg
(74) Attorney, Agent, or Firm—Fitzpatrick, Cella, Harper & Scinto

(57) ABSTRACT

A terminal lead-out structure of a highly reliable solar cell module having a good operativity comprises a hollow structure for the insulating protection of an electrode lead-out portion of the solar cell module. The hollow structure is provided with an extrusion at least on a part of the surface thereof to face the solar cell module. The hollow structure is bonded to the solar cell module by the application of an adhesive agent.

63 Claims, 35 Drawing Sheets

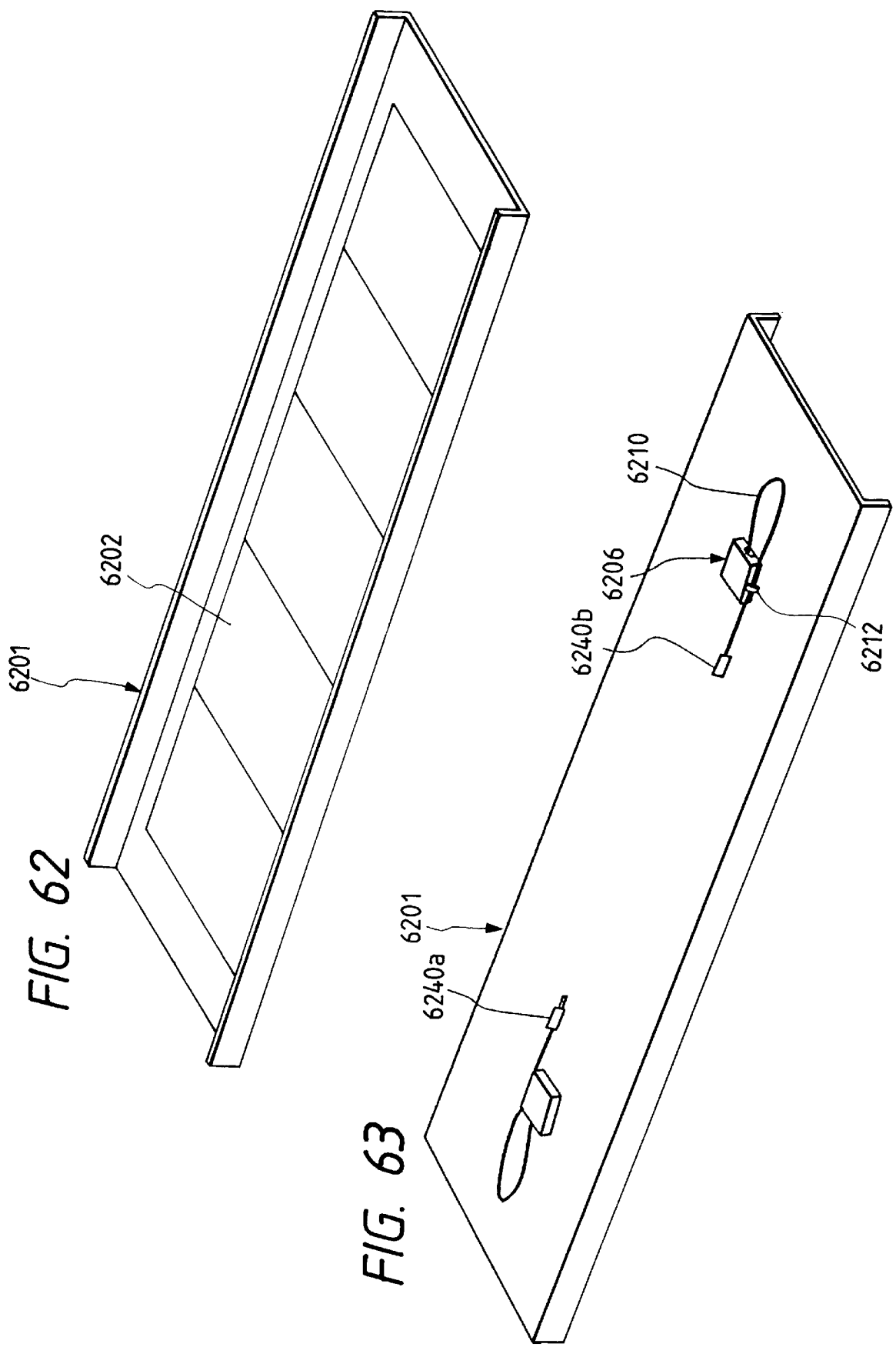

TERMINAL LEAD-OUT STRUCTURE AND SOLAR-CELL APPARATUS PROVIDED WITH SUCH STRUCTURE

BACKGROUND OF THE INVENTION

1. Field of the Invention

The present invention relates to a terminal lead-out structure and a solar-cell apparatus provided with such structure. More particularly, the invention relates to a highly reliable terminal lead-out structure having a good operativity in leading out a terminal, and relates to a solar-cell apparatus provided with such structure.

2. Related Background Art

In recent years, the consciousness of environmental problems has increasingly intensified and widely spread all over the world. Particularly, apprehensions are sensed more seriously with respect to the warming phenomena of the earth brought about by the $CO_2$ emission. The provision of clean energy is more in demand increasingly. At present, a solar cell is regarded as a source of clean energy because it is safe and easy to handle.

There are various modes of solar cells. As typical ones, the following can be named: (1) a crystal silicon solar cell, (2) a polycrystalline silicon solar cell, and other crystalline silicon solar cells, (3) an amorphous silicon solar cell, (4) a copper indium selenide solar cell, and (5) a compound semiconductor solar cell, among others. Conceivably, it is possible to produce, among those solar cells, thin filmed crystalline solar cells, compound semiconductor solar cells, and amorphous silicon solar cells on a large scale at comparatively low costs. Therefore, research and development on them have been in progress in many fields in recent years.

Usually, the solar cell elements, which generate solar power and constitute solar cells, are buried in a filling agent, such as EVA (ethylene-butyl vinyl copolymer) or the like. Also, each of the solar cell elements buried in such filling agent is sandwiched between a surface coating material and a rear side reinforcement material. Each of them is used as a module (a solar cell module). In this case, glass or weatherability film, such as fluororesin film, is adopted as the surface coating material. Also, as the rear side reinforcement material, the following is used, among others: a weatherability and damp-proof film structured by sandwiching aluminum foil with weatherability films; a thin steel plate such as uncoated galvanized steel plate; a steel plate coated by polyester resin or acrylic resin in consideration of its bending capability, hardness, and others; or a plastic plate.

As an output terminal of such solar cell module, there has been conventionally used, among others, a screw fixation type, a lead line type, or a socket type. For any one of them, there is often produced a terminal lead-out structure, such as a terminal box having a water-proof structure for insulation.

Also, for the structure of the terminal lead-out unit of a portable solar cell module, there is, among others, just a simple structure wherein soldered terminals are buried in a filling agent or wherein such terminal unit is covered by a thermal contraction tube or a rubber cover, which dually serves as an edge cover of the module.

Now, as described above, a solar cell is generally used as a clean and non-exhaustive source of energy supply. Also, research and development is carried on in various ways, including an active development of solar cell module well suited for the installation on the ground as well as on the roof.

Particularly, with respect to the installation on the roof, it is useful to develop a solar cell module that functions dually as a roofing material, such as the one being formed integrally with a roofing material, so as to lower the costs for promoting use of solar cells more in the future.

However, if the terminal lead-out structure of a solar cell module is such that the soldered portions are simply covered by insulators, there is a problem that the tension exerted on the terminal lead line is directly carried over to the electrode lead-out unit of the solar cell module.

The other problems encountered in this respect are that the fluororesin film used as the surface coating material for a solar cell module and the filling agent are not adhesively bonded well so that rainwater permeates through the interface between them, the terminal box cannot be fixed on the light receiving surface side of a solar cell module, or some others.

SUMMARY OF THE INVENTION

It is an object of the present invention to provide the terminal lead-out structure of a solar cell module having a good water-proof capability, a good strength against physical load, and a high durability, and also, to provide a solar-cell apparatus having such structure.

It is another object of the invention to provide the terminal lead-out structure of a solar cell module having a good adhesive operativity and a high reliability, and also, to provide a solar-cell apparatus having such structure.

It is still another object of the invention to provide the terminal lead-out structure of a solar cell module having a beautiful outer appearance, and to provide a solar-cell apparatus having such structure.

It is a further object of the invention to provide the terminal lead-out structure of a solar cell module of a simple, inexpensive, and space saving screw fixation type, and also, to provide a solar-cell apparatus having such structure.

In consideration of the problems encountered in the conventional technique described above, the present invention is designed. It is an object of the invention to provide a terminal lead-out structure for use with a solar cell whose operativity and uniformity of operation are excellent at the time of installation, and whose operation costs are low and reliability is high once the installation is completed, and also, to provide a solar-cell apparatus having such structure.

In consideration of the problems encountered in the conventional technique described above, it is another object of the invention to provide the terminal lead-out structure of a solar cell module having a good water proof capability, a good operativity, and a high reliability, and also, to provide a solar-cell apparatus having such structure.

In consideration of the problems encountered in the conventional technique described above, it is still another object of the invention to improve the operativity of a solar-cell apparatus at the time of its post processing and installation.

It is a further object of the invention to provide a terminal lead-out structure comprising a lead line drawn out from the electrode lead-out unit on the light receiving side of a solar cell module having a weatherability film treated to discharge electricity at least on a part of its light receiving surface side; and a hollow structure arranged on a part where the electricity discharge is treated for the weatherability film for the insulating protection of the electrode lead-out unit, here, the interior of the hollow structure being filled with a filling agent, and also to provide a solar-cell apparatus having such terminal lead-out structure.

It is still a further object of the invention to provide a terminal lead-out structure having a hollow structure for the insulating protection of the electrode lead-out unit of an apparatus, wherein an extrusion is arranged at least on a part of the surface of the hollow structure to face the apparatus, and such extrusion is adhesively bonded to the apparatus by the application of an adhesive agent, and also, to provide a solar-cell apparatus having such terminal lead-out structure.

It is another object of the invention to provide a terminal lead-out structure having a hollow structure for the insulating protection of the electrode lead-out unit of an apparatus, wherein a series of extrusions are arranged on the surface of the hollow structure to face the apparatus to surround an electrode lead-out hole on the aforesaid surface, and a through hole is arranged on a surface other than the surface opposite to the apparatus for filling a filling agent in the hollow structure, and at the same time, the outer surface from the outer edge of the extrusions is adhesively bonded by an adhesive agent, and the filling agent is filled in the inner side from the inner edge of the extrusions for the insulating protection of the terminal lead-out structure, and also, to provide a solar-cell apparatus having such structure.

It is another object of the invention to provide a terminal lead-out structure having a hollow structure for the insulating protection of the electrode lead-out of the apparatus, wherein an extrusion is formed on the outer edge portion of the surface of the hollow structure to face the apparatus, and the extrusion is adhesively bonded to the apparatus by an adhesive agent, and also, to provide a solar-cell apparatus having such structure.

It is another object of the invention to provide a terminal lead-out structure having a hollow structure provided with a lead-out hole on the bottom thereof to lead out a lead line from an electrode lead-out unit, a lead-out hole on one side thereof to lead out an output cable, and an aperture on the top thereof, and with a lid member to cover the aperture, wherein the hollow structure is provided with extrusions on both sides adjacent to the aforesaid one side, and the lid member is provided with a flexible hook portion including recessed portions to engage with the extrusions, and also, to provide a solar-cell apparatus having such terminal lead-out structure.

It is another object of the invention to provide a terminal lead-out structure having a hollow structure provided with a lead-out hole on the bottom thereof to lead out a lead line from an electrode lead-out unit, a lead-out hole on one side thereof to lead out an output cable, and an aperture on the top thereof, and with a lid member to cover the aperture, wherein an extrusion is arranged on the fitting surface of the hollow structure and a recessed groove on the fitting surface of the lid member corresponding to the extrusion or a recessed groove is arranged on the fitting surface of the terminal lead-out box main body and an extrusion on the fitting surface of the lid member corresponding to the recessed groove, and further, a receiving portion is arranged on the terminal lead-out box main body to receive a flexible hooking portion, while making the width of the receiving portion equal to the width of the flexible hooking portion, and when the terminal lead-out box main body and the lid member, which are arranged in the recessed portion whose depth is equal to the thickness of the flexible hooking portion from the outer circumference of the hollow structure, are fitted together, the receiving portion is arranged to enable the outer surface of the terminal lead-out box and the outer surface of the flexible hooking portion to form a substantially flat surface, and also, to provide a solar-cell apparatus having such terminal lead-out structure.

It is another object of the invention to provide a terminal lead-out structure having a hollow structure arranged on the electrode lead-out unit of an apparatus for the insulating protection of the electrode lead-out unit, a lead line drawn from the electrode lead-out unit, an output lead line to connect the apparatus and another solar cell module, and a terminal unit to connect the lead line for use of leading out and the output lead line in the hollow structure, wherein the hollow structure is provided with a through hole arranged on the electrode lead-out unit, and the lead line for use of leading out is guided into the hollow structure by way of the through hole, while the terminal unit extruded from the inner wall of the hollow structure, and at the same time, the end portion of the extrusion thereof is fitted into a terminal stand through an aperture open inwardly on the terminal stand and a first screw inserted into the aperture thereof, and further, provided with a second screw to connect and fasten the terminal of the lead line for use of leading out and the terminal of the output lead line, and also, to provide a solar-cell apparatus having such terminal lead-out structure.

It is another object of the invention to provide a terminal lead-out structure fixed to an aperture by means of an adhesive agent to cover the output lead-out unit thereof, having a lead-out hole near the central portion of the bottom thereof to draw in the output lead line from the output lead-out unit, wherein a sticky adhesive agent is applied to the circumference of the output lead-out unit and the lead-in hole, and outside the sticky adhesive agent, the aforesaid adhesive agent is applied to fixing the terminal lead-out structure to the apparatus, and also, to provide a solar-cell apparatus having such structure.

It is another object of the invention to provide a terminal lead-out structure having a hollow structure provided with a hole on the bottom thereof to lead in the lead line drawn out from the electrode lead-out unit of an apparatus, and an aperture on the top thereof, and with a lid member to cover the aperture by fitting it with the hollow structure, wherein the hollow structure and the lid member are formed integrally by means of a hinge, and the hollow structure is provided with extrusions or recesses on the side opposite to the surface where the flexible hinge portion is arranged, while the lid member is provided with a flexible hooking portion including recesses or an extrusions to engage with the extrusions or the recesses, and the lid member is provided with a hooking portion on the bottom thereof to release the engagement between the extrusions and the recesses, and also, to provide a solar-cell apparatus having such terminal lead-out structure.

It is still another object of the invention to provide a solar-cell apparatus having a terminal lead-out structure and a cable used for electrical output, wherein the terminal lead-out structure is provided with a fixing member to fix the cable used for electrical output, and also to provide a terminal lead-out structure having a fixing member to fix the cable for use of electrical output.

It is a further object of the invention to provide a terminal lead-out structure having a hollow structure for the insulating protection of an electrode lead-out unit, and a filling agent to be filled in the hollow portion of the hollow structure, and also, to provide a solar-cell apparatus having such structure.

In accordance with the present invention, a solar cell module, which is provided with a weatherability film treated to discharge electricity as a surface coating material arranged at least on a part of the light receiving side, comprises a hollow structure for the insulating protection of a lead line drawn out from an electrode lead-out unit on the light receiving surface side of the solar cell module, and the electrode lead-out unit. Then, the interior of the hollow structure is filled with a filling agent.

It is preferable to use a hollow structure, which is arranged to be able to suppress the tension of a lead line, so as not to carry over the tension of the lead line to the electrode lead-out unit directly.

It may be possible to arrange a structure so that through holes are formed on a solar cell module and on a hollow structure, respectively, in order to fix the hollow structure on the solar cell module by fastening bolts and nuts applied to these through holes.

Also, it may be possible to arrange a structure to apply a sealing material between the outer frame of a hollow structure and a weatherability film.

Further, it may be possible to arrange a structure so that a hollow structure comprises a base portion and a covering portion, and then, a supporting unit is formed on the base portion in order to prevent the lead line from being pulled in the direction perpendicular to the light receiving surface of a solar cell module.

Here, as a surface coating material, a fluororesin film, both faces of which are treated to discharge electricity, is used, for example. Here, regarding the discharge treatment given to both faces of fluororesin, it is preferable to adopt a corona discharge process or sputtering process. Also, it is preferable to use a plastic material for the hollow structure in consideration of the electrical insulation, strength, waterproof capability, ease of handling, and weight, among other advantages. As a filling agent, it is also preferable to use adhesives of silicon rubber, epoxy resin or the like.

Also, in accordance with the present invention, the terminal lead-out structure of a solar cell module may be arranged with a hollow structure, which is provided with an extrusion at least on a part of the surface thereof to face the solar cell module. Here, the hollow structure may comprise a base portion and an upper covering portion.

More specifically, the hollow structure described above is a terminal box, for example. Therefore, the structure of the present invention is preferably usable for the surface of the terminal box of a solar cell module adhesively bonded with the solar cell module. In other words, the present invention is designed to apply its structure to a terminal box, and then, by adhesively bonding it with a solar cell module, it is intended to enhance the bonding operativity of a terminal box and the reliability of resultant adhesion as well.

Also, in accordance with the present invention, the terminal lead-out structure of a solar cell module may be arranged so that a hollow structure is provided with a series of extrusions on a surface thereof to face the solar cell module to surround an electrode lead-out hole arranged on the aforesaid surface, and then, a through hole is arranged on a surface other than the aforesaid surface to fill a filling agent in the hollow structure, and that the outer surface is adhesively bonded from the outer edge of the extrusions, and at the same time, the filling agent is filled in the inner side from the inner edge of the extrusions for the insulating protection of the electrode lead-out unit.

In this case, it is preferable to make the viscosity of adhesives more than 300 poise when applied to bonding the solar cell module and the hollow structure. Also, it is preferable to make the viscosity of the filling agent less than 1,000 poise, when filling the filling agent in the inner side from the inner edge of the extrusions for the insulating protection of the electrode lead-out unit.

Usually, in this respect, at least one through hole is arranged for the electrode lead-out unit of a solar cell module on the surface of the hollow structure to face the solar cell module.

For the structure described above, it is preferable to use a plastic material for the hollow structure in consideration of the electrical insulation, strength, water-proof capability, ease of handling, and weight among some other advantages. For the adhesive agent, it is preferable to use adhesives of silicone, silane, epoxy resin or some others.

Also, in accordance with the present invention, the terminal lead-out structure of a solar cell module may be provided with a hollow structure having an extrusion on the outer circumference of the surface thereof to face the solar cell module.

Here, the hollow structure comprises a base portion and an upper covering portion, and may be structured to form an extrusion on the base portion. Also, the extrusion and the solar cell module may be bonded by use of a double-coated adhesive tape, for example. Further, as described above, the base portion can be bonded to the solar cell module more reliably by use of the filling agent whose viscosity is less than 1,000 poise, which is filled in the hollow structure.

Also, for a solar cell module, a terminal lead-out box is fixed to the output lead-out unit on the reverse side thereof by use of silicone resin, epoxy resin, or the like, and then, the output lead lines of positive pole and negative pole are drawn out from the terminal lead-out box. For the terminal lead-out box, there are a single type terminal lead-out box and a terminal lead-out box with a cover comprising the terminal lead-out box main body and its lid member. These boxes have its advantages and disadvantages, of course.

The former is advantageous in its cost aspect because of the simpler structure, but it may lack the capability of maintenance such as replacement and checking of cables after installation. On the other hand, the latter makes it possible to perform the replacement of cables and others, although costs are higher. It is advantageous over the former in the long run.

For the terminal lead-out box with a lid member, a rubber packing or some other water-proof material is often included between the terminal lead-out box main body and the lid member in order to obtain its water-proof capability when fitting the terminal lead-out box and the lid member together.

Also, the box of this type uses screws, keys, pins, or some other components to fit the lid member and the terminal lead-out box main body for fixation in some cases.

Also, a terminal box of the kind described above is often fixed to the reverse side of a solar cell module by use of adhesives of silicone, silane, or the like. When the box is fixed to the reverse side, an extruded portion is present on the reverse side of the solar cell module. Therefore, it becomes impossible, particularly for a frameless solar cell module, to be installed on a flat location. It is preferable to make a special arrangement so that the design of the module is not spoiled if the installation allows the reverse side of the module to be observable by eye sight.

Besides, there are cases where the screw fastening type is used, which is high in the mechanical and electrical reliability with respect to the terminal lead-out structure in the interior of a terminal box. The lead line drawn out from the electrode lead-out unit of a solar cell module is connected through this structure with the output lead line that connects solar cell modules electrically.

However, as shown in FIG. 1, the terminal lead-out structure of a screw fastening type used for a terminal box 104 is such that the lead line 101, which is drawn out from the electrode lead-out unit of a solar cell module, is soldered to plate type conductor 102 having a plurality of holes. The external lead lines are fixed to the conductor 102 by means of screw fastening. As a result, there is the need for the provision of the screw fastening portions to fix the screws. In order to form the female screw portions, insert metals should be pressed in or thermally bonded, or by means of a combination of press-in and expansion, among some others means. For the construction of such terminal structure, it is necessary to prepare a conductor of a desired plate configuration in advance. Such conductor should be fixed as required. Also, in order to insert the insert metal 103, the insert metal should be warmed beforehand among some other routines. Therefore, it takes a considerable time for such operation in some cases. Further, it is necessary to make each boss thicker at the inserting position of the insert metal 103. This arrangement may require a space more than necessary.

Also, as shown in FIG. 2, when a terminal stand for general use is adopted, a screw fastening, a thermal bonding, or some other operation is necessary to fix the terminal stand 201 to the terminal box 202 or there is a need for the provision of a hooking nail or the like to hook the terminal stand 201. Further, a comparatively small terminal stand 201 for general use is designed and produced in anticipation of its main use for a printed circuit board or the like. As a result, screw holes or others are provided for installation, which requires an extra space to that extent in a terminal box 202 in some cases. Also, on the bottom of a terminal box 202, or separately, a terminal stand is needed, thus making costs higher accordingly.

Such being the case, it is preferable to arrange the terminal structure in consideration of all the aspects discussed above.

Also, for a terminal lead-out box, there are some cases where a lead-in hole for drawing in the output lead line, and a lead-out hole for drawing out the output lead-out conductor should be arranged.

Through the lead-in hole, the output lead line of either positive pole or negative pole is drawn in, while through the lead-out hole, the output lead-out conductor, which is connected to the output lead line in the terminal lead-out box, is drawn out.

The installation method of this terminal lead-out box is often such that the terminal lead-out box is fixed to the output lead-out unit by means of adhesives, such as silicone resin or epoxy resin, and then, the output lead-out conductor and others are installed after the drying process of the adhesives.

For the operation of applying adhesives to the terminal lead-out box and fixing it by pressure, a skilled work and other routines are needed to a certain extent in order to obtain the uniformity in this respect.

Meanwhile, there is an installation method that uses a sticky adhesive agent in place of an adhesive agent, which requires no drying process, and contributes to improving operativity.

Here, in accordance with the method for installing the terminal lead-out box by use of adhesives, there is a need for a process to dry the adhesives used as described above. For that matter, an operation to move to a site where adhesives can be dried, an operation to secure such site, and others are required, thus incurring a great amount of expenditures in executing such operation in some cases.

Also, for the installation by use of adhesives, the finished thickness of adhesives varies depending on application of pressure as described earlier, besides other difficulties to obtain a uniform operativity. In order to make the finished thickness uniform, a constant application of pressure and other skilled work is necessary.

On the other hand, the installation by use of only a sticky adhesive agent has an advantage in improving such operativity because this agent provides an initial adhesive power. However, there is still a problem that the adhesive power is lowered at a high temperature and humidity, among other problems related to its reliability in some cases.

Also, when a terminal box is fixed to a solar cell module by the application of adhesives, the varied pressure exerted on the terminal box does not allow the adhesives to spread over the adhesive surface sufficiently or if such pressure is too strong, the thickness of the adhesives is made thinner, hence lowering the resultant adhesive power depending on the way bonding operation has been carried out.

Also, in a state in which a terminal box is bonded to a solar cell module as it is, the outer appearance becomes unfavorable in some cases, because adhesives flow out from the outer circumference of the terminal box. In this case, if the adhesive agent that flows out is left intact, it is exposed to the direct or scattered light of the sun, resulting in a conspicuous deterioration of its performance in some cases. Also, to wipe off the flowing out adhesive agent requires a skilled worker. In this case, the adhesive agent applied between the terminal box and the solar cell module is even wiped off as the case may be.

Therefore, it is more preferable to design the terminal lead-out structure in consideration of such unfavorable operativity resulting from the use of adhesives, the insecure reliability to ensue, and other related events.

Also, for a terminal lead-out box with a lid member, if a screw fit is adopted, a structure is arranged to fasten a male screw and press-in nut, helical inserting member, or a tapped female screw. When a key, a pin, or the like is used for fitting, too, there is a need for the provision of elements other than the terminal lead-out box main body and the lid member. Therefore, a problem of higher costs is encountered in some cases. Also, when a module is installed with a covered terminal lead-out box in it, the operativity is unfavorable at the time of checking and others. Further, in case of a screw fitting, attention should be given even to the fastening torque and others, which may result in unfavorable operativity. On the other hand, these fitting operations can be made by anybody and the disengagement of the fittings is also the same. Therefore, mischievous or careless conduct may be committed. There is even a fear that the fitting is not carried out exactly as anticipated.

Meanwhile, regarding the water-proof capability of a terminal lead-out box with a lid member, an arrangement is made to secure it by fitting the terminal lead box and the lid member with inclusion of a rubber packing or some other water-proofing material between them. The provision of a water-proof material, such as a rubber packing, brings about an extra cost. Therefore, not only a problem of increased costs is encountered, but also, in some cases, the water-proof capability of such material as a rubber packing is lowered due to the fitting pressure exerted between the terminal lead-out box main body and the lid member, as well as due to the aging of the water-proof material itself.

Also, the terminal lead-out box with a lid member comprises different components, a terminal lead-out box main body, and a lid member. A problem of operativity may take place like loss of lid members in some cases.

Therefore, it is preferable to design a terminal lead-out structure in consideration of the increased costs, the lowered water-proof capability, and the improvement of operativity as referred to in the preceding paragraphs.

Now, regarding the solar cell module integrally formed with a roofing material, developments and studies are being made with respect to the solar cell module that fits to the conventional roofing operation as given below. Such developments and studies are those represented in FIG. 3 and FIG. 4, for example.

FIG. 3 is a cross-sectional view showing a solar cell module 24. FIG. 4 is a perspective view showing the solar cell module represented in FIG. 3, observed from its rear side. This solar cell module is provided with a metallic reinforcement plate 13 on its rear side. The solar cell module 24 is sealed by means of a surface film 15 and a light transmitting resin 16. Both edge portions 17 of this kind of solar cell module 24 are folded upward at an angle of 90° on its longer side so as to fit it to the usual process of tiled roofing.

To the metallic reinforcement plate 13, the base member 22 of a terminal lead-out box 18 is adhesively bonded by use of silicon adhesive agent 19. An electric output cable 20 is provided for it together with a bushing 21. Further, a lid member 23 is installed. In this case, the terminal lead-out box 18 is fabricated so as to enable the fitting portion of the base member 22 and the lid member 23 to be water proofed. Further, by use of the bushing 21, water-proofing is maintained at the cable lead out portion. For a solar cell module integrally formed with a roofing material, it is preferable to be able to execute electrical wiring when installing the module. Therefore, a one-touch connector 40 is mounted on the leading end of the electric output cable 20 of the solar cell module described above. The length of the cable is also set at a length easy to handle (30 cm, for instance).

This way, a desired electric output cable 20 for use of electrical output and a one touch connector 40 are provided for a solar cell module from the outset, thus making it easy to operate the required electric wiring at the time of installation of the solar cell module 24.

Nevertheless, in accordance with the solar cell module described above, the electric output cable hangs down from the rear side thereof. Consequently, at the time of post-processing of a solar cell module, and also, at the time of transporting it for installation, this setup may impede an easier handling of the solar cell module.

In other words, both end portions 17 of the solar cell module described above are folded upward at an angle of 90° on its longer side. However, at the time of operating this folding as one of post-processes, it may become difficult to execute such process if the cable hangs down on the rear side of the solar cell module.

The folding is gradually executed by use of an apparatus, the so-called roller making machine, while each solar cell module is continuously conveyed for the intended processing.

The processing method by use of a roller 25 making machine is such that, as illustrated by the cross-sectional view in FIG. 5, each solar cell module is pinched by the upper and lower carrier rollers 26 to convey it. Here, the configurations of processing rollers 25, which are in contact with the folding portions, are formed so that the solar cell module is folded in a shape as shown in FIG. 3 ultimately. In this respect, a plurality of stations are arranged to provide the processing rollers whose configurations gradually change, hence folding the solar cell module to the final configuration as described above through one section after another.

However, as clear from FIG. 5, if the electric output cable 20 is in a state of handing down as it is, there is a possibility that it gets entangled in the roller making machine. Hence, the process cannot be executed as anticipated. Therefore, each electric output cable 20 is fixed to the metallic reinforcement plate by means of an adhesive tape 28 as a countermeasure in this instance.

Now, a brief description will be made of the reason why the folding process is executed after the installation of the terminal lead-out box and cable as a sequence of fabrication process, and also, why the installation of the terminal lead-out box and cable is not intended on the contrary, that is, why not before the execution of folding process.

If it is intended to execute the operation of adhesive bonding of a terminal lead-out box to a solar cell module that has been already folded, the module tends to be warped or present unstable conditions making it difficult to execute such operation. Here, therefore, a fixture should be prepared so that the module is held horizontally at a height more than the height of the folded portions, and then, the intended adhesive bonding operation is carried out after the module is placed on such a fixture. The operation becomes complicated inevitably.

Also, in order to dry a sealant agent, the module should be placed so that the terminal lead-out box side is placed upward, and kept horizontally at room temperature for 24 hours as it is. Therefore, as described earlier, the module that has already been folded should be placed on a stand dedicated to keeping it horizontally so as not to cause it to warp. However, if a module is already folded, the volume that one module occupies becomes larger to that extent. The space occupied by modules to keep them for drying the sealant agent becomes extremely greater than the one needed for the modules yet to be folded. Now, in consideration of these aspects, it is more suitable that the installation of the terminal lead-out box should be carried out before the folding process is executed.

Now, when the solar cell module is transported to the site of its installation, it is extremely dangerous if each cable hangs down from the module, because it may be hooked unexpectedly. Each of the cables should be fixed by means of an adhesive tape so as not allow it to hang down.

However, if each of the cables is fixed by means of an adhesive tape, such tape should be peeled off last, immediately before the intended installation and wastefully discarded eventually.

Also, the installation operator is often troubled in disposing of the tape thus peeled off, because many solar cell modules are carried over to the site of installation where it is executed.

Further, for the safety, the operators wear gloves, thus making it difficult to peel off the adhesive tapes. Here, the peeled off tapes are still sticky and may present an obstacle in operating the installation smoothly in some cases, because the tapes adhere to his gloves.

Such being the case, the use of adhesive tapes for fixing each of the cables presents a number of problems as described above. Conceivably, therefore, it is possible to use clamps available on the market. For example, as shown in FIG. 6, a clamp 44 is fixed to the metallic reinforcement plate by means of a double-coated adhesive tape, thus fixing the cable 20 in place. With this method, it is possible to avoid such a troublesome case as just using the adhesive tapes.

Nevertheless, the clamp 44 is still discarded at the end because it is no longer needed. Here, the double-coated adhesive tapes, clamps, and each step of adhesive processes are extremely wasteful in cost. At present, therefore, it is inevitable to adopt the method that uses adhesive tapes to fix each of the cables.

Aside from the problems described above, there is a problem that a connector cannot be mounted easily due to the winding habit of a cable acquired when it is fixed to a module. When an installation is executed in a cold site during the winter, the temperature of the operational environment is extremely low. Then, the flexibility of covering material of cable is lost, making it extremely difficult to fix each the connector against its winding habit thus acquired. Therefore, if the cable is fixed to the module in a configuration in which no consideration is given to such winding habit that the cable may acquire, the operation becomes extremely difficult when the module is installed.

This situation will be described briefly in conjunction with FIG. 7. FIG. 7 is a view showing a state of solar cell modules being installed, which is observed from its rear side. As shown in FIG. 7, it is assumed that a solar cell module 24a is installed on the ridge side of a roof, while another solar cell module 24b is installed on the eaves side thereof. These modules are installed with a superposed portion 43 as flashing. In this case, if the cables and connectors are fixed to the rear sides of modules by means of tapes 28, respectively, the positive and negative connectors 40a and 40b should be connected, while deforming them against the winding habit of each of them as indicated by broken lines partly showing the locus of deformation process of each cable. This work is not easy for the operator to handle, because he is required to exercise much of his physical strength.

It is not so easy to handle a cable itself that has lost its flexibility, while having such winding habit. In addition to it, there are the reasons given below, which makes the operation more difficult.

The configuration of winding habit that each cable of positive or negative pole has acquired is an axial symmetry with respect to line a–a'. It remains being axially symmetrical when both the cable and connectors are deformed. On the other hand, the connectors should rotate at an angle of more than 270° from the state of being fixed before these connectors can face to engage with each other. Therefore, if the cables have lost flexibility, the operation may require an enormous amount of strength just before mounting both connectors after causing them to have rotated more than 270°.

Such being the case, it is very important to give attention also to the connectivity of cables from the viewpoint of providing reliability and operativity.

BRIEF DESCRIPTION OF THE DRAWINGS

FIG. 4, FIG. 62, FIG. 63, and FIG. 65 are perspective views which schematically illustrate one example of a solar-cell apparatus.

DETAILED DESCRIPTION OF THE PREFERRED EMBODIMENTS

Hereinafter, the present invention will be described in detail with reference to the accompanying drawings as required.

Figure 8:
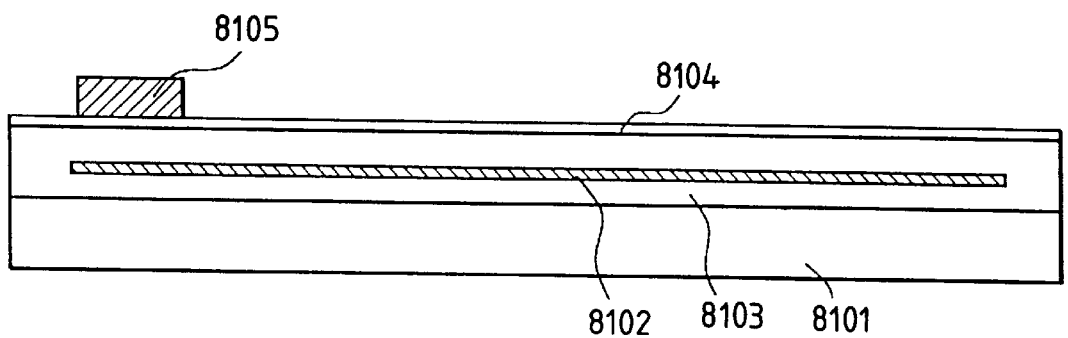

FIG. 8 is a structural view which schematically shows a solar cell module to which the present invention is applicable. The solar cell module comprises a solar cell element 8102 arranged on a rear side reinforcement material 8101; a filling material 8103; a weatherability film 8104; and a terminal box (a hollow structure) 8105, among others. A solar cell module of the present invention structured above can be fabricated as given below, for example.

In other words, on the rear side reinforcement material 8101, there are superposed the sheet type filling material 8103 formed by EVA or the like, the solar cell element 8102, the filling material 8103, and the weatherability film 8104 one after another. Then, while defaming under pressure, EVA is molten at a temperature of 150° C. In this way, the solar cell element 8102 is sandwiched between the weatherability film 8104 and the rear side reinforcement material 8101. After that, the terminal wiring is drawn out form the light receiving surface of the solar cell module. To this terminal wiring, the terminal box 8105 is fixed.

Figure 9:
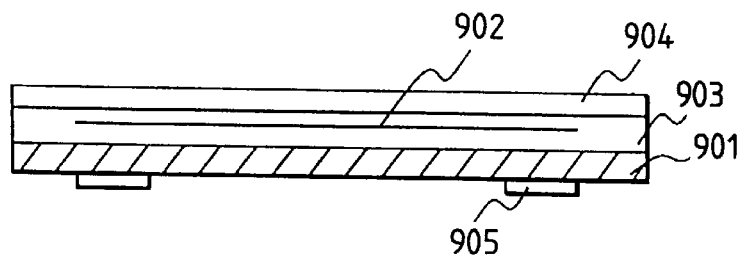

FIG. 9 is a structural view which schematically shows another solar cell module to which the present invention is applicable. The solar cell module comprises a solar cell element 902 arranged on a rear side reinforcement material 901; a filling agent 903; a weatherability film 904; and a terminal box 905. The solar cell module can be fabricated as given below, for example.

On the rear side reinforcement material 901, there are superposed the sheet type filling agent 903, such as EVA, the solar cell element 902, the filling agent 903, and the weatherability film 904 one after another. While defaming under pressure, EVA is molten at a temperature of 150° C. In this way, the structure is arranged to sandwich the solar cell element 902 between the rear side reinforcement material 901 and the weatherability film 904. After then, the terminal wiring is drawn out from the rear side of the solar cell module and fixed to the terminal box.

The mode of a solar cell module to which the present invention is applicable is not necessarily limited, but a metallic reinforcement plate is provided for the rear side of the module. With a folding processing operated therefor, the model can well fit to a solar cell module integrally formed with a roofing material of the conventional roof installation.

Also, for the other modes of module, that is, a module of ground installation type, for example, which is provided with an aluminum frame on the circumference thereof, for example, the structure is arranged without any cable hanging down to make it easier to handle the module of such mode.

(Solar Cell Element)

Although there is no particular limit to the kinds of the solar cell element of a solar cell module in accordance with the present invention, the solar cell should preferably be bendable, and more preferably, it is an amorphous solar cell of those formed on a stainless base board by means of crystalline or non-crystalline semiconductor or compound semiconductor.

With a bendable solar cell element, there is no possibility that the solar cell element is broken even if its module is caused to warp due to a force exerted on the solar cell module at the time of folding process by use of a roller making machine.

Now, the description will be made further in detail of the hollow structure, filling agent, weather-ability film to be used for the present invention, as well as the rear side reinforcement material, filling agent, sealing material, and others with respect to a solar cell module.

(Weatherability Film)

A weatherability film used for the present invention not only requires weatherability, but also, requires translucency and its property that makes adhesion of stains difficult, as well as mechanical strength and tensile strength. On the light receiving side, an appropriate treatment of electric discharge should be given optimally in consideration of the adhesion provided by a filling agent to be used. For a discharge treatment of the kind, there can be named corona discharging process, sputtering discharging process, ozonic discharging process, or the like. Further, on the adhesion surface with the filling material, it may be possible to exercise a corona discharging process for a better adhesion.

With the above elements in view, there is no particular limit to the kind of weatherability film, but it may be possible to name a fluororesin film, such as ETFE (polyethylene tetra fluoro-ethylene), poly-3-fluoro-ethylene, or polyfluoro-vinyl for use as a weatherability film. Particularly, it is preferable to adopt a non-drawing type ETFE.

Further, it is preferable to use a film whose elongation percentage is 250% or more so that the film is not broken nor any fissure results in it when the film is extended due to the folding process. If the elongation percentage is less than 250%, there is a fear that a fissure takes place on the film when the solar cell is folded.

(Rear Side Reinforcement Material)

In order to increase the mechanical strength of a solar cell module or to prevent it from being deformed or warped due to temperature changes, a rear side reinforcement material is used. For example, an insulated metal, such as a coated galvanized steel plate, a carbon fiber, FRP (glass fiber reinforced plastic), ceramics, glass, tetra/Al/tetra, polycarbonate, or the like is used.

Also, in consideration of the operativity, easier handling, adhesiveness to a terminal box, and others with respect to a solar cell module, it is preferable to adopt a metal plate as the rear side reinforcement material. Although there is no particular limit to the kind of metal plate to be adopted, it may be possible to name a plated steel plate, such as a galvanized iron plate or galvarium steel plate, titanium, stainless steel plate, or the like. It is preferable to coat the surface of such plate with polyester resin, acrylic resin, or the like.

Also, from the viewpoint of the usage as a roofing material, it is preferable to select a material excellent in weatherability and operativity when folding it among those already established as a reliable metallic roofing material for a long term use. For example, it may be possible to name a galvanized plated steel plate, a weatherability steel plate prepared by coating fluororesin or vinyl chloride on the galvanized plated sheet plate, stainless steel plate, or the like.

(Filling material (Transparent Resin))

In accordance with the present invention, the properties required for a filling material to be adopted are weatherability, thermal flexibility, thermal adhesiveness, light transmissivity, among others. As a material to be used, it may be possible to name EVA (vinyl acetate—ethylene copolymer), butyral resin, silicone resin, epoxy resin, fluoropolyimide resin, polyvinyl butyral resin, or other transparent resins, but the present invention is not necessarily limited thereto. Of these materials, it is preferable to use EVA.

Although not necessarily limited, it is preferable to add to a filling material a silane coupling agent, such as vinyl trichrosilane, NOL-24, vinyl-alcohxy silane, or γ-aminopropyl triethoxy silane.

It is also possible to form a bridge by adding a bridging agent to the filling material. Also, it is preferable to arrange an ultraviolet absorber to be contained to suppress the optical deterioration.

(Hollow Structure)

A terminal box (a hollow structure) to be used for the present invention requires one having excellent heat resistance, water-proof capability, electrical insulation, and aging resistance. Also, preferably, its material should have a good adhesiveness to a filling agent to be adopted. In consideration of these requirements, it is preferable to use a plastic material for the terminal box. Also, from the viewpoint of non-combustibility, it is preferable to adopt an incombustible plastic material, ceramics, or the like.

As a plastic material, it may be possible to name an engineering plastic, or the like, which is excellent in strength, shock resistance, heat resistance, hardness, aging resistance, such as polycarbonate, polyamide, polyacetal, denaturalization PPO, polyester, polyarylate, unsaturated polyester, phenolic resin, epoxy resin. Also, it is possible to use ABS resin, PP, PVC, or some other thermal flexible plastic material. Moreover, in order to enhance ultraviolet resistance, carbon black may be used as pigment or preferably, a resin coating is applied to the surface to absorb ultraviolet rays.

The hollow structure serving as a terminal lead-out box of a solar cell module of the present invention should preferably provide a member to hook a cable or connector for use of electrical output. More preferably, this box should be arranged to provide insulation, water-proofing, and other protection for the mechanical structure of the terminal lead-out unit.

Essentially, it is extremely preferable to use polycarbonate, for example, among those named above, because its application produces a desirable effect both on the mechanical strength and heat resistance.

A method for installing a terminal lead-out box to a module box is not necessarily limited. For example, there is a method that uses various kinds of adhesives, such as epoxy resin, or a mechanical method, but as described above, the use of silicone adhesives is particularly preferable, because it has an excellent bonding strength and heat resistance as well.

(Filling Agent)

There is no particular limit to the kind of filling agent to be used for filling the terminal box of the present invention, but it is preferable to use the epoxy resin filling agent, silicone adhesive agent, silicone adhesive sealing agent, or others having a good electrical insulation. From the viewpoint of flexibility, it is preferable to adopt silicone resin. Further, from the viewpoint of operativity, it is preferable to use the filling agent of one-liquid type whose hardening time is short. Moreover, it is preferable to use the one whose viscosity is not too low so that it may flow out from the hollow structure. Also, when using silicone one-liquid type RTV rubber, it is preferable to use the one whose hardening method is a deacetone type or dealcohol type in order to prevent electrodes from being eroded.

For such a filling agent, it is possible to use the epoxy resin adhesives manufactured by Three Bond Company, the product name of which is: 2001, 2002H, 2003, 2016B, 2022, or the like. It is also possible to use any one of these products by mixing a hardening agent in a given ratio, the product name of which is: 2102B, 2103, 2104, 2105F, 2105C, 2106, 2131B, 2131D, 2131F, 2163, or the like.

Also, as the epoxy resin manufactured by Sumitomo 3M Inc., it is possible to use: EW-2 (one-liquid type), S/W-2214 (one-liquid type), XA7416 (one-liquid type), JA7437 (one-liquid type), 1838B/A (two-liquid type: mixture ratio between this agent and a hardening agent=4:5), S/W-2216B/A, DP-100 (1:1), DP-110 (1:1), DP-190 (1:1), DP-PURE60 (1:1), DP-270 (1:1), or the like.

Also, as the epoxy resin manufactured by Yuka Shell Epoxy K.K., Epikote 812, 815, 827, 828, 834, or the like can be used. As a hardening agent to be applicable in this respect, any one of the agents currently available may be selected as required.

Further, as a silicone adhesive agent, any one of the following agents can be used: Three Bond Co's 1220, 1230; Torei-Dow Corning-Silicone Co.'s SE9156, SE9157, SE9166, SE9176, SE9185, SE9186, SE9186L, SE9187, SE1811, SE1740 (two-liquid type), SE1821 (two-liquid type), CY52-005 (two-liquid type), Dow Corning's SILASTIC 739RTV, SILASTIC 738RTV, 2140RTV, 3145RTV, or the like.

Also, as a filling agent, it is possible to select any one from among the Shinetsu Kagaku Kogyo K.K.'s KE347, KE3494, KE4897, KE4896, KE4895, KE66 (two-liquid type), KE67 (two-liquid type), or the like.

(Sealing Material)

The properties required for a sealing material to be used for the present invention are: heat resistance and water-proof capability. As a material therefor, it is possible to name EPDM, silicone, or the like, which is excellent in weatherability, but the sealing materials are not necessarily limited. Also, as the structure of a sealing material, it is preferable to adopt the one of a foaming or elastic sheet type. Further, it is preferable to use the one, which is double coated with acrylic resin, silicone resin, or butyl sticky agent.

(Cable for Use of Electrical Output)

Regarding a cable for use of electrical output of a solar cell module of the present invention, it may be possible to use any product if only it is a legally accepted one suitable for use of the electrical output of a solar cell module. There is no particular limit defined therefor. A CV cable, cab tire cable, or the like may be adoptable, for example.

Since a filling agent is filled in the hollow structure, the water tightness is enhanced in the terminal lead-out unit on the light receiving surface of a solar cell module. Then, a weatherability film is treated to discharge electricity on the light receiving side. In this way, the adhesive strength is enhanced between the weatherability film and the filling agent. As a result, it is possible to prevent water from being permeated into the terminal lead-out unit, and at the same time, to allow the hollow structure to be adhesively bonded to the light receiving surface of the solar cell module reliably.

Also, as an arrangement is made for a hollow structure so that the tension of a lead line is not given directly to its terminal lead-out unit, the reliability of the terminal lead-out unit is enhanced. The reliability is assured particularly when a physical load is exerted on the terminal lead-out unit. Further, through holes are provided for the outer frame of a hollow structure and a solar cell module, and then, bolts and nuts are inserted into such through holes to be tightened for fixing the hollow structure and the solar cell module. The reliability is further enhanced even when a physical lead is exerted on the terminal lead-out unit.

Also, since a sealing material is used between the hollow structure main body and a weatherability film, the water tightness of the electrode lead-out portion is enhanced.

Further, since a hollow structure comprises a base member and an upper lid member, it is possible to examine and confirm whether or not a filling agent is filled into all the fine portions in the hollow structure. Further, it is possible to hook the lead line easily onto its tension suppressing structure. Also, the aperture area is made larger, thus making it possible to shorten the drying period of the filling agent. In this way, it is possible to improve the assembling operativity of the terminal lead-out unit of a solar cell module.

Also, a supporting portion is arranged on the base member to prevent the lead line from being tensioned in the vertical direction. There is no possibility that the upper lid member is displaced due to a physical load, hence making it possible to further enhance the reliability even when a physical load is exerted on the terminal lead-out unit in the direction perpendicular to the solar cell module.

Also, an extrusion is arranged at least a part of the surface of a hollow structure to face a solar cell module. It becomes possible to improve the operativity when the hollow structure is adhesively bonded to the solar cell module. In other words, the adhesive agent can be made as thick as desired, thus obtaining its stabilized properties. Therefore, the adhesive reliability of the hollow structure is improved,- hence leading to the enhancement of reliability of the solar cell module itself.

Also, a series of extrusions are provided to surround the electrode lead-out hole arranged on the surface of a hollow structure to face a solar cell module, and then, the outer surface of the outer edge of the extrusions is bonded by means of adhesives. A filling agent is filled in the inner side of the inner edge of the extrusions for the protection of the electrode lead-out unit. Thus, the operativity is improved when the hollow structure is adhesively bonded to the rear side of the solar cell module. Also, its stabilized properties can be obtained. The adhesive reliability of the hollow structure is improved. Also, the reliability of the terminal lead-out unit of the solar cell module is enhanced.

Further, the provision of the extrusions for the circumferential edge portion on the surface of a hollow structure to face a solar cell module makes it possible to improve the operativity when the hollow structure is adhesively bonded to a solar cell module. Hence, the adhesives can be made as thick as desired in order to obtain its stabilized properties. Also, it becomes possible to prevent the adhesives from flowing over when the extrusions are bonded. Any overflowing adhesives can be wiped off easily, thus making the outer appearance beautiful. Also, there is no possibility to cause overflowing adhesives to be exposed to the light of the sun, thus improving the adhesive reliability of the hollow structure, and that of the solar cell module itself as well.

Also, with the hollow structure comprising the base member and the upper lid member, it is possible to examine and confirm easily the state of insulating protection of the electrode lead-out unit just by removing the upper lid member, for example. In this way, the reliability of the terminal lead-out unit of the solar cell module can be enhanced still more.

Further, the extruded portion and the solar cell module are fixed by use of a double coated adhesive tape, thus preventing any overflowing adhesive agent, which contributes to enhancing the operativity in this respect.

Also, in the interior of a hollow structure, a filling seal agent whose viscosity is less than 1,000 poise is filled to allows the hollow structure to be adhesively bonded to the solar cell module. In this way, the filling seal agent is fully provided in the hollow structure to obtain an enhanced adhesive reliability.

Also, for the present invention, it is preferable to make an arrangement so that a terminal lead-out box for use with a solar cell is provided with a terminal lead-out box main body having, on the bottom, a-lead-in hole being arranged to draw in a lead line drawn out from an electrode lead-out unit of a solar cell module; at one side, a lead-out hole to draw out an output cable; and on the upper part, an aperture, and also, a lid member to cover such aperture, wherein the terminal lead-out box main body is provided with extrusions on both side adjacent to one side, and the lid member is provided with a flexible portion including recessed parts to engage with the aforesaid extrusions.

Also, for the present invention, it is preferable to make an arrangement so that a terminal lead-out box for use with a solar cell is provided with a terminal lead-out box main body having, on the bottom, a lead-in hole being arranged to draw in a lead line drawn out from an electrode lead-out unit of a solar cell module; at one side, a lead-out hole to draw out an output cable; and on the upper part, an aperture, and also, a lid member to cover such aperture, wherein extrusions are arranged on the fitting surface of the terminal lead-out box main body, while recessed grooves are arranged on the fitting surface of the lid member or the fitting surface of the terminal lead-out box main body for the corresponding extrusions, and also, a receptacle of the flexible coupling portion is arranged on the terminal lead-out box main body, and the width thereof is defined to correspond to the width of the flexible coupling portion, and further, the receptacle is arranged in a location recessed from the outer circumference of the terminal lead-out box main body to the extent of the thickness of the flexible coupling portion so as to make the outer surface of the terminal lead-out box and the outer surface of the flexible coupling portion substantially flat.

Further, it is preferable to enable the bottom side of the flexible coupling portion to constitute a hooking structure in order to release the engagement between the extrusion and recessed portion, and then, when the terminal lead-out box main body and the lid member are fitted together, the gap between the bottom side of the flexible coupling portion and the bottom of the terminal lead-out box main body is made less than 8 mm, and it is further arranged that only when a disengagement tool is used, the engagement can be released, and that the engagement is released by hooking the disengagement tool to the hooking structure.

With the arrangements described above, it becomes unnecessary to prepare any other elements than a terminal lead-out box main body and a lid member for fitting them for solid fixation. The fitting can be performed just one touch, thus, while reducing the material costs of screws and others, the operativity being enhanced still more simultaneously.

Here, in order to release the engagement between these two members, a specially prepared tool is needed. Hence, there is no possibility that any mischievous conduct is committed, yet it is possible to release the engagement just by the application of one action. The reliability and operativity can be enhanced still more.

On the other hand, no rubber packing nor any other water-proofing material is included between the terminal lead-out box main body and the lid member for the provision of water-proof capability thereof. There is no problem of aging of the water-proofing material itself. Thus, the costs are reduced, yet the reliability is enhanced more accordingly.

Here, in other words, it is possible to materialize the terminal lead-out box of a solar cell module having a good operativity and a high reliability.

Further, in accordance with the present invention, it is preferable to make an arrangement that a terminal lead-out structure comprises a hollow structure fixed onto the electrode lead-out unit of a solar cell module for the insulating protection of the electrode lead-out unit; a lead line drawn from the electrode lead-out unit for use of leading out; an output lead line for the connection with another solar cell module; and a terminal unit to connect the lead line for use of leading out and the output lead line in the hollow structure, and that the hollow structure is provided with a through hole arranged on the electrode lead-out unit, and the lead line for use of leading out is led into the interior of the hollow structure by way of this through hole, and the terminal unit is provided with a terminal stand having in it a hole protruded from the inner wall of the hollow structure and open at the end portion of the protrusion; a first screw inserted into the hole of the terminal stand; and a second screw to be screwed together with the first screw through the opening to connect the end portion of the lead line for use of leading out and that of the output lead line by means of screw fixture.

With this arrangement, the first and second screws are screwed together through the opening of the terminal stand in order to connect the end portion of the lead line for use of leading out and that of the output lead line by means of screw fixation, thus making it possible to materialize a highly reliable terminal lead-out structure of a screw fixture type with a simple space-saving arrangement by the utilization of general-purpose components. Particularly, here, the lead line for use of leading out and the output lead line are firmly connected by the application of the screw fixation.

Now, the description will be made of a hollow structure and a member (a first screw) having a screw (a second screw), washer, and screw fastening structure with respect to the terminal lead-out structure described above.

(Hollow Structure)

Figure 10:
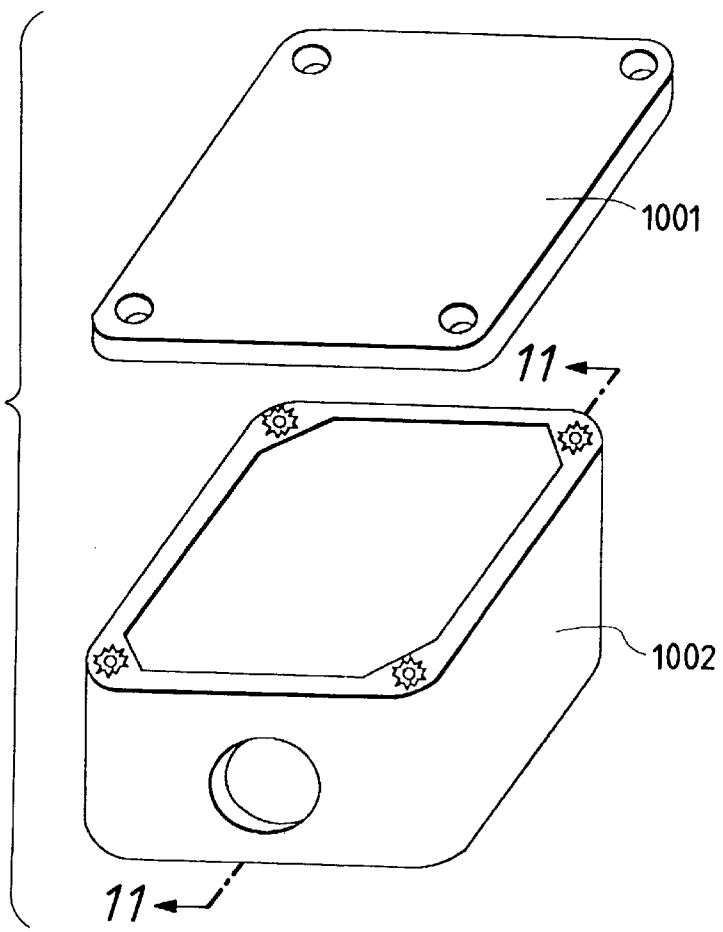
FIG. 10, FIG. 14, FIG. 17, FIG. 19, FIG. 20, FIG. 21, FIG. 22, FIG. 24, FIG. 29, FIG. 34, FIG. 39, FIG. 48, FIG. 49, FIGS. 50A 50B, 51, 52A, 52B, 53, 54, 55, 56, 57, 58 and 59 are perspective views schematically illustrating one example of a terminal lead-out structure.

As one example of a hollow structure (terminal box) to be used for the present invention, it is structured to provide a lid member 1001 and a base member 1002 as shown in FIG. 10. The structure is preferably such that the lid member 1001 is closed after the lead line for use of leading out and the output lead line are fixed by use of screws. There is no particular limit to a method for closing the lid member in this respect.

Figure 11:
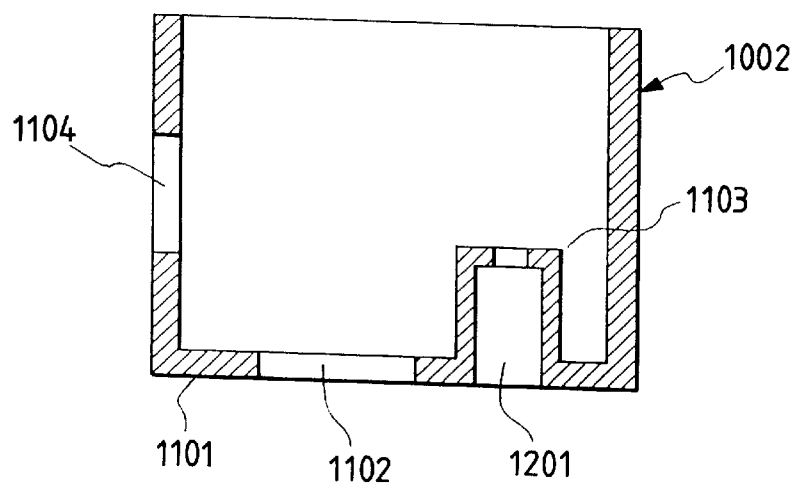
FIG. 11, FIG. 13, FIG. 18, FIG. 23, FIG. 26, FIG. 27, FIG. 28, FIG. 30, FIG. 31, FIG. 32, FIG. 33, FIG. 36, FIG. 38, FIG. 41, FIG. 43, FIG. 44, FIGS. 45A to 45E, FIG. 60, and FIGS. 61A to 61C are cross-sectional views schematically illustrating one example of a terminal lead-out structure.
Figure 12:
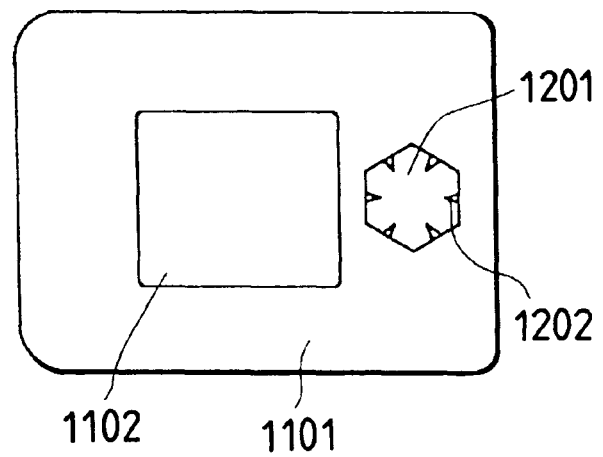
FIG. 12, FIG. 35, FIG. 37, FIG. 40, and FIG. 42 are plan views which schematically illustrate one example of a terminal lead-out structure.

FIG. 11 is a cross-sectional view of the base member 1002, taken along line 11—11 in FIG. 10. As shown in FIG. 11, the configuration of a through hole 1102 on the electrode lead-out unit arranged on the surface 1101 of the hollow structure to face a solar cell module may be a square, circular, or any other shape. Also, the surface, on which the extruded terminal stand 1103 protruded to the interior of the hollow structure is formed, is not necessarily limited, but it is preferable to arrange such surface on the surface that faces the solar cell module. The configuration of a hole 1201 arranged in the terminal stand to insert the member having the female structure may be determined arbitrarily depending on the shape of the first screw inserted into it (usually, a member having a female screw structure). If a hexagon nut is used as the first screw, it is preferable to make the configuration of the hole a hexagonal column as shown in FIG. 12.

Figure 13:
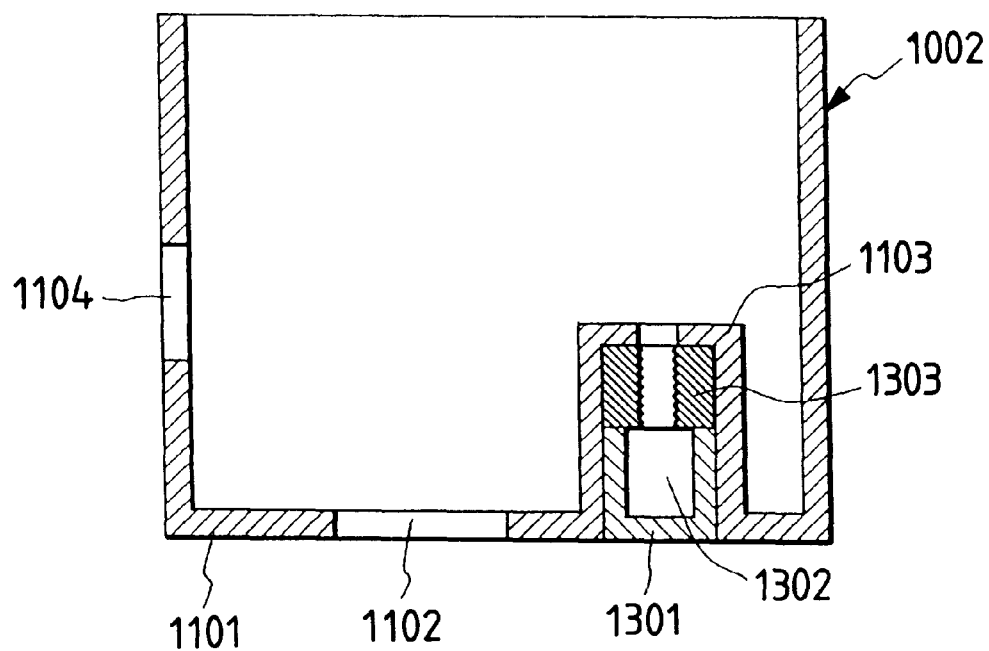

Also, it is preferable to fix the first screw inserted into the hole 1201. The method for fixing it is such that a rib 1202 is arranged on the inner wall of the hole 1201. More preferably, then, a friction method is arranged to fix the screw by the application of friction between the screw and the rib. Further, in order to prevent the member having the female screw structure from falling off or being displaced from a given position, it is preferable to insert a spacer 1301 after the first screw 1303 has been inserted into the hole as shown in FIG. 13. The material and configuration of the spacer 1301 are not necessarily limited, but it is preferable to use for the spacer the same material of the hollow structure, thus making it possible to prepare the spacer when the hollow structure main body is formed. As to the configuration, it is preferable to adopt a cylindrical shape or the like that does not exert much stress on the hollow structure main body. Also, in such case, it is preferable to arrange a recess 1302 in the spacer 1301 for the screw to pass.

(Member Having Screw, Washer, and Female Structure)

There is no particular limit to a member having a screw, washer and female structure to be used for the present invention. As the material thereof, it is possible to select the one from among the following: steel, brass, stainless steel, aluminum, titanium, polycarbonate, hard vinyl chloride, ductile iron, die-cast, zinc alloy, monel metal, hastelloy, carpenter, or the like.

Also, in consideration of the corrosion inhibition, weatherability, or the like, it is preferable to give a surface treatment to any one of the preceding materials selected for this member. As the kind of the surface treatment, it is possible to select the one from the plating of: copper, nickel, chromium, black chrome, black nickel, tin alloy, copper alloy, gold, gold alloy, silver, unichrome, chromate, zinc, cadmium, electroless nickel, hard chrome for industrial use, tin, or the like.

Also, for the washer, a spring washer, flat washer, disc washer, toothed washer, or the like can be used.

From the above and in consideration of the reliability and operativity of the terminal unit, and the costs as well, it should be most preferable to use a chrome plated hexagonal steel nut for the member having a female screw structure, and the screw having a chrome plated cross recessed round head combined with a spring and flat washers.

As described above, a terminal stand having a hole for inserting a first screw in it is arranged in the interior of the hollow structure for the insulating protection of the electrode lead-out unit of a solar cell module, hence materializing a highly reliable terminal lead-out structure of a screw fixture type, which can be simply fabricated at low costs.

Also, an extrusion for hooking an inserted member is arranged on the side wall of the hole for inserting the first screw or a spacer. This extrusion is used to prevent the inserted member from falling off or being displaced from a given location. As a result, the first screw is inserted more securely. Particularly, it becomes possible to prevent the member (first screw) from being displaced when fixing the external lead line drawn from the terminal box (hollow structure), hence enhancing the reliability still more.

Also, if the spacer is made in a recessed shape or a cylindrical shape, it is possible to ease the stress to be exerted on the hollow structure when the spacer is inserted. Also, when the screw is tightened, a space can be secured for the screw to reside in the recess of a spacer or to be inserted in the cylindrical shape thereof. Therefore, the first screw can be pressed into a desired position in advance. Here, the operativity is also improved.

Further, since the screw fixation member, which is structured with the first and second screws together with a washer, is adopted, it is possible to reliably connect the lead line for use of leading out and the output lead line. Furthermore, a spring washer or a toothed washer is used as the washer needed here, making it possible to prevent the screws from being untightened, and also, to prevent any increase of contact resistance, the occurrence of defective contact, or the like.

Also, the first and second screws, and the surface of washer, are chrome plated in order to improve the corrosion inhibition and weatherability of each parts. This arrangement is possible at low costs, yet contributes to improving the reliability of the terminal unit.

Further, a pressure contact treatment is given to the end portion of the lead line for use of leading out and of the output lead line, which are connected with each other. Consequently, the contact reliability between the lead lines is enhanced when the lines are connected on the screw fixture terminal unit.

Moreover, the central part where the lead lines are in contact under pressure is soldered to avoid any increase of contact resistance by use of this pressure contact terminal unit, thus preventing the output of a solar cell module being lowered.

In addition, the terminal lead-out box of the present invention for use of a solar cell may be fixed to the solar cell by the application of an adhesive agent so as to cover the output lead-out portion, while arranging a lead-in hole near the central part of the bottom to lead in the output lead line drawn out form the output lead-out portion. A sticky adhesive agent is applied to the circumference of the output lead-out portion and the lead-in hole. An adhesive agent is applied on the outer side of the sticky adhesive agent so as to fix the terminal lead-out box to the solar cell.

Furthermore, it may be possible to arrange a lead-out hole on one side of the terminal lead-out box to draw out the output lead-out conductor connected to the output lead line in the terminal lead-out box.

Also, as required, fine irregularities may be provided on the bottom face where the sticky adhesive agent and the adhesive agent are applied.

Also, the method for fixing the terminal lead-out box of a solar cell of the present invention is such that it is fixed to the solar cell by means of an adhesive agent so as to cover the output lead-out unit, and that a lead-in hole is arranged near the central part of the bottom face thereof for leading in the output lead line drawn from the output lead-out portion. Here, it is good enough to apply a sticky adhesive agent on the circumference of the lead-in hole, and then, apply an adhesive agent on the outer side of the sticky adhesive agent thus provided, and to press the terminal lead-out box to the solar cell while keeping the lead-in hole to match the output lead-out portion of the solar cell.

Figure 14:
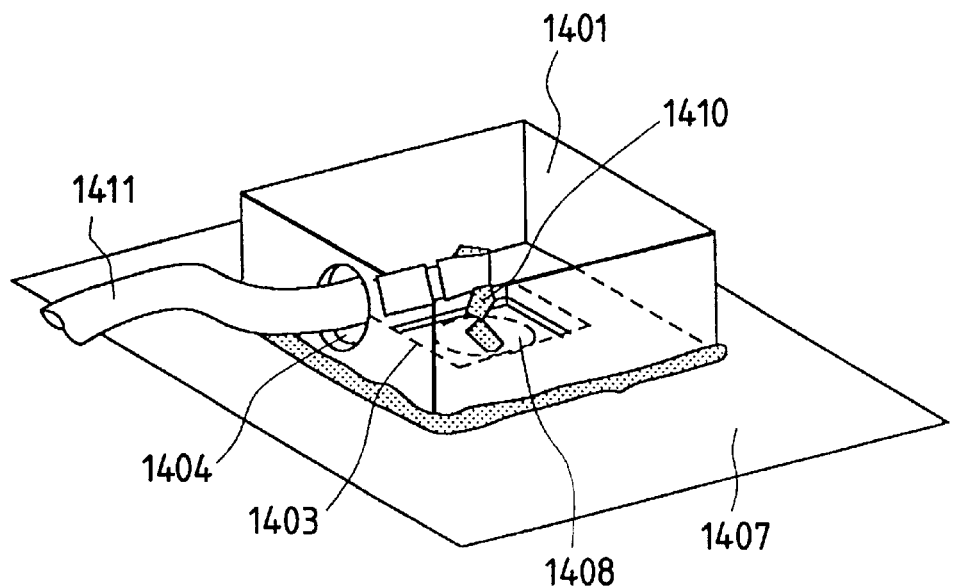
Figure 15:
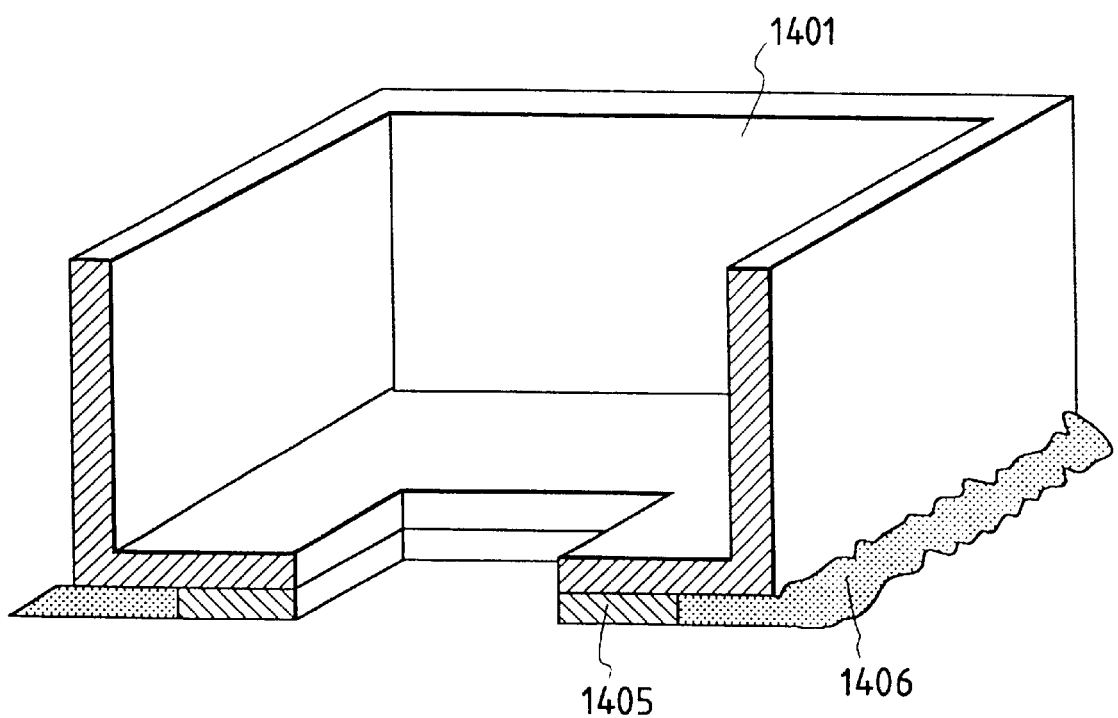
FIG. 15 is a partially cross-sectional view which schematically illustrates one example of a terminal lead-out structure.

FIG. 14 is a schematic view which shows an example of such fixation of a solar cell terminal lead-out box to a solar cell. FIG. 15 is a partially cut off perspective view showing the state represented in FIG. 14. As shown in these figures, a terminal lead-out box 1401 is installed on the output lead-out portion 1408 of the solar cell 1407. In the vicinity of the central part of the bottom face thereof, a lead-in hole 1403 for leading in the output lead line is arranged to draw in the output lead line 1410. On one side, a lead-out hole 1404 is arranged to draw out an output lead-out conductor 1411 provided with a connector, which is connected to the output lead line in the terminal lead-out box 1401.

The terminal lead-out box is fixed by means of a sticky adhesive agent 1405 applied on the circumference of the lead-in hole 1403 of the terminal lead-out box 1401 in combination with an adhesive agent 1406 whose properties are different from the sticky adhesive agent 1405 applied on the outer side thereof so as to allow the terminal lead-out box to be installed to cover the output lead-out portion 1408 of the solar cell.

The sticky adhesive agent 1405 used for the present invention does not require any drying process. It can perform an adhesive bonding just by the exertion of a pressure at the room temperature in a solventless condition. However, it is necessary to use a sticky agent having an initial adhesion needed for the fixing operation of the output lead-out conductor. (That is, approximately 5 kgf of apparent peel off adhesion at 90°, for instance). Also, preferably, a material should be provided with a good adhesiveness with respect to the circumference of the terminal lead-out box 1401 and the output lead-out portion 1408 of a solar cell.

In consideration of the above elements, there is no particular limit to a sticky adhesive agent to be used. However, the adoption of a double coated adhesive tape is preferable. The double coated adhesive tape should preferably be the one formed by a foaming or elastic substrate with acrylic resin, silicone resin, or butyl sticky adhesive agent being coated on both sides thereof.

On the other hand, the adhesive agent 1406 used for the present invention should be the one having a water-proof capability of more than JIS 4-class water-proofing standard, and being capable of demonstrating the adhesive properties by changing the structure when a physical action or a chemical reaction is applied.

In consideration of the above elements, there is no particular limit to the adhesive agent 1406 to be used for the present invention, but its kind should preferably be the epoxy resin or silicone resin adhesives having a good electrical insulation and water-proof capability. In consideration of flexibility or a high temperature requirement, it is preferable to adopt a silicone resin adhesive agent. Further, in consideration of the operativity, it is preferable to use the agent of a one-liquid type having a shorter period before producing effects, and also, having a slight viscosity so that it does not flow out. Further, if a silicone RTV rubber of one-liquid type is used, it is preferable to adopt the one whose hardening method is of a dealcoholic type so as not to affect a resin or metal.

In this way, it is unnecessary to take any drying step in the adhesive operation around the lead-in hole arrangement with respect to the terminal lead-out box. By the application of a sticky adhesive agent capable of operating adhesion just by pressure exerted at the room temperature in a solventless condition, it is possible to perform the installation of the output terminal lead-out conductor and others immediately after the fixation of the terminal lead-out box. Here, the drying process of the adhesive bonding is omitted like this, and the operativity is improved accordingly. Subsequently, an adhesive agent, which can demonstrate its adhesive properties by changing the structure thereof by the application of a physical action or chemical reaction, is provided for the circumference of such location. In this way, it is possible to obtain a sufficient adhesion for a practical use once the adhesive agent is dried.

Also, the adhesive agent, which is provided with a water-proof capability of more than the JIS-4-class water-proofing standard, is used and applied to the circumference of the lead-in hole for the output lead line and the sticky adhesive agent. Therefore, it is possible to provide a terminal lead-out box having an excellent water-proof capability, insulation, and reliability.

Also, since the sticky adhesive agent is surrounded by the adhesive agent having an excellent water-proof capability, it is unnecessary for the sticky adhesive agent itself to acquire any water-proofing properties. Therefore, an inexpensive agent can be used in this respect.

Also, when a terminal lead-out box is installed on an output lead-out portion by means of pressure, the distance from the output lead-out portion to the bottom of the terminal lead-out box depends on the thickness of the sticky adhesive agent irrespective of the intensity of pressure to be exerted appropriately. Therefore, the operativity and the uniformity of operation are improved, hence requiring no particular skill in executing this operation.

Also, the adhesive surface of a terminal lead-out box is provided with fine irregularities in order to expand the adhesive area and increase the adhesive strength.

Further, it is preferable to arrange a terminal lead-out box having a terminal lead-out box main body provided with a hole on the bottom thereof to lead in the lead line drawn out from the electrode lead-out unit of a solar cell module, and an aperture on the top thereof, and with a lid member to cover the aperture by fitting it with the terminal lead-out box main body, wherein this main body and the lid member are formed integrally by means of a hinge, and the terminal lead-out box main body is provided with an extrusion or a recess on the side opposite to the surface where the flexible hinge portion is arranged, while the lid member is provided with a flexible hooking portion including a recess or an extrusion to engage with the extrusion or the recess arranged for the main body, and the lid member is provided with a hooking portion on the bottom thereof to release the engagement between the extrusion and the recess.

Also, it is more preferable to arrange an extrusion on the fitting surface of the terminal lead-out box main body, and a recessed groove on the- fitting surface of the lid member to engage with the extrusion or a recessed groove on the fitting surface of the terminal lead-out box main body and an extrusion on the fitting surface of the lid member to engage with the recessed groove.

Further, it is preferable to arrange the structure so that when the terminal lead-out box main body is fitted with the lid member, the gap between the bottom of the flexible hooking portion and that of the terminal lead-out box main body is less than 8 mm, and that only when a disengagement tool is used, it becomes possible to release the engagement, and then, the engagement is released only by hooking the disengagement tool to the hooking portion.

With the structure described above, a terminal lead-out box main body and a lid member are formed integrally through a flexible hinge. Here, there is no possibility that any lid member is lost, which contributes to improving the operativity, too.

Also, there is no need for the provision of any element other than the terminal lead-out box main body and the lid member in order to fit them for fixation. Therefore, one-touch fitting is possible. The costs of materials, such as screws, can be reduced, and the operativity is enhanced simultaneously.

To release the fitting, a disengagement tool is needed. As a result, there is no fear that any mischievous conduct is committed. Yet the fitting release can be carried out just by one action. Both the reliability and operativity can be enhanced accordingly.

Meanwhile, no rubber packing nor any water-proofing material is included between the terminal lead-out box main body and a lid member to obtain the water-proof capability. There is no aging problem of water-proofing material at all. It is possible to reduce the costs, and at the same time, to enhance the reliability.

In other words, it is possible to materialize at lower costs a highly reliable terminal lead-out box having a good operativity for a solar cell module.

In addition, it is preferable to provide a terminal lead-out box with a fixing member to fix a cable for use of electrical output with respect to a solar-cell apparatus having the terminal lead-out box and the cable for use of electrical output.

Also, it is preferable to arrange the fixing member so that it can fix the cable for use of electrical output directly.

Also, it is preferable to arrange a structure so that the cable for use of electrical output is provided with a connector at its leading, and that the fixing member fixes the connector.

Also, it is preferable to arrange a structure so that the fixing member is allowed to fix the cable for use of electrical output and the connector when the cable and connector are only in one posture and configuration.

Further, it is preferable to arrange a structure so that the connector is provided with a directional extrusion, while the fixing member is provided with a groove that matches the extrusion.

With the structure described above, it is possible to prevent the cable from hanging down, and eliminate the problem that the cable becomes an obstacle when handling a solar cell module at the time of its post processing, and also, at the time of its transportation for an installation at a site.

Further, since only one mode is made available for the connector to be fixed, anyone can operate to fix the cable after making it in a desired configuration. As a result, the connector can be installed easily even when the cable has lost its flexibility due to a low temperature.

This one mode has a considerable advantage for the cables and connectors each to be coupled at positive and negative poles positioned at point symmetry. Although referred to in an embodiment given below, each of the cables is turned to face the central point because of this point symmetrical arrangement. Compared to the conventional operation, therefore, the operation becomes easier significantly without requiring much of the physical strength of the operator.

In this way, when the cables and connectors are fixed, the configuration thus considered and arranged produces favorable effects on the operativity, and reliability as well.

Embodiments

Hereinafter, with reference to the accompanying drawings, the present invention will be described in detail, but the present invention is not necessarily limited to the embodiments given below.

Embodiment 1

For the structure of a terminal lead-out unit of a solar cell module of the present invention, ETFE (ethylene tetra fluoro-ethylene) is used as its surface coating material. Also, the rear side reinforcement material is produced by use of a steel plate coated with polyester resin. Now, the structure of the present embodiment will be described.

Figure 16:
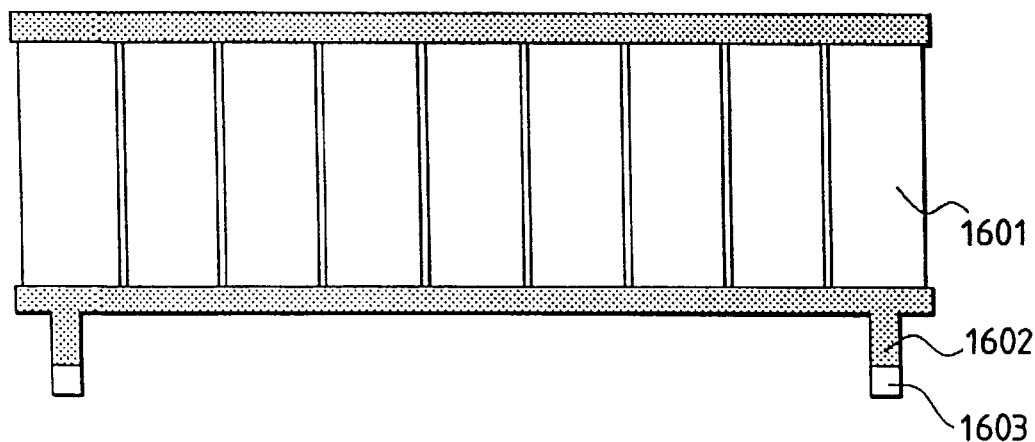
FIG. 16, FIG. 25, and FIG. 46 are plan views schematically showing a solar-cell apparatus.

As shown in FIG. 16, nine sheets of amorphous solar cell elements 1601 are connected in series at first. Then, by use of a copper tab of an appropriate length, each of the positive and negative cables for terminal use is drawn out to a location slightly away from the solar cell elements, and at the same time, the top thereof is soldered to make it an electrode lead-out unit 1602. At this juncture, black PET tape 1603 is adhesively affixed to the portion other than the soldered portion so as to enhance insulation and to make the outer appearance beautiful simultaneously.

Then, a solar cell module is fabricated by laminating on the rear side reinforcement material, a filling material, serially connected solar cell elements, a filling material, and a weatherability film one after another, and after that, by melting the filling materials at a temperature of 150° C. by use of a vacuum laminator in order to resin seal the solar cell elements with the rear side reinforcement material and the weatherability film. Here, a steel plate (0.4 mm thick) coated with polyester resin is used for the rear side reinforcement material; for the filling, EVA (weatherability grade ethylene-butyl vinyl copolymer) is used; and for the surface film, ETFE (ethylene tetra fluoro-ethylene) is used, respectively. Also, for the weatherability film, corona discharge treatment is given to both adhesive surfaces in advance for the enhancement of its adhesiveness with the filling agent and the EVA.

Figure 17:
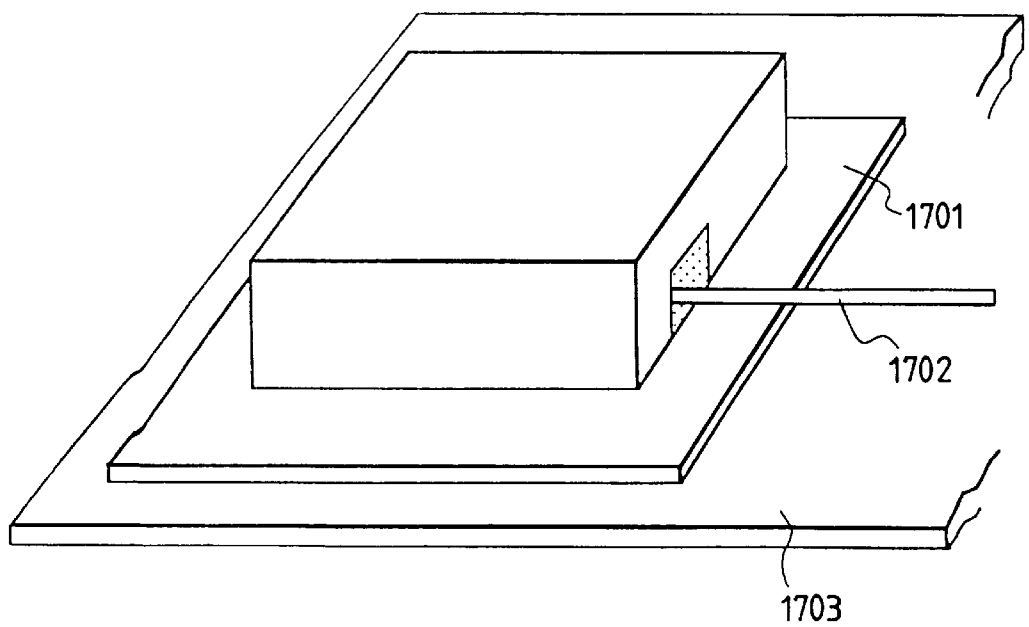

Lastly, as shown in FIG. 17, the portion where the filling agent is given on the light receiving side of the electrode lead-out unit of the hollow structure 1701 formed as described above is scooped out by means of a cutter knife or the like in order to peel off an electrode lead-out portion. Then, on this electrode lead-out portion, a lead line (HKIV) 1702 whose coating is peeled off approximately 5 mm from the edge thereof is soldered.

Then, in order to make the water-proofing assuredly for the lead line and the ETFE film, the silicone sealant "SILASTIC 739RTV" manufactured by Dow Corning Inc. is coated rather thickly on the portion on the hollow structure 1701 covered by the ETFE film. Immediately after that, the above sealant is filled in the hollow structure 1701 formed by poly-carbonate resin, and adhesively bonded. This structure is left intact for a week to form the terminal lead-out unit of the solar cell module.

In this way, it is possible to prevent water from entering the interior of the unit, and to make fixation reliably at the same time.

Embodiment 2

Figure 18:
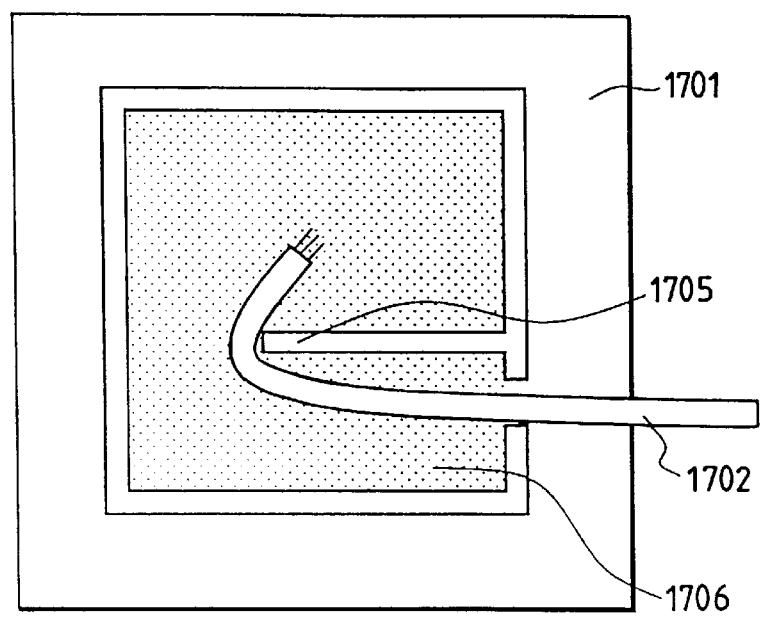

As shown in FIG. 18, an extrusion 1705 is arranged near the aperture for use of the lead line 1702. It extends inwardly in the hollow structure 1701 formed by polycarbonate resin in accordance with Embodiment 1. Then, the hollow structure 1701 is filled with the sealant 1706. The hollow structure 1701 is placed over the electrode lead-out portion for adhesive bonding, while attention is given so that the lead line 1702 is hooked to the extrusion 1705. The hollow structure is left intact for a week as it is to form the terminal lead-out unit of a solar cell module.

In this way, it is possible to reduce the physical load exerted on the lead line, in addition to the prevention of water permeation into the interior, as well as to the assured fixation, hence obtaining the enhanced reliability.

Embodiment 3

Figure 19:
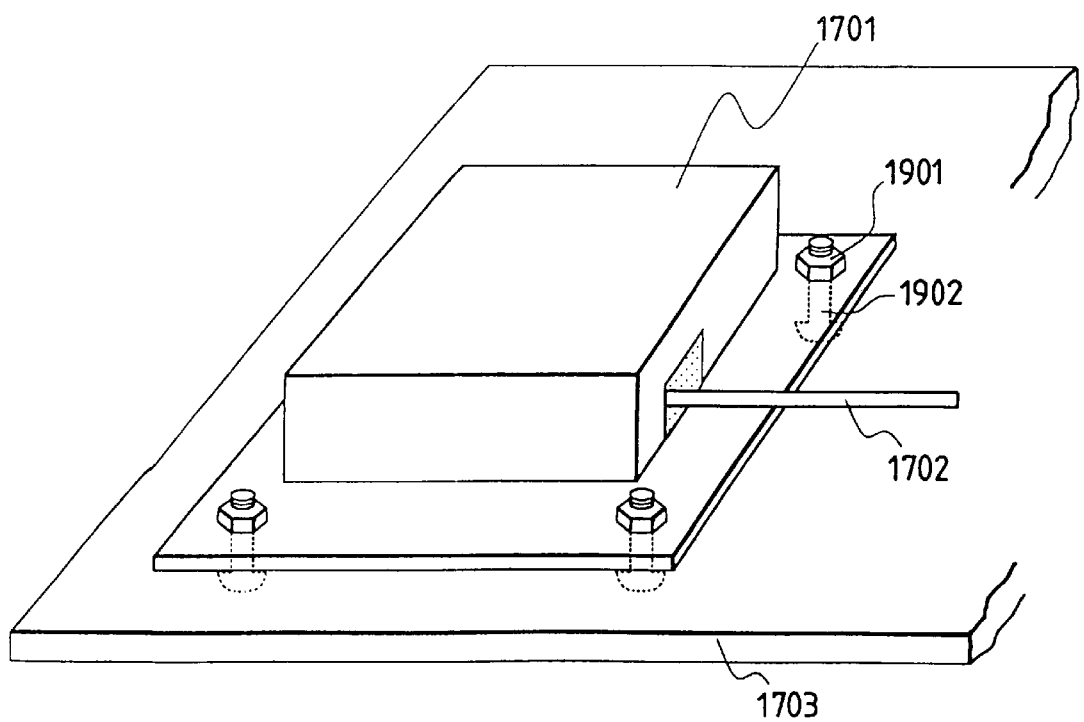
Figure 20:
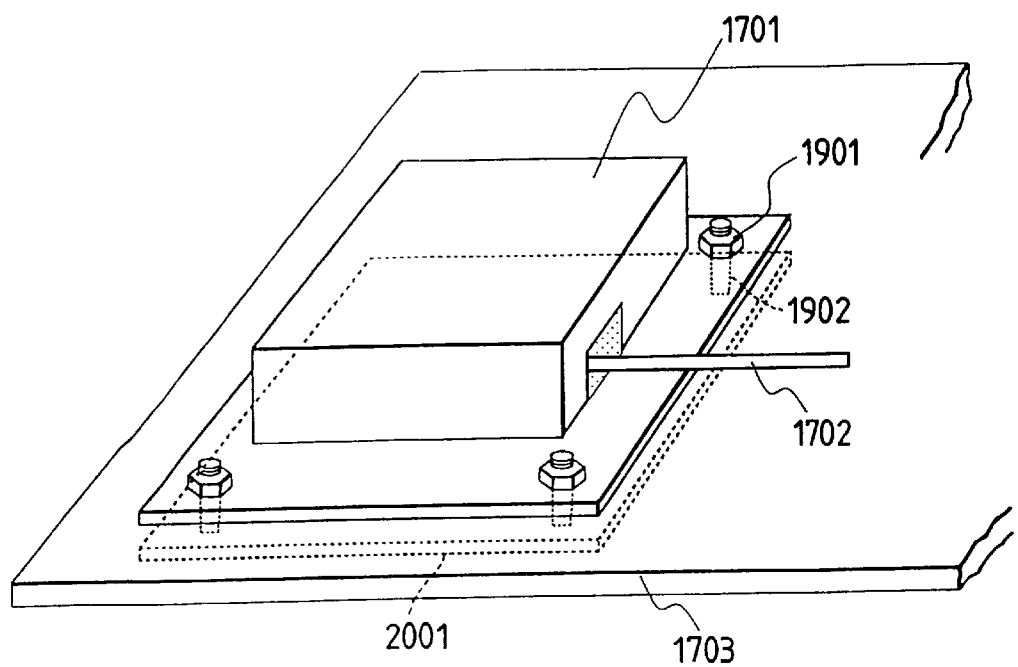

As shown in FIG. 19 and FIG. 20, there is used a hollow structure 1701 provided with through holes, each φ 3.5 mm, at four locations on the outer frame thereof. Any other aspects than this through hole arrangement are the same as those of the hollow structure 1701 of the Embodiment 1. Meanwhile, through holes, each φ 3.5 mm, are provided at four locations by use of a hand drill for a solar cell module 1703 in the same positional relationship with those arranged on the hollow structure to form a terminal lead-out unit as in the Embodiment 1. After that, stainless steel bolts 1902, each φ 3 mm, are inserted into the through holes on the hollow structure 1701 and the solar cell module 1703, and tightened by use of nuts 1901 to form a terminal lead-out unit of the solar cell module. With such arrangement, the reliability is enhanced still more when a physical load is exerted on the structure. In this respect, as the arrangement of bolts for the present embodiment, it may be possible to arrange a structure that a tapping plate 2001, or a reinforcement plate, is placed on the rear side of the solar cell module 1703, which are provided with having the hollow structure 1701 having through holes, each φ 3.5 mm, at four locations on its outer frame, and that four bolts 1902 are provided for or put through the plate, which are tightened by nuts 1901 for fixation.

In this way, it is possible to enhance the reliability still more.

Embodiment 4

Figure 21:
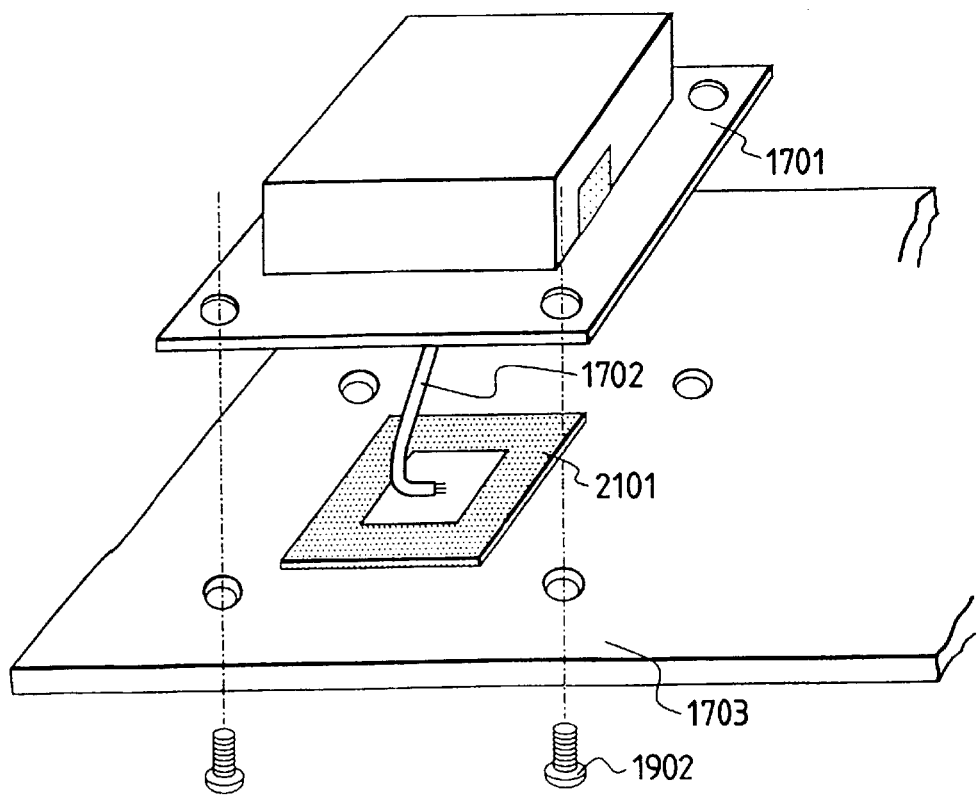

As shown in FIG. 21, in accordance with the present embodiment, there is prepared a square, heat and flame resistance foam material "NanNex TL4400" manufactured by Inoac Corporation (with acrylic resin sticky adhesive agent being coated on both surfaces), the central portion of which is punched out, and then, this material is sandwiched between a hollow structure and ETFE film as a sealing material 2101 on the circumference of the filling portion of the hollow structure 1701 to fill in the filling agent when the terminal lead-out unit is formed. Then, bolts 1902 are tightened with nuts to compress the sealing material 2101, thus forming a terminal lead-out unit. In accordance with the present embodiment, water permeation into the interface between the filling agent and the ETFE film is suppressed by means of the water-proofing effect of the sealing material 2101, thus making it possible to enhance the reliability of the terminal lead-out unit of a solar cell module 1703.

Embodiment 5

Figure 22:
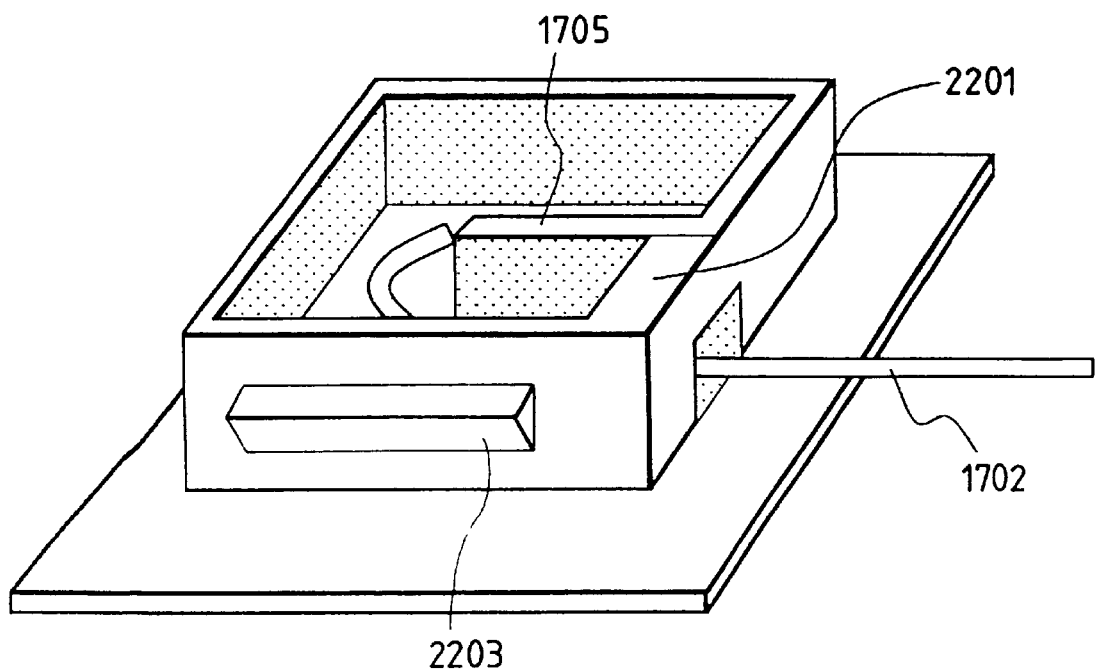
Figure 23:
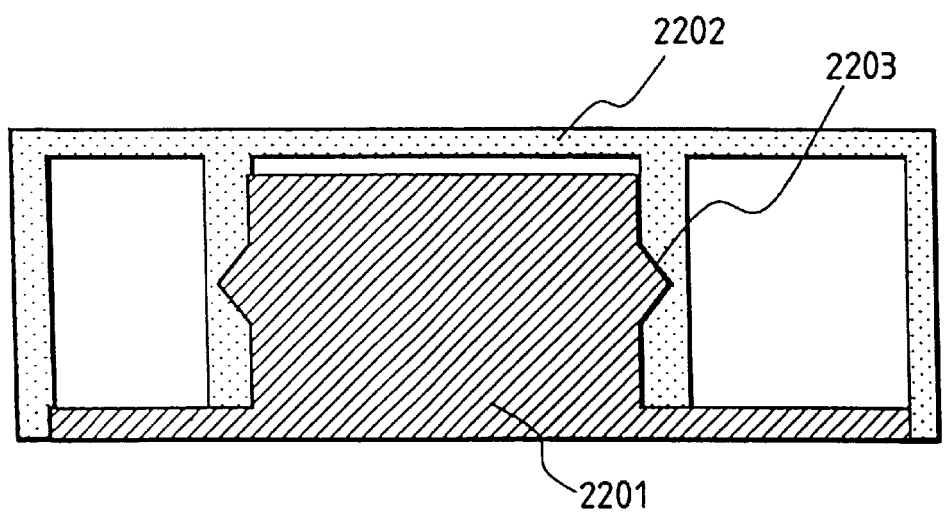

As shown in FIG. 22 and FIG. 23, a stand unit 2201 formed by polycarbonate resin and an upper lid member 2202 are prepared as a hollow structure. A lead line (HKIV) 1702 is arranged to pass the aperture and the filling portion of the filling agent of the stand unit 2201 and near an extrusion 1705, and soldered to the electrode lead-out portion. Then, after the lead line 1702 is hooked to the extrusion 1705 and the stand unit 2201 is held in a given position, the silicone sealant "SE9186" manufactured by Torei-Dow Corning Co., Ltd. is filled in it. After the stand unit is left intact for three days in this state, the upper lid member 2202 having undercut portions 2203 is fitted over the stand unit 2201 by matching such portion to the engaging portions of the stand unit for the formation of a terminal lead-out unit of a solar cell module. In accordance with the present embodiment, the assembling operativity is improved, and at the same time, the reliability of the solar cell module is enhanced when the physical load is exerted on it in the direction perpendicular thereto.

Embodiment 6

Figure 24:
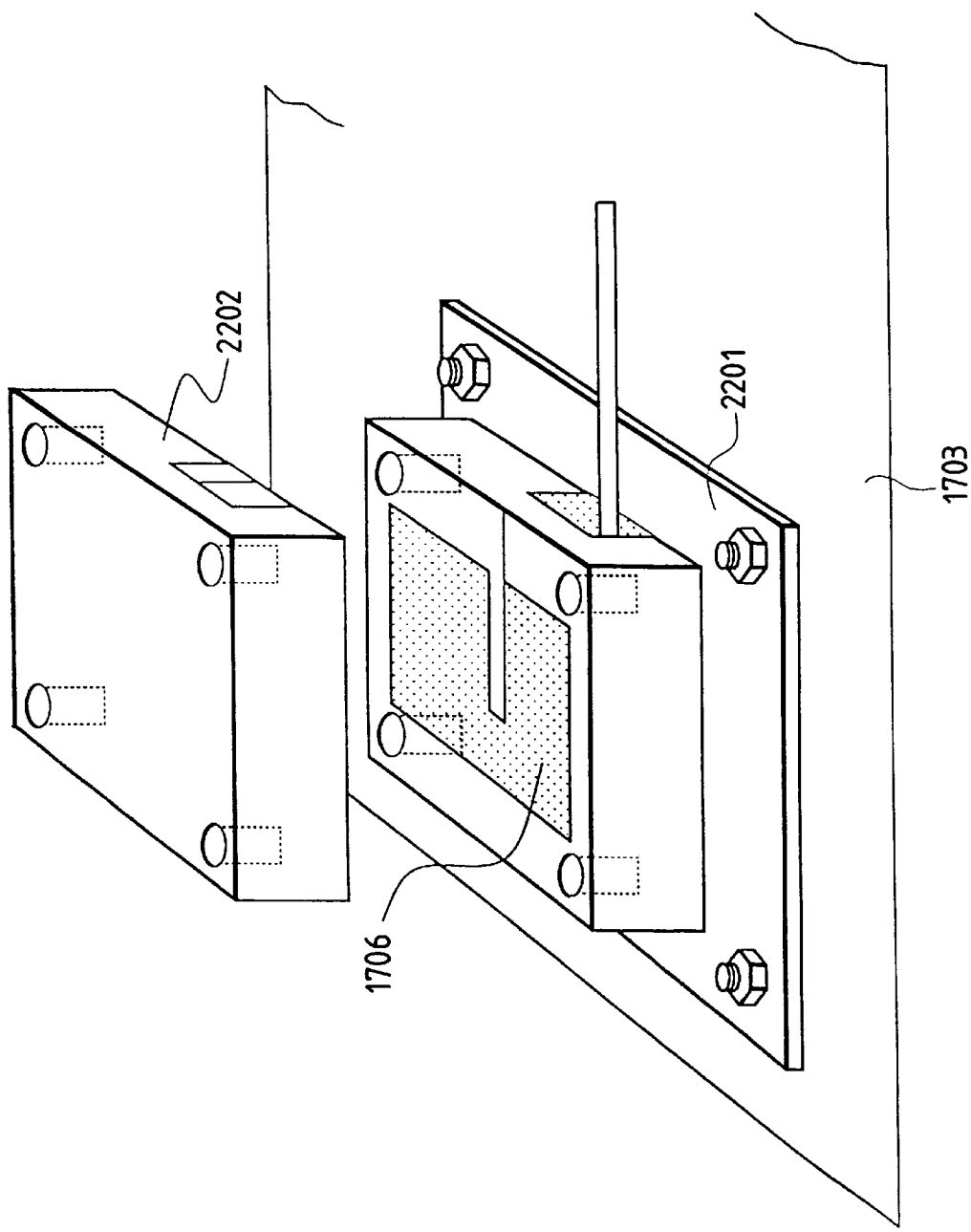

As shown in FIG. 24, there are prepared a stand unit 2201 formed by polycarbonate as a hollow structure having through holes, each φ 3.5 mm, at four locations on the outer frame thereof, and a lid member 2202. Then, a lead line (HKIV) is arranged to pass the filling portion of a filling agent and the aperture of the stand unit 2201, and soldered to the electrode lead-out portion. After the lead line is hooked to an extrusion and the stand unit is held by means of bolts, each φ 3 mm, which are put through in each of the given positions and tightened by nuts, respectively, and then, as in the Embodiment 4, the silicone sealant "SE9186" manufactured by Torei-Dow Corning Co., Ltd. is filled in the stand unit as sealant 1706. After the stand unit is left intact for three days in this state, the upper lid member 2202, which is provided with tenons formed to be fitted into the stand unit, is fitted over the stand unit for the formation of a terminal lead-out unit of a solar cell module. In accordance with the present embodiment, the assembling operativity is improved, and at the same time, the reliability of the solar cell module is enhanced when the physical load is exerted on it in the direction perpendicular thereto.

Embodiment 7

For the terminal lead-out structure of a solar cell module in accordance with the present embodiment, ETFE (ethylene tetra fluoro-ethylene) is used for the surface coating material, and a polyester resin coated steel plate is used for the rear side reinforcement plate, respectively.

Figure 25:
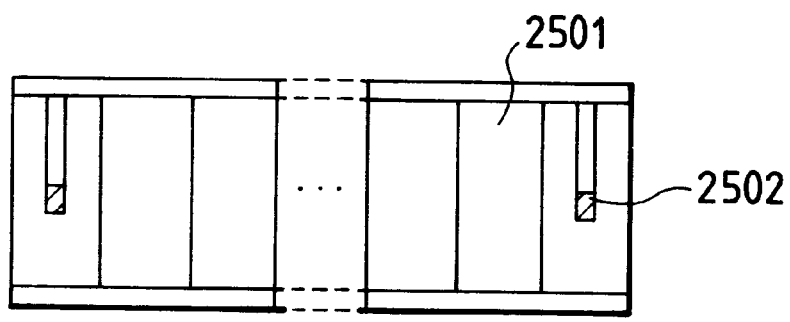

As shown in FIG. 25, 13 sheets of amorphous solar cell elements 2501 are arranged in series. Copper tabs of an appropriate length are adhesively bonded to the rear side of the solar cell elements each as a wiring for terminal use of a positive pole and of a negative pole, respectively. Each leading end thereof is soldered to make it an electrode lead-out portion 2502. At this juncture, a glass cross tape is adhesively bonded to the rear side of each copper tab for the enhancement of insulation.

Figure 26:
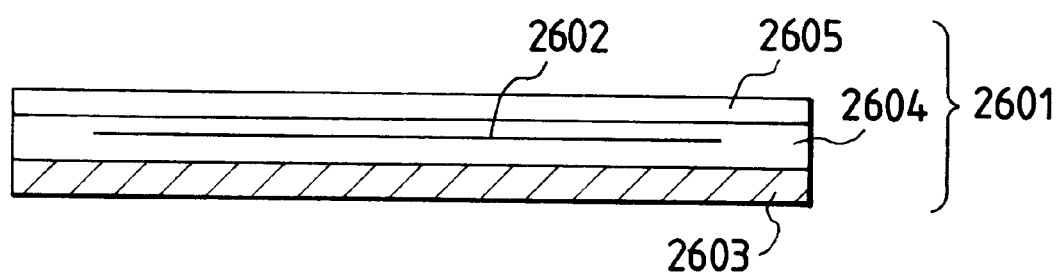

Then, as shown in FIG. 26, a solar cell module 2601 is fabricated by laminating, on a steel plate (0.4 mm thick) 2603 coated with polyester resin as the rear side reinforcement material, EVA (weatherability grade ethylene-butyl vinyl copolymer) 2604 as a filling material, serially connected solar cell elements 2602, EVA 2604 as the same filling material, and ETFE (ethylene tetra fluoro-ethylene) 2605 as a weatherability film one after another in that order, and after that, by melting the filling materials at a temperature of 150° C. by use of a vacuum laminator in order to resin seal the solar cell elements with the rear side reinforcement material and the weatherability film. Here, a hole of φ 12 mm is arranged on the steel plate 2603 coated with polyester resin in advance for drawing out a terminal.

Figure 27:
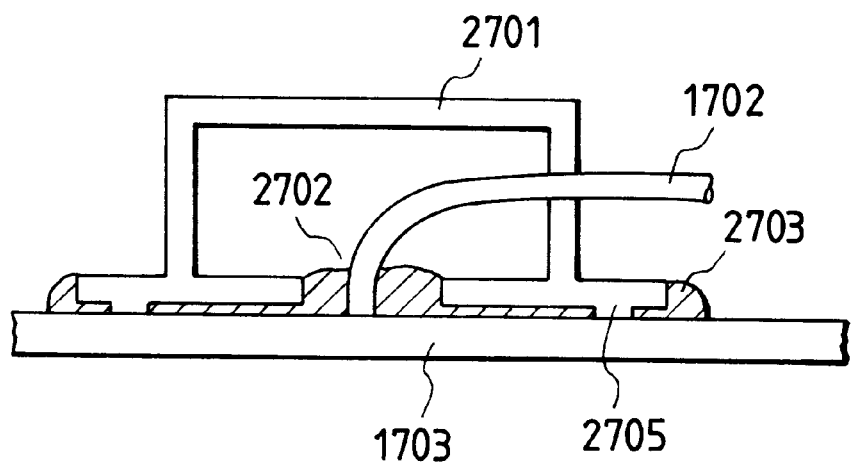

Lastly, as shown in FIG. 27, the filling agent on the electrode lead-out portion of each solar cell element is scooped out by means of a cutter knife or the like in order to cause the electrode lead-out portion to be exposed, and then, the lead line HKIV 1702 whose insulation coating is peeled off from its end in advance is soldered on that portion.

Then, the lead line is arranged to pass the through hole 2702 of the hollow structure in advance, and also, on the surface of the hollow structure to face the solar cell module 1703, the silicone sealant "SILASTIC 739RTV" manufactured by Dow Corning Inc. is coated. Immediately after that the hollow structure is adhesively bonded to a given position of the solar cell module. Then, the hollow structure 2701 is compressed until each extrusion 2705 of 0.5 mm high structured on the adhesive surface thereof reaches the solar cell module 1703. The structure is left intact for 24 hours as it is to form a terminal lead-out unit of the solar cell module 1703.

In accordance with the present embodiment arranged as above, it is possible to improve the operativity at the time of adhesively bonding a hollow structure to the rear side of a solar cell module, and to apply an adhesive agent as thick as desired, thus obtaining stable properties for the enhancement of the adhesive reliability of the hollow structure.

Embodiment 8

Figure 28:
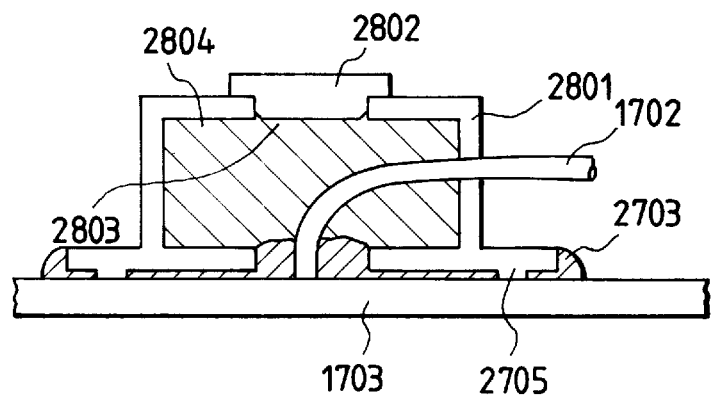

As shown in FIG. 28, a hollow structure comprising two components, a stand unit 2801 and an upper lid member 2802, is used. Also, a lead line is inserted to pass a through hole of the hollow structure in advance. On the surface of the stand unit 2801 to face a solar cell module 1703, a silicone sealant "SILASTIC 739RTV" manufactured by Dow Corning Inc. is coated as sealant 2703. Immediately after that, the stand unit is adhesively bonded to the solar cell module. Then, the hollow structure is compressed until the extrusions 2705, each having a height of 0.5 mm, arranged on the adhesive surface thereof reaches a solar cell module 1703. Further, the sealant "SILASTIC 739RTV" is filled in as sealant 2804 from a through hole 2904 on the ceiling plate of the hollow structure until the electrode lead-out portion is completely hidden. The structure is left intact for 24 hours as it is, and then, the upper lid member is fitted to form a terminal lead-out unit of the solar cell module 1703.

In accordance with the present embodiment, the operativity is improved as in the Embodiment 7 when a hollow structure is adhesively bonded to the rear side of a solar cell module. Hence, it is possible to apply adhesives as thick as desired to obtain the stable properties for the enhancement of the reliability of the hollow structure accordingly. Also, after the hollow structure is adhesively bonded to the rear side of the solar cell module, the electrode lead-out portion is assuredly sealed, thus making it possible to improve the reliability of the terminal lead-out unit of the solar cell module.

Embodiment 9

Figure 29:
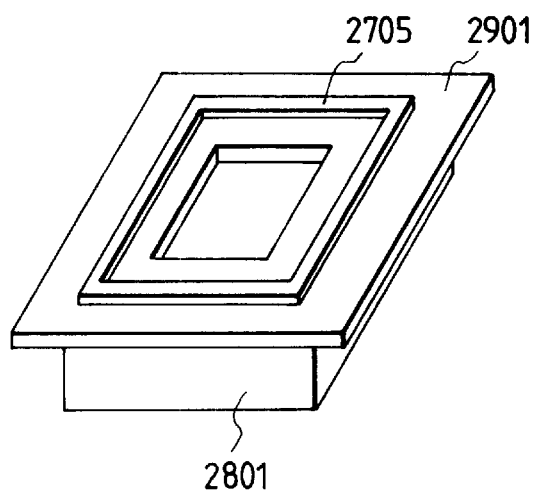
Figure 30:
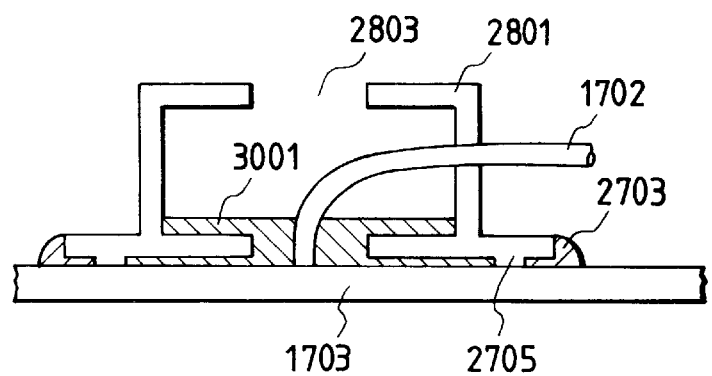

As shown in FIG. 29 and FIG. 30, for the stand unit 2801 of a hollow structure, a series of extrusions 2705, which surround an electrode lead-out hole, are arranged on the surface 2901 of the stand unit 2801 of the hollow structure to face a solar cell module 1703, and also, a through hole 2803 is arranged on the ceiling plate thereof. Using such stand unit the silicone sealant "SILASTIC 739RTV" manufactured by Dow Corning Inc. is coated on the outer surface from the outer edge of the extrusions 2705. Then, immediately after that, the stand unit is adhesively bonded to the solar cell module 1703. The stand unit 2801 of the hollow structure is compressed until the series of extrusions 2705 of 0.5 mm arranged on the adhesive surface thereof reaches the solar cell module 1703. After that, from the through hole arranged on the ceiling plate, a filling agent "KE4896" manufactured by Sinetsu Kagaku Kogyo K.K. is filled in as filling agent 3001 to an appropriate depth. The structure is left intact for 24 hours as it is to form the terminal lead-out unit of the solar cell module 1703.

In accordance with the present embodiment, the operativity is improved when a hollow structure is adhesively bonded to the rear side of a solar cell module. Further, since a filling agent of a lower viscosity is filled in the inner side from a series of extrusions, it is possible to enhance the reliability of the electrode lead-out portion.

Embodiment 10

A terminal lead-out unit is formed in the same manner as the Embodiment 7 with the exception that the adhesive bonding of the coating range of the sealant 2703 is defined to be inner side surrounded by the extrusion 2705 of the hollow structure 2701.

With the arrangement described above, the operativity is improved when a hollow structure is adhesively bonded to the rear side of a solar cell module. The thickness of adhesives can be made as desired, thus obtaining a stable properties. Also, it is possible to suppress flowing out of adhesives from the extrusion arranged on the outer circumferential edge for the provision of a beautiful outer appearance of the terminal lead-out unit. Further, since adhesives are not exposed to the air outside, it is possible to suppress the deterioration thereof. In this way, the adhesive reliability of the hollow structure is enhanced.

Embodiment 11

Figure 31:
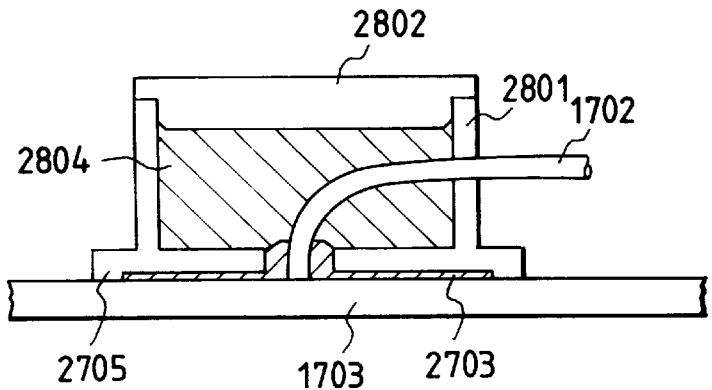

As shown in FIG. 31, a hollow structure to be used for the present embodiment comprises two components, a stand unit 2801 and an upper lid member 2802. Also, a lead line 1702 is inserted to pass a through hole of the hollow structure in advance. Then, on the surface of the stand unit 2801 to face a solar module 1703 and within a range surrounded by the extrusion 2705 of the stand unit 2801, the silicone sealant "SILASTIC 739RTV" manufactured by Dow Corning Inc. is coated as sealant 2703. Immediately after that, the stand unit is adhesively bonded to the solar module 1703. Then, the hollow structure is compressed until the extrusion having 0.5 mm high arranged on the outer circumferential edge of the adhesive surface thereof reaches the solar cell module 1703. After that, from a through hole 2804 of the ceiling plate of the hollow structure, the sealant "SILASTIC 739RTV" is filled in as filling agent 2804 until the electrode lead-out portion is completely hidden. The structure is left intact for 24 hours as it is, and then, the upper lid member 2802 is fitted over the through hole 2804 of the ceiling plate to form the terminal lead-out unit of the solar cell module 1703.

In accordance with the present embodiment, the operativity is improved as in the Embodiment 1 when a hollow structure is adhesively bonded to a solar cell module 1703. The thickness of adhesives can be made as desired. As a result, stable properties can be obtained. Also, any flowing out of adhesives is suppressed by means of the extrusion 2705 arranged on the outer circumferential edge, hence making it possible to finish the outer appearance of a terminal lead-out unit beautifully. Also, no adhesives are exposed to the air outside. The deterioration of adhesives can be suppressed. In this way, the adhesive reliability of the hollow structure is enhanced. Further, the electrode lead-out portion is assuredly sealed after the hollow structure is adhesively bonded to the solar cell module. Therefore, the reliability of the terminal lead-out unit is enhanced.

Embodiment 12

Figure 32:
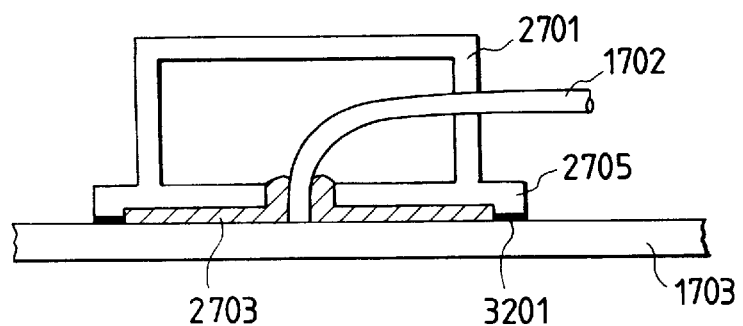

For the present embodiment, the structure is arranged the same as the Embodiment 7 with the exception of the points given below to form a terminal lead-out unit of a solar cell module. In other words, as shown in FIG. 32, after the silicone sealant 2703 is coated, a double coated adhesive tape 3201 is applied to the extrusion 2705 having 0.5 mm high on the outer circumferential edge of the adhesive surface of a hollow structure 2701. As the double coated adhesive tape 3201, a VHB bonding material "Y4950" manufactured by Sumitomo 3-M Inc. is adopted. To the extrusion 2705, the double coated adhesive tape 3201 is applied after a peeler on one side is peeled off. Then, after peeling off another peeler, the solar cell module 1703 is compressed so that the double coated adhesive tape 3201 adheres to it.

In accordance with the present embodiment, the operativity is improved when a hollow structure is adhesively bonded to the rear side of a solar cell module. As a result, the thickness of adhesives can be made as desired to obtain stable properties. Then, by the initial adhesiveness of a double coated tape, it is possible to fix a hollow structure in a given position assuredly. Thus, the operativity is enhanced. Also, by means of the outer circumferential edge of an extrusion and by use of a double coated adhesive tape, the outer appearance of a terminal lead-out unit can be finished beautifully. Further, since no adhesives are exposed to the air outside, the deterioration thereof can be suppressed to improve the adhesive reliability of the hollow structure. Also, the electrode lead-out portion is assuredly sealed after the hollow structure is adhesively bonded to the rear side of the solar cell module, hence making it possible to enhance the reliability of the terminal lead-out unit of the solar cell module.

Embodiment 13

Figure 33:
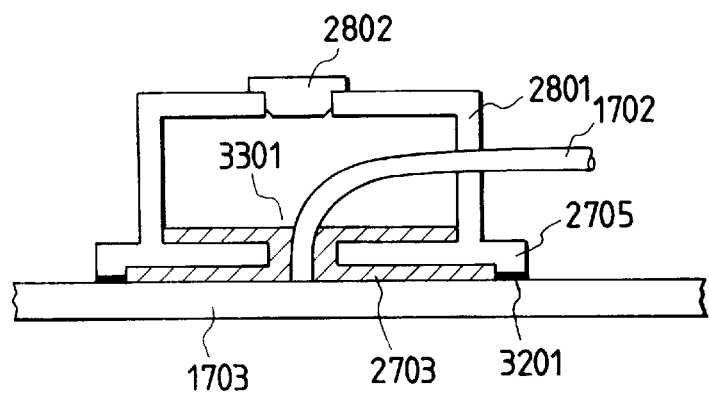

As shown in FIG. 33, a lead line 1702 is inserted to pass a through hole of a hollow structure 2801 in advance. Then, after the silicone sealant 2703 is coated, a double coated adhesive tape 3201 (VHB bonding material "Y4950" manufactured by Sumitomo 3-M Inc.) is applied, as in the Embodiment 12, to the extrusion 2705 having 0.5 mm high on the outer circumferential edge of the adhesive surface of a stand unit after a peeler on one side is peeled off. Then, after peeling off another peeler, the solar cell module is compressed so that the double coated adhesive tape 3201 adheres to it. Subsequently, as a sealant 2703, a silicone one-liquid RTV "KE4896" manufactured by Sinetsu Kagaku Kogyo K.K. is filled in the interior of the hollow structure 2801. Thus, the hollow structure 2801 is adhesively bonded to the solar cell module, and left intact for 24 hours to form the terminal lead-out unit of the solar cell module.

In accordance with the present embodiment, the operativity is improved when a hollow structure is adhesively bonded to the rear side of a solar cell module. The thickness of adhesives can be made as desired to obtain stable properties. Also, by the function of the outer circumferential edge of an extrusion, the outer appearance of a terminal lead-out unit can be finished beautifully. Further, since no adhesives are exposed to the air outside, the deterioration of adhesives can be suppressed to improve the adhesive reliability of the hollow structure. Also, the electrode lead-out portion is assuredly sealed after the hollow structure is adhesively bonded to the rear side of the solar cell module, hence making it possible to enhance the reliability of the terminal lead-out unit of the solar cell module.

Embodiment 14

Figure 34:
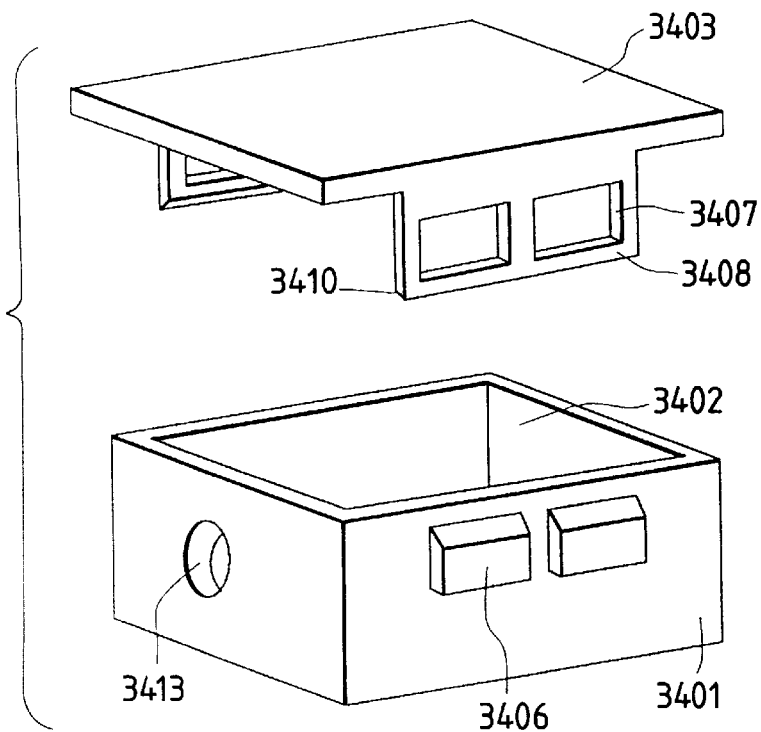
Figure 35:
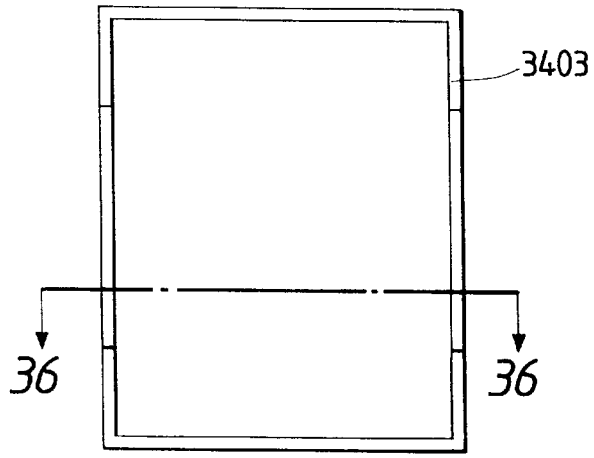
Figure 36:
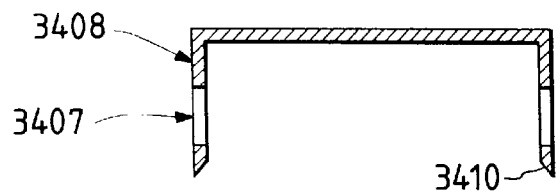
Figure 37:
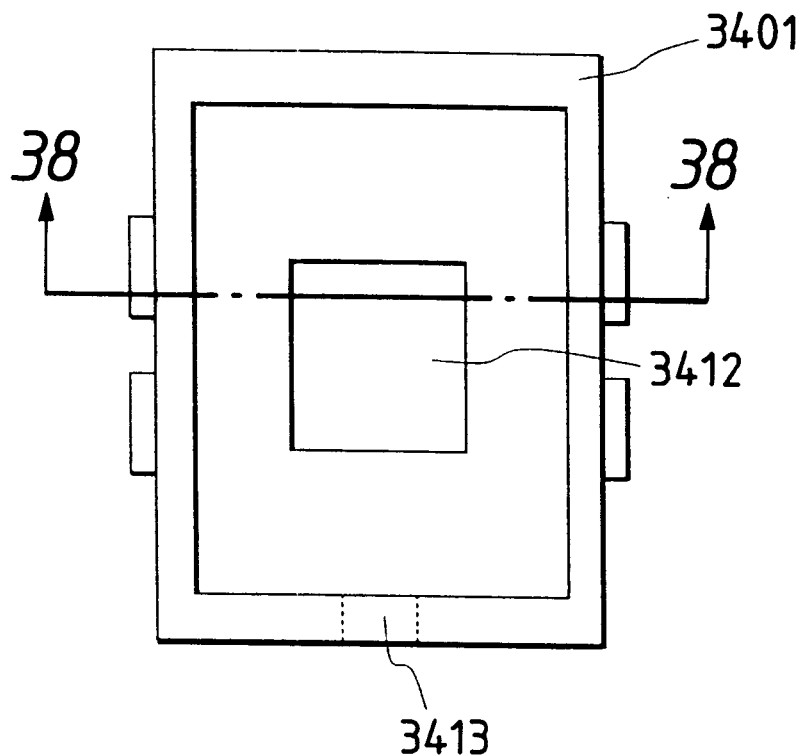
Figure 38:
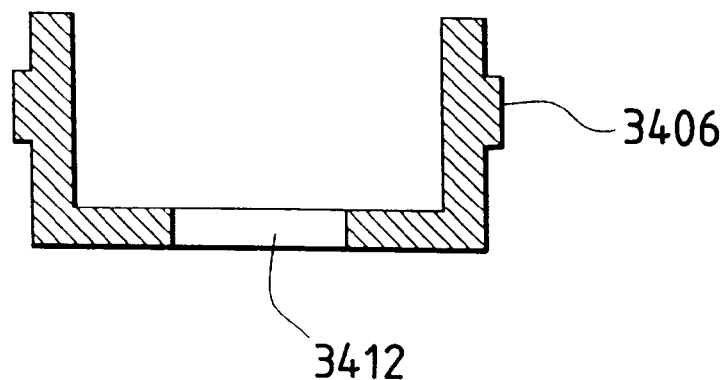

FIG. 34 is an exploded perspective view which schematically shows a terminal lead-out box in accordance with the present embodiment. FIG. 35 and FIG. 37 are the plan views schematically showing the lid member and the terminal lead-out box main body of the terminal lead-out box represented in FIG. 34. Also, FIG. 36 is a schematic cross-sectional view taken along line 36—36 in FIG. 35. FIG. 38 is a schematic cross-sectional view taken along line 38—38 in FIG. 37.

In FIG. 34 to FIG. 38, a reference numeral 3401 designates a terminal lead-out box main body formed by polycarbonate resin by means of an injection molding. On the top thereof, an aperture 3402 is arranged. On both sides, extrusions 3406 are arranged. A reference numeral 3403 designates a lid member fitting to the terminal lead-out box main body 3401, which is formed by polycarbonate by means of an injection molding. On both sides thereof, flexible hooking portions 3408 are arranged including recessed portions 3407 that engage with the extrusions 3408. On the lower inner side of each flexible hooking portion 3408, a hooking groove (or slanting portion) 3410 is arranged to release the engagement between the extrusion 3406 and recessed portion 3407.

On the bottom face of the terminal lead-out box main body 3401, a lead-in hole 3412 is arranged to draw in the lead line drawn from the electrode lead-out portion of a solar cell module. Further, on one side of the terminal lead-out box main body 3401, a cable lead-out hole 3413 is arranged to draw out an output cable in the direction different from the lead-in direction of the lead line.

Now, the description will be made of a method for assembling a terminal lead-out box. After wiring is made in the terminal lead-out box, a lid member 3403 is pressed in from above the terminal lead-out box main body, and when a "clicking sound", for example, is heard, the fitting is completed.

Now, the description will be made of a method for releasing the engagement between the terminal lead-out box main body 3401 and the lid member 3403. As described later, a special tool is hooked onto the hooking groove 3410, and then, the engagement on one side is released when the "clicking sound" is heard. The disengagement on the other side is carried out likewise. Thus, the engagement between them is released. In this way, it becomes easier to make examination and maintenance, thus improving the operativity.

Embodiment 15

Figure 39:
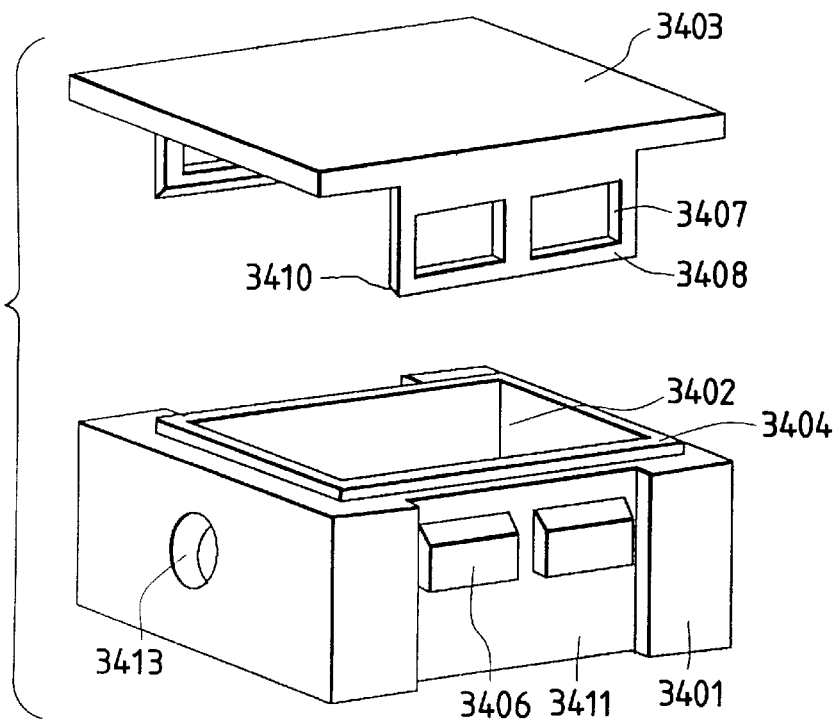
Figure 40:
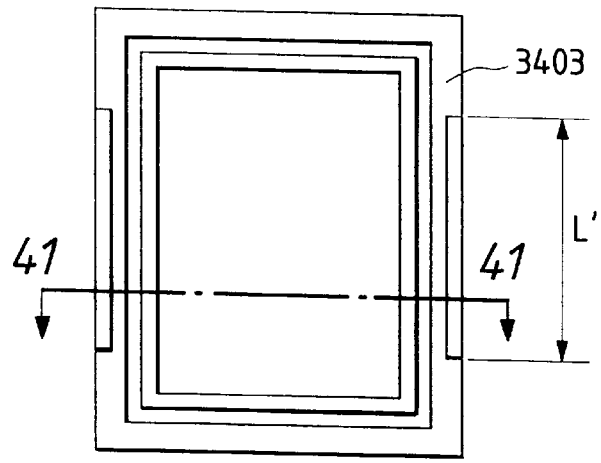
Figure 41:
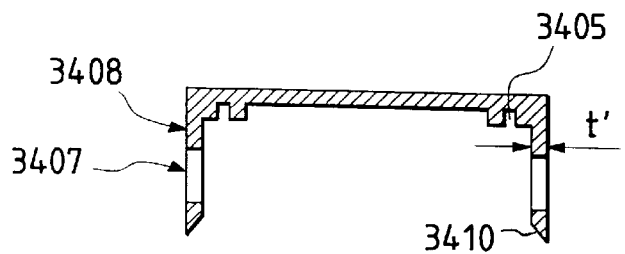
Figure 42:
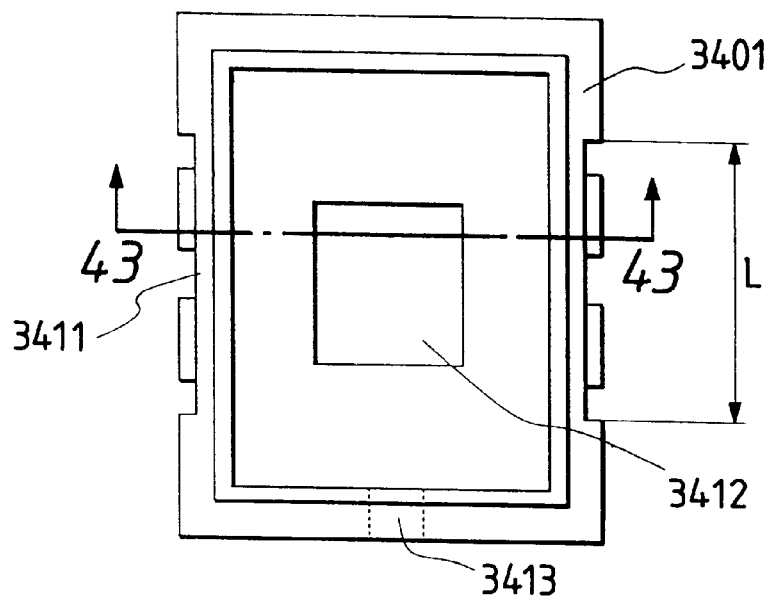
Figure 43:
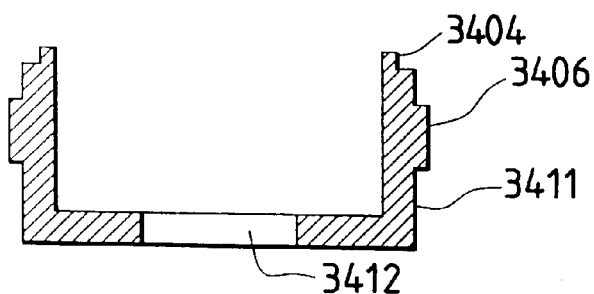

FIG. 39 is an exploded perspective view which schematically shows a terminal lead-out box in according with the present embodiment. FIG. 40 and FIG. 42 are the plan view schematically showing the lid member and the terminal lead-out box main body of the terminal lead-out box represented in FIG. 39. Also, FIG. 41 is a cross-sectional view taken along line 41—41 in FIG. 40. FIG. 43 is a schematic cross-sectional view taken along line 43—43 in FIG. 42.

As shown in FIG. 39 to FIG. 43, an extrusion 3404 of 1 mm high is arranged on the upper circumferential wall of a terminal lead-out box main body 3401. Also, a recessed portion 3405 of 1 mm deep is arranged on the lower circumferential edge of a lid member 3403 to fit the extrusion 3404 of the terminal lead-out box main body 4301. In this way, it is possible to suppress the permeation of water into the interior of the terminal lead-out box having a lid member of a solar cell module, thus improving its waterproof capability.

For the terminal lead-out box main body 3401, receiving portions 3411 are arranged to receive the flexible hooking portions 3408. The width L of each receiving portion 3411 corresponds to the width L' of each flexible hooking portion 3408. Also, each of the receiving portions 3411 is placed in each recessed portion having the corresponding depth from the outer circumference of the terminal lead-out box main body 3401 to the thickness t' of each of the flexible hooking portions. In this way, when the terminal lead-out box main body 3401 and the lid member 3403 are fitted together, the receiving portions 3411 serve as a guide for the flexible hooking portions 3408. Hence, it is possible to carry out the assembling operation easily for the terminal lead-out box having the lid member with respect to a solar cell module, and to enhance the operativity accordingly.

Figure 44:
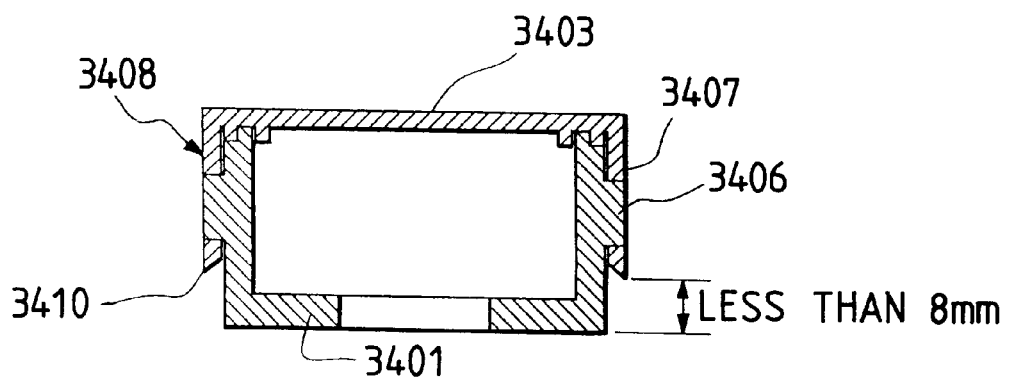

FIG. 44 is a cross-sectional view which shows the fitting state of the terminal lead-out box represented in FIG. 39.

When the terminal lead-out box main body 3401 and the lid member 3403 are fitted together, the bottom side of the flexible hooking portions 3408 is positioned lower than the bottom face of the terminal lead-out box main body 3401 by less than 8 mm, for example, and then, only by use of a special tool, the engagement can be released. In other words, the structure is arranged so that the disengagement is possible only by use of such special tool to be hooked to each hooking groove 3410 when releasing the engagement between each of the extrusions 3406 and recessed portions 3407. The distance between the bottom side of the flexible engagement portions 3408 and the bottom face of the terminal lead-out box main body 3401 is made less than 8 mm, thus making it impossible to release the engagement between them by use of fingers. In this way, there is no fear that no mischievous conduct is committed, and the reliability of the terminal lead-out box of a solar cell module is enhanced accordingly.

FIGS. 45A to 45E are views illustrating a method for releasing the engagement for a terminal lead-out box.

Figure 45A:
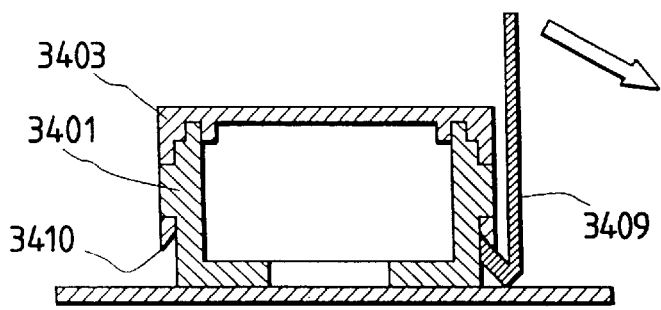
Figure 45B:
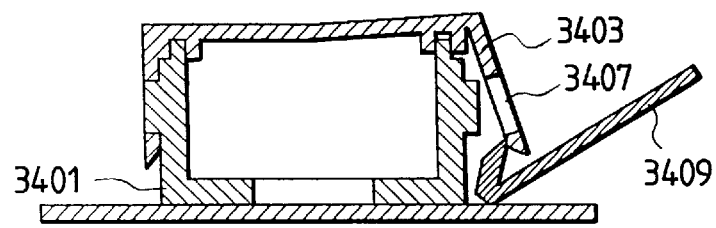
Figure 45C:
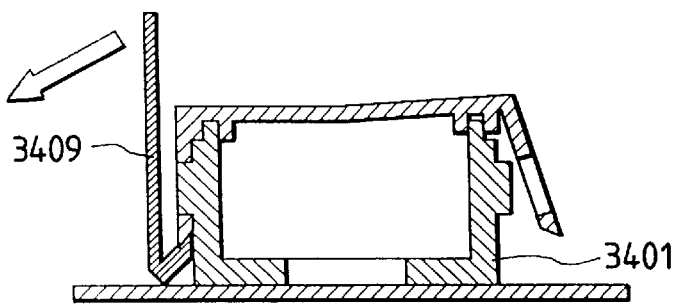
Figure 45D:
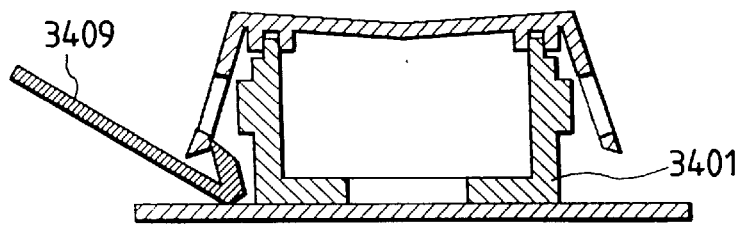
Figure 45E:
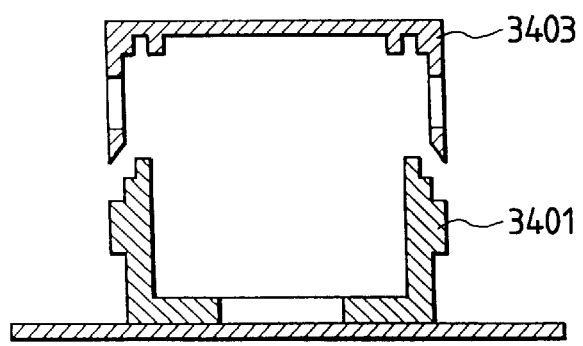

As shown in FIG. 45A, a special tool 3409 is hooked to a hooking groove 3410. A force is exerted in the direction indicated by an arrow in FIG. 45A. Then, as shown in FIG. 45B, the engagement on one side is released with a "clicking sound", for example. Thus, as shown in FIGS. 45C and 45D, the same operation is repeated on the hooking portion on the opposite side. In this way, as shown in FIG. 45E, the disengagement between the terminal lead-out box main body 3401 and the lid member 3403 is executed.

Embodiment 16

As the surface coating material for the present embodiment, ETFE (ethylene tetra fluoro-ethylene) is used, while as the rear side reinforcement plate thereof, a steel plate coated with polyester resin is used, in order to form the terminal lead-out structure of a solar cell module. Such structure will be described.

Figure 46:
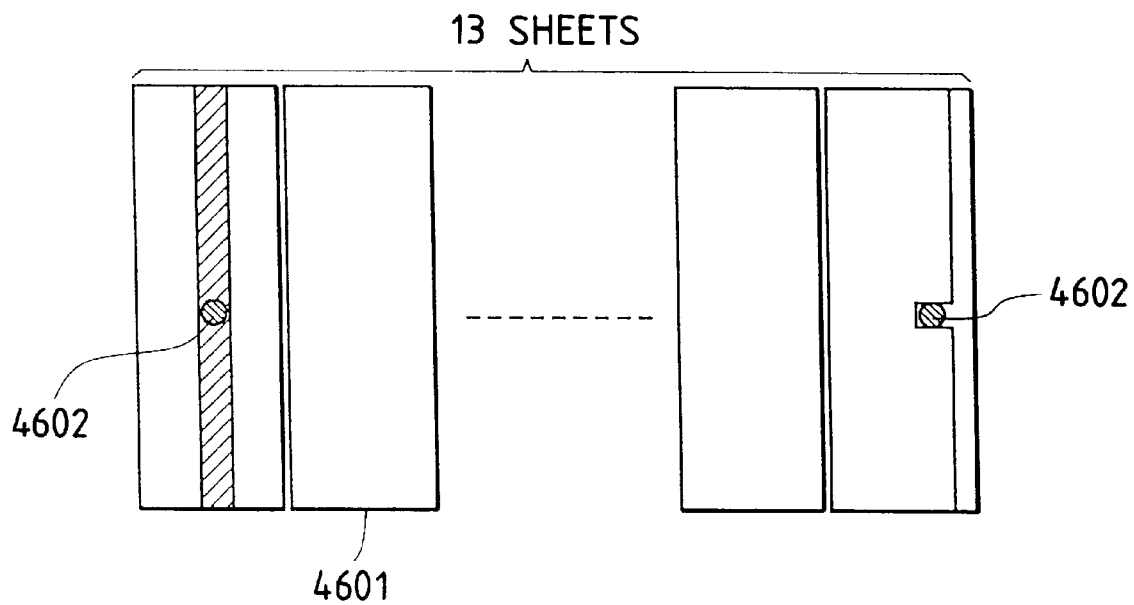

At first, as shown in FIG. 46, 13 sheets of non-crystalline solar cell elements 4601 formed on a stainless steel base board are connected in series. A copper tab of an appropriate length, which is prepared for each cable for use of the positive and negative poles, is adhesively bonded to the rear side of the solar cell elements 4601, and then, the leading end of each copper tab is soldered to form an electrode lead-out portion 4602.

Figure 47:
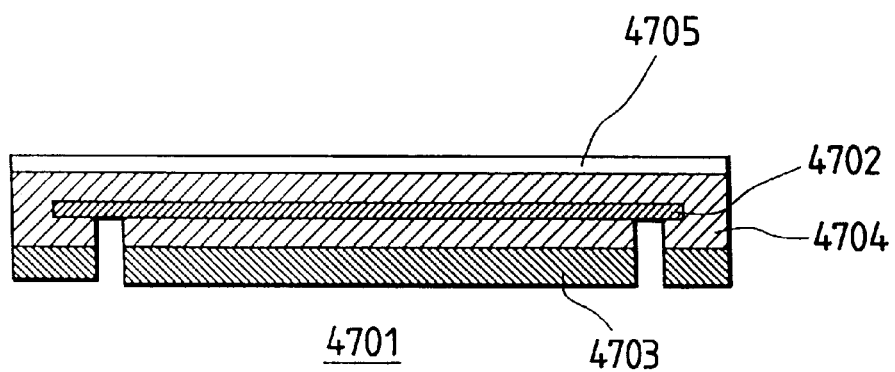

Then, as shown in FIG. 47, a rear side reinforcement material 4703, a filling material 4704, solar cell elements serially connected 4702, a filling material 4704, and a weatherability film 4705 are laminated one after another in that order. By use of a vacuum laminator, the filling material 4704 is molten at a temperature of 150° C. to resin seal the solar cell elements 4702 with the rear side reinforcement material 4703 and the weatherability film 4705. Thus, the solar cell module 4701 is formed. Here, as the rear side reinforcement material 4703, a resin steel plate, timer color GL (0.4 mm thick) manufactured by Daido Kouhan K.K. is used. As the filling material 4704, EVA (ethylene vinyl acetate copolymer) manufactured by Hi Sheet Kogyo K.K. (500 μm) is used, and as the surface film 4705, ETFE (ethylene tetra fluoro-ethylene) manufactured by Dupont Inc. (50 μm) is used. On the resin coated steel plate used as the rear side reinforcement plate 4703, a hole φ 15 is provided in advance.

Figure 48:
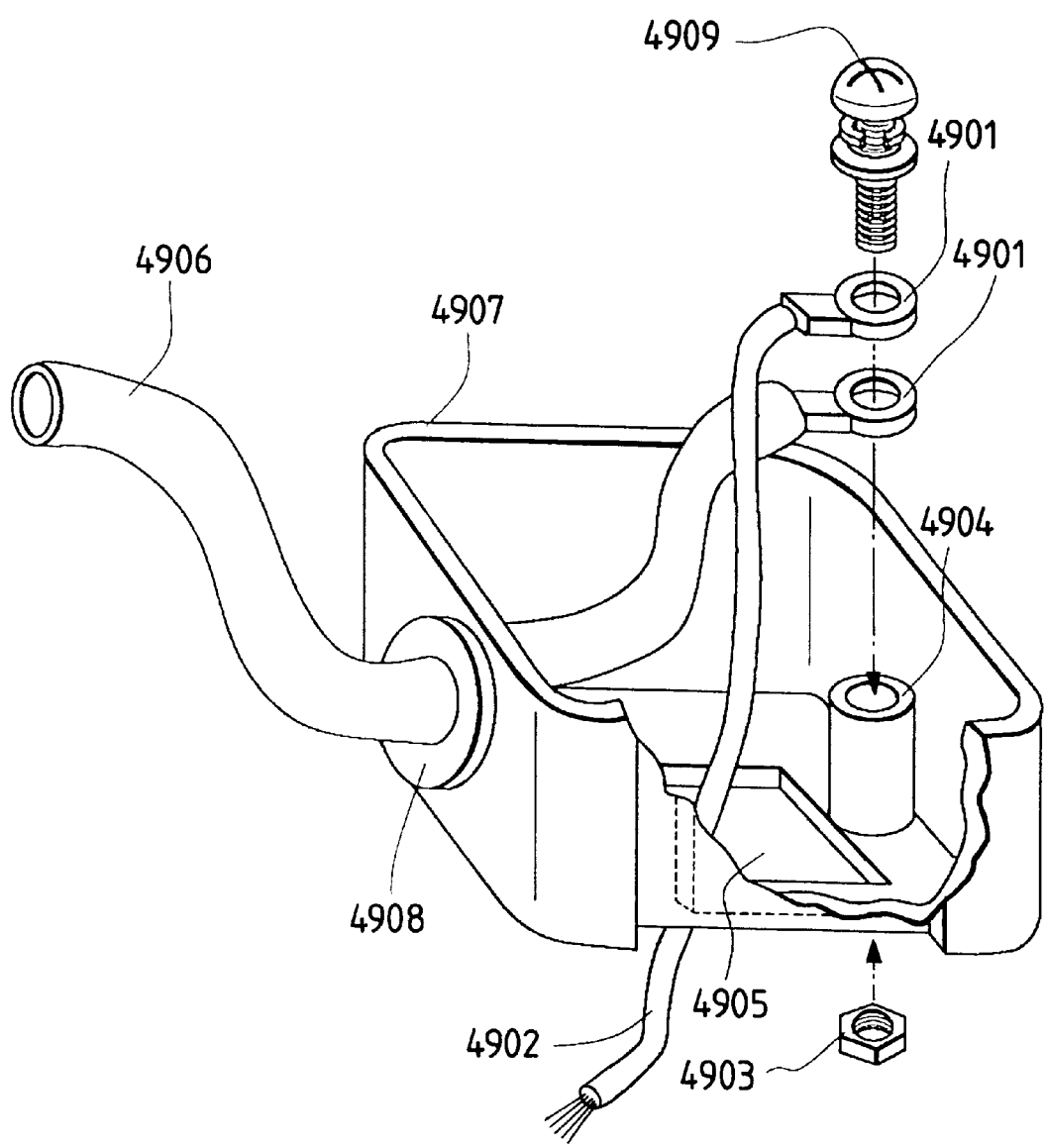

Then, the filling material of the electrode lead-out portion is scooped off by use of a cutter knife or the like to cause the electrode lead-out portion 4602 to be exposed. As shown in FIG. 48, a lead line 4902 (HKIV insulated cable of 0.75 mm² manufactured by Sumitomo Densen K.K.), the insulation coating of which is peeled off approximately 5 mm from one end in advance, and the other end of which is provided with the pressure contact terminal 4901, is soldered on the exposed electrode lead-out portion thus arranged. Then, from the surface of the stand unit 4907 of the hollow structure formed by polycarbonate resin "Eupiron" manufactured by Mitsubishi Gas Kagaku K.K., which faces the solar cell module, a hexagonal nut 4903 is inserted into the interior of the extrusion (terminal stand) 4904. The hole in the interior of the extrusion 4904 is formed in a hexagon to match the shape of the hexagonal nut 4903.

Subsequently, on the bottom face of the stand unit 4907 to face the solar cell module, an appropriate amount of silicone sealant "DC-739RTV" manufactured by Dow Corning Inc. is coated, and then, the stand unit 4907 is compressed to be adhesively bonded to the solar cell module in such a manner that the through hole 4905 on the bottom face of the stand unit 4907 is placed over the terminal lead-out unit 4702 of the solar cell module.

Then, after the silicone sealant is dried for a given period of time, a CV cable 4906 of 2 mm² manufactured by Sumitomo Densen K.K., one end of which is provided with a pressure contact terminal 4901, is inserted to pass the lead line insertion hole 4908 on the side face of the stand unit 4907 to connect between each of solar cell modules. This cable is screw fixed together with the lead line 4902 at the extrusion 4904 by a second screw 4909 and nut 4903, thus connecting the cable 4906 and the lead line 4902. After that, a lid member (not shown) of the hollows structure is adhesively bonded onto the stand unit 4907 by the application of silicone sealant "DC-739RTV" manufactured by Dow Corning, Inc.

In this way, it is possible to form a simple terminal lead-out structure of a space saving screw fixation type at low costs.

Embodiment 17

The present embodiment is fundamental the same as the Embodiment 16, but as shown in FIG. 12, a member 1202 is arranged on the inner side wall of an extrusion to enable a hexagonal nut to stay. In this way, it is made possible to prevent the hexagonal nut to fall off unexpectedly, and then, to form the terminal portion of a terminal lead-out structure.

In accordance with the present embodiment, the terminal lead-out structure of a screw fixation type can be formed more simply.

Embodiment 18

Figure 49:
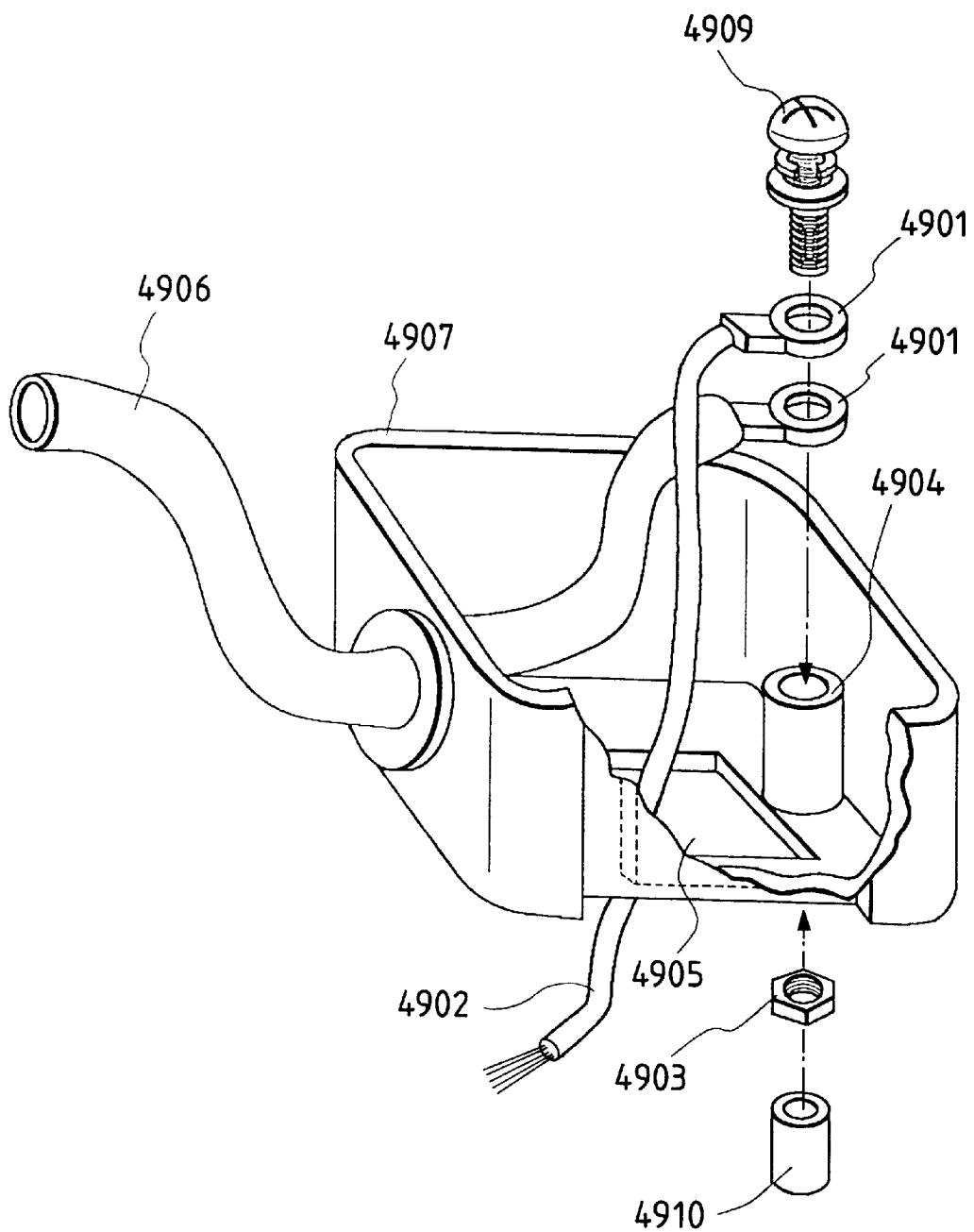

The present embodiment is fundamentally the same as the Embodiment 16 or 17, but as shown in FIG. 49, a hexagonal nut 4903 is inserted into the inner hole of an extrusion 4904, and further, a spacer 4901 is inserted following the hexagonal nut 4903, hence forming the terminal portion of a terminal lead-out structure.

In accordance with the present embodiment, it is possible to form the terminal lead-out structure of a screw fixation type more simply and more assuredly.

Embodiment 19

Figure 50A:
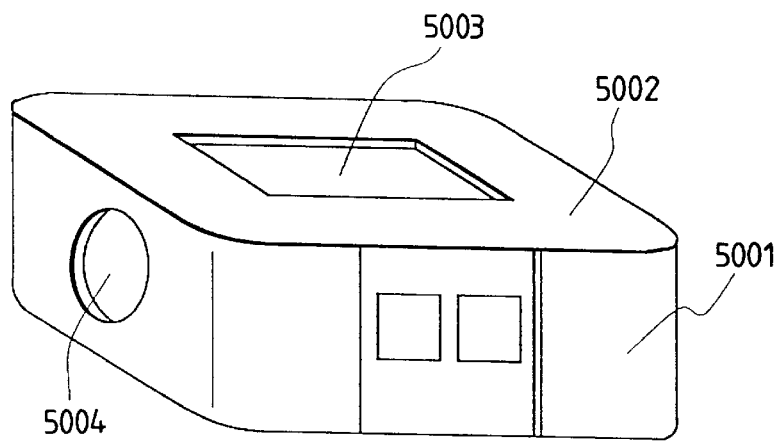
Figure 50B:
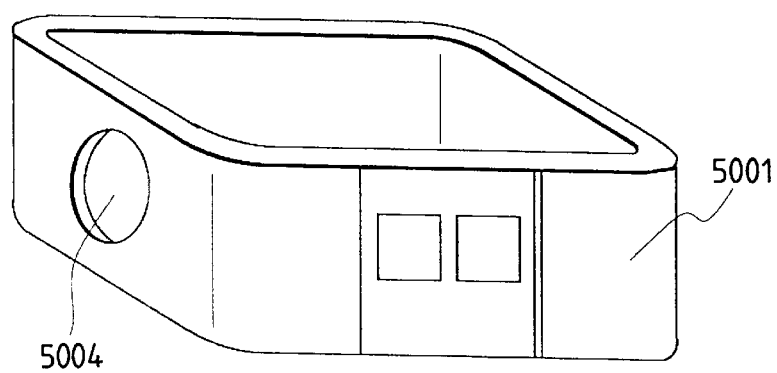
Figure 51:
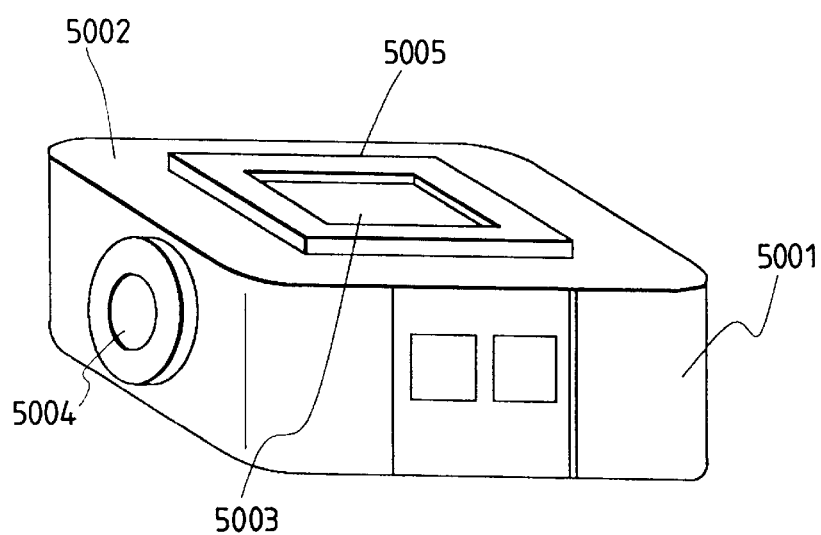
Figure 52A:
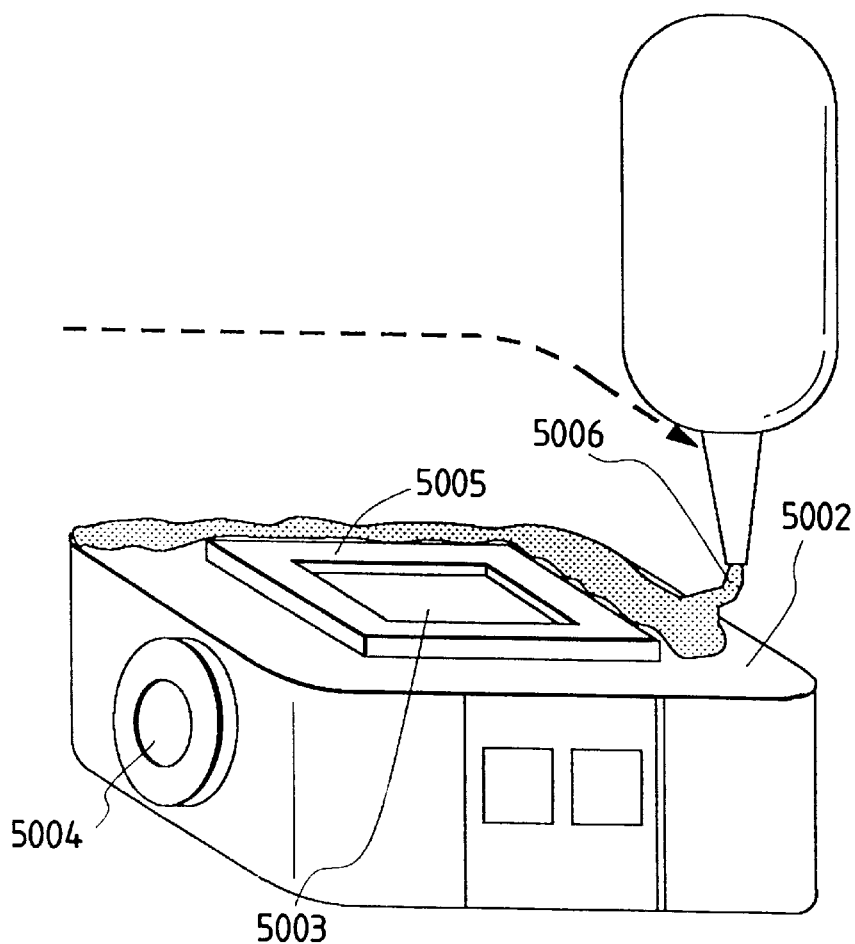
Figure 52B:
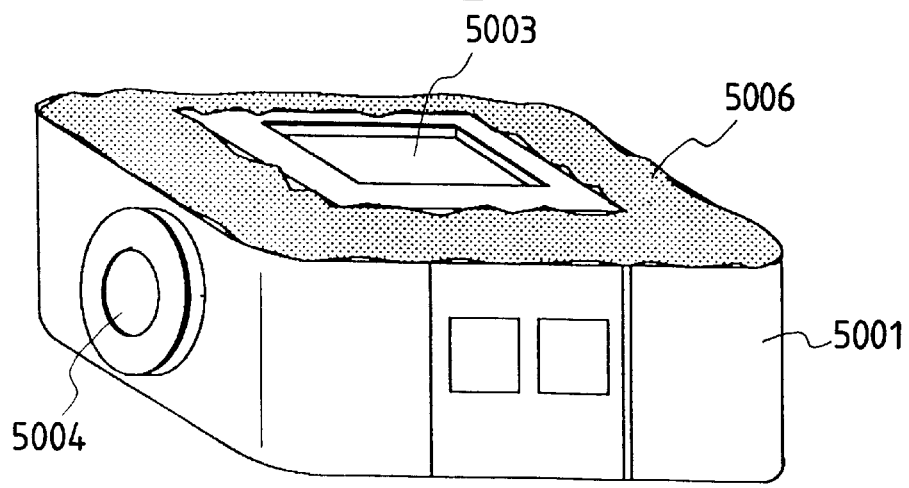
Figure 53:
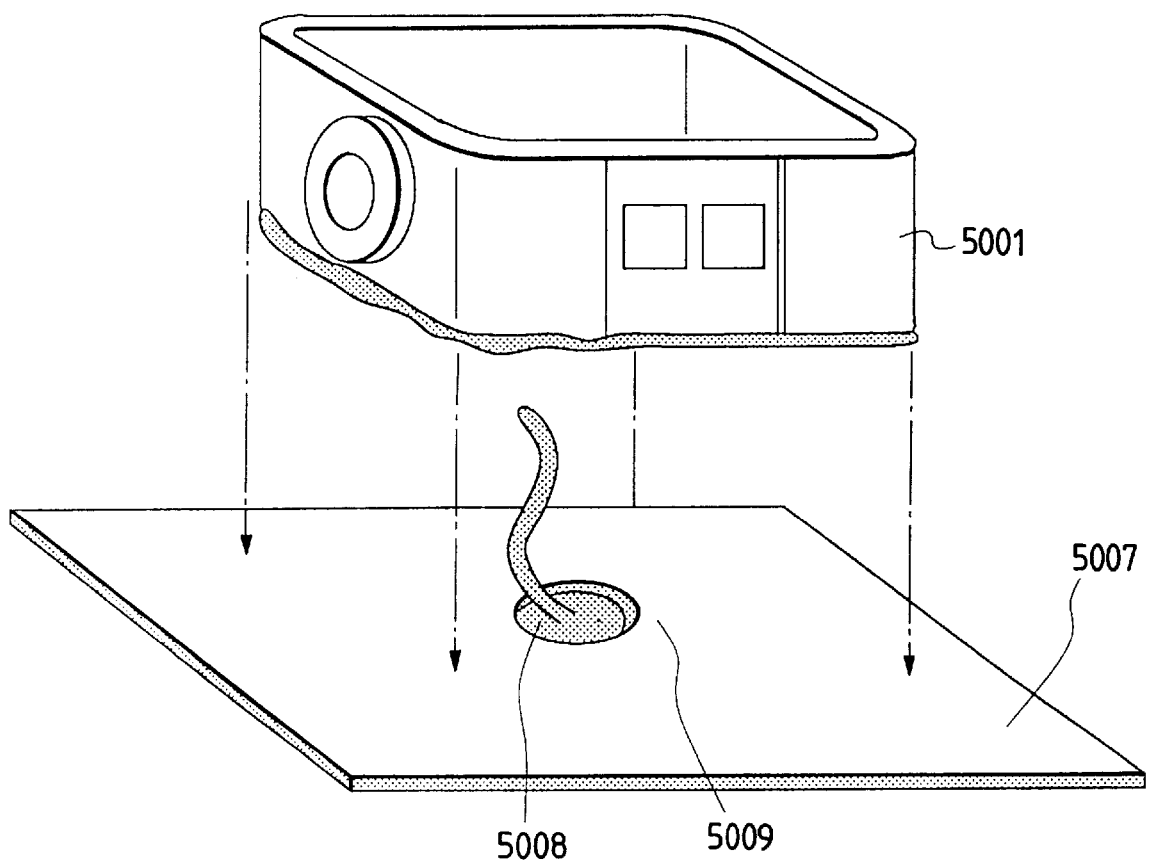
Figure 54:
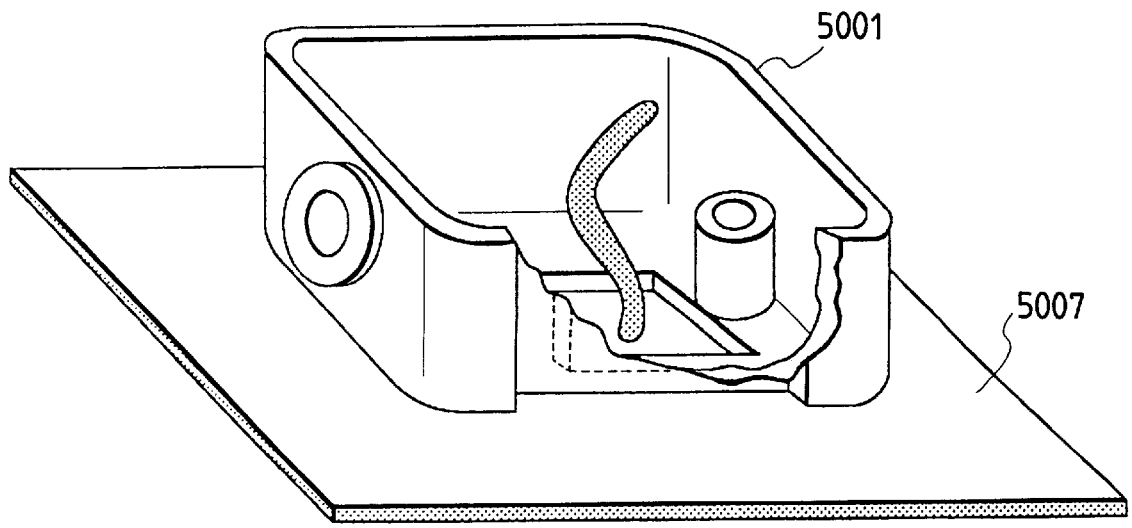
Figure 55:
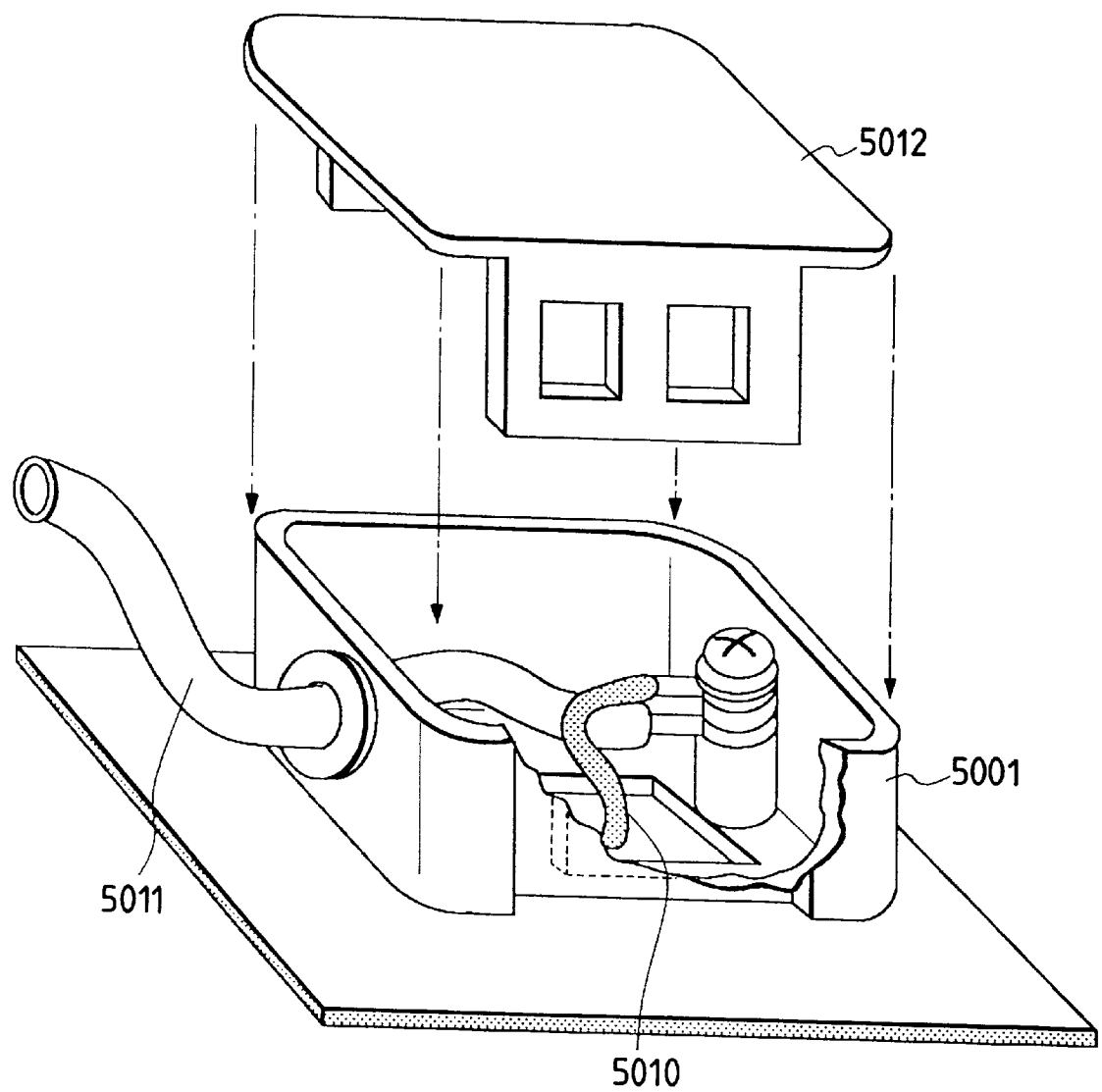

FIGS. 50A and 50B are perspective views which schematically show a terminal lead-out box in accordance with one embodiment of the present invention. FIG. 50A is a view showing the state where the lead-in hole is placed upward. FIG. 50B is a view showing the state where the lead-in hole is placed downward. FIG. 51 is a perspective view which schematically illustrates an adhesion method for a sticky adhesive agent used for the terminal lead-out box represented in FIGS. 50A and 50B. FIGS. 52A and 52B are perspective views showing a coating method for an adhesive agent. Also, FIG. 53 and FIG. 54 are views showing a method for installing a terminal lead-out box. FIG. 55 is a view showing a method for connecting an output lead line after the installation.

In FIG. 50A to FIG. 55, a reference numeral 5001 designates a terminal lead-out box for use of a solar cell. A lead-in hole 5003 is arranged near the central part of the adhesion surface 5002, and on one side, a lead-out hole 5004 is arranged for leading out an output lead-out conductor.

Now, the description will be made of the installation method for the terminal lead-out box 5001. As shown in FIG. 51, a sticky adhesive agent 5005 is at first applied to the adhesion surface near the lead-in hole 5003. As the sticky adhesive agent, a double coated adhesive tape (for example, Nitto's double coated adhesive tape: a special foaming substrate and acrylic resin sticky adhesive agent) is used, which requires no drying process, and which is capable of being bonded in solventless condition just by a pressure exerted at the room temperature.

Then, as shown in FIG. 52, the adhesive agent 5006 is applied to the remaining adhesion surface to surround the lead-in hole 5003 and the sticky adhesive agent 5005. As the adhesive agent 5006, a silicone RTV rubber of one-liquid type (for example, Dow Corning's 739: dealcoholic type) is used, which is provided with a water-proofing of more than JIS-4-Class standard, and demonstrates the adhesive properties by changing the structure of the adhesive agent by the application of a physical action.

In this way, after the sticky adhesive agent 5005 and the adhesive agent 5006 are applied to the adhesion surface 5002, the terminal lead-out box 5001 is compressed to be installed on the adhesion surface 5009 on the circumference of the output lead-out portion 5008 of a solar cell 5007 as shown in FIG. 53 and FIG. 54. At this juncture, the adhesive power of the adhesive agent 5006 is weak until it is hardened, but because of the initial adhesiveness of the sticky adhesion agent 5005 (apparent peel off adhesion being 5 kgf at 90°), it is possible to carry out the installation work on the output lead-out conductor and others immediately after the installation of the terminal lead-out box 5001.

Then, immediately after the installation of the terminal lead-out box, the output lead-out conductor 5011, which is connected to the output lead line 5010 in the terminal lead-out box, is drawn out as shown in FIG. 55.

With this installation method, it is possible to omit drying processes of adhesives, and implement the enhancement of the operativity.

Figure 56:
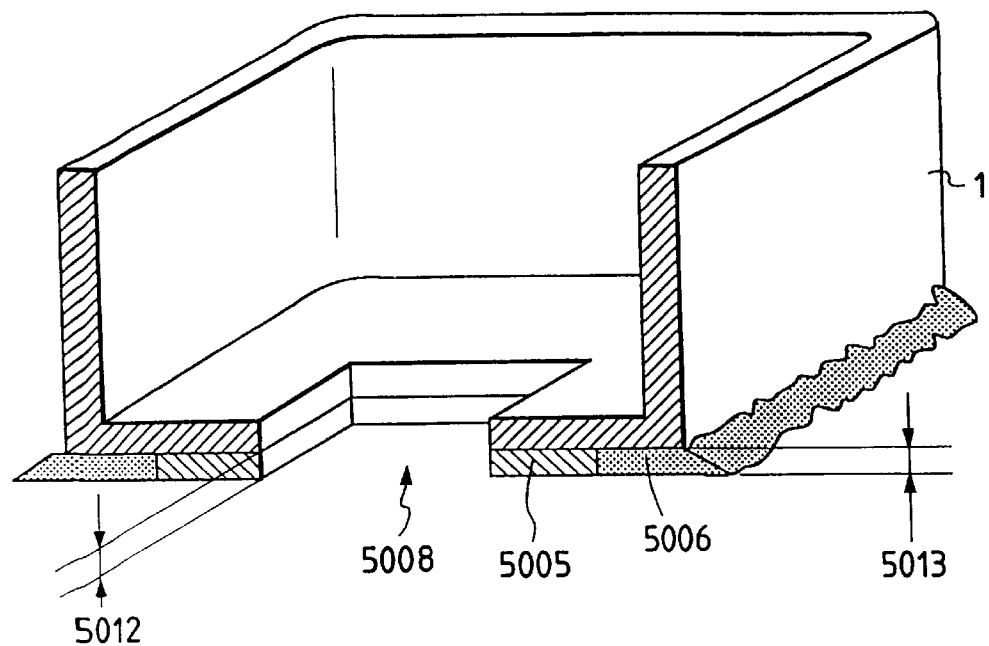

FIG. 56 is a cross-sectional view schematically showing one example of the thicknesses of the sticky adhesive agent 5005 and the adhesive agent 5006. In accordance with the present embodiment, a double coated adhesive tape of 0.35 mm thick is used as the sticky adhesive agent 5005 (for example, Nitto's double coated adhesive tape No. 5713: polyolefine foaming substrate, and acrylic resin sticky adhesive agent).

In FIG. 56, when the terminal lead-out box 5001 is compressed to be installed on the circumference of the output lead-out portion 5008, the distance (thickness of adhesive agent) from the output lead-out portion 5008 to the bottom face of the terminal lead-out box 5001 depends on the thickness 5012 of the sticky adhesive agent (0.35 mm) irrespective of the intensity of pressure to be exerted appropriately. Therefore, the operativity and the operation uniformity are enhanced, and there is no need for any skilled work in this respect.

Figure 57:
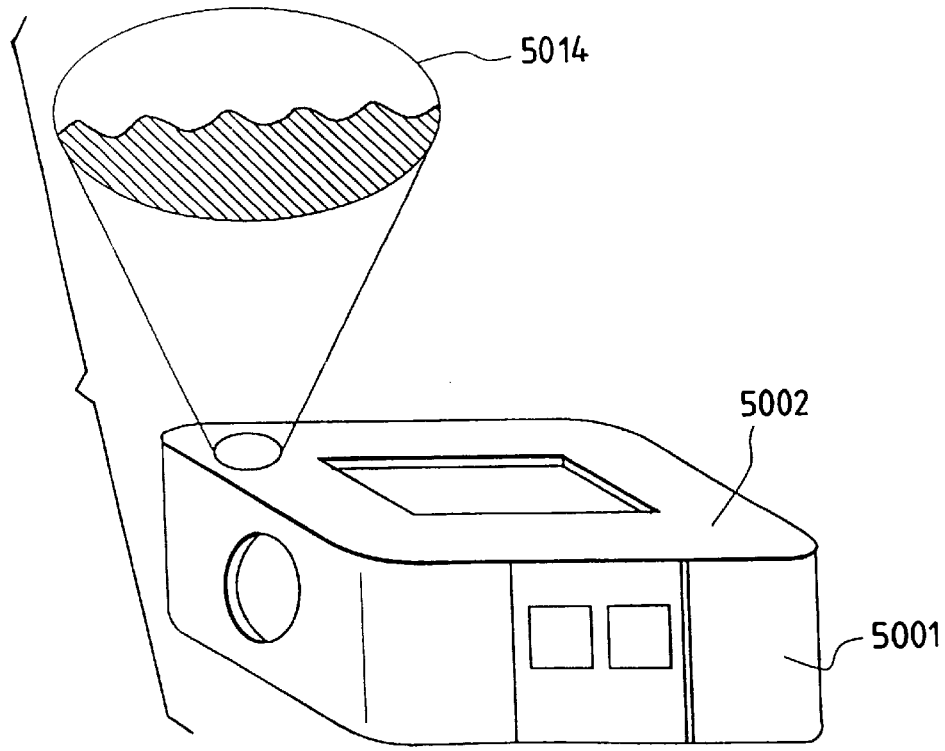

The view in an ellipse (5014) in FIG. 57 is a schematic section showing the surface of an adhesion surface 5002.

As shown in FIG. 57, a structure is arranged to provide fine irregularities (Crimp No.: WN3015 of World Etching Co., Ltd.) for the adhesion surface 5002 of the terminal lead-out box 5001. In this way it is possible to widen the area of adhesion surface and to increase the adhesive strength.

Embodiment 20

Figure 58:
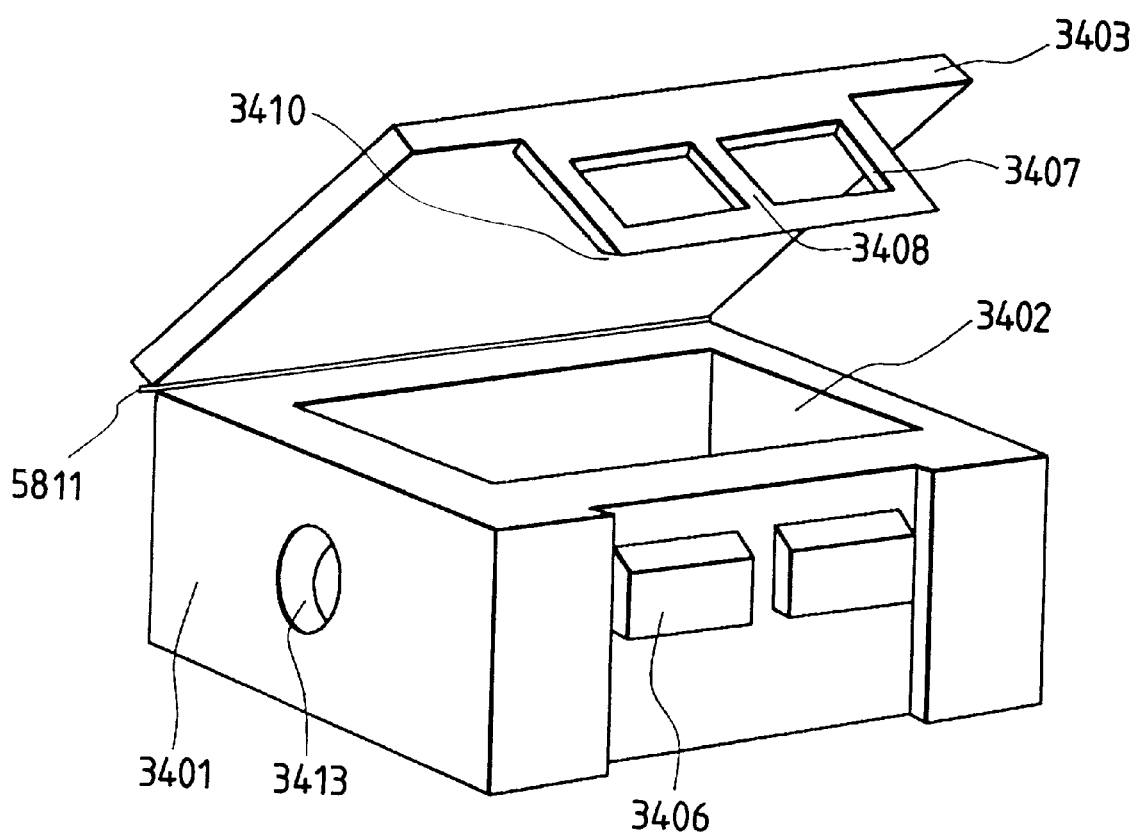

FIG. 58 is a perspective view which shows a terminal lead-out box in accordance with the present embodiment.

In FIG. 58, a reference numeral 3410 designate a terminal lead-out box main body formed by polycarbonate resin by means of a injection molding. The terminal lead-out box main body 3410 is integrally formed by a lid member 3403 through a flexible hinge 5811. On the upper part thereof, an aperture section 3410 is arranged. On the side face opposite to the side where the flexible hinge 5811 is arranged, extrusions 3406 are arranged. Here, a reference numeral 3403 designates the lid member that fits the terminal lead-out box main body 3401. On the surface opposite to the side face where the flexible hinge 5811 is arranged, a flexible hooking portion 3408 is arranged including the recessed portions 3407 that engage with the extrusions 3406. On the inner lower part of the flexible hooking portion 3408, a hooking groove 3410 is arranged to release the engagement between the extrusions 3406 and the recessed portions 3407.

On the bottom face of the terminal lead-out box main body 3401, a lead line lead-in hole (not shown) is arranged for drawing in the lead line drawn out from the electrode lead-out portion of a solar cell module. Further, on one side face of the terminal lead-out box main body 3401, a cable lead-out hole 3413 is arranged to draw out the output cable in the direction opposite to the lead line drawing-in direction.

Now, the description will be made of a method for assembling the terminal lead-out box. After wiring is arranged in the interior of the terminal lead-out box, the lid member 3403 is compressed from above to the terminal lead-out box main body 3401. Then, when a "clicking sound" is heard, for example, the engagement between them is completed.

Here, a method for releasing such engagement will be described. A special tool 3409 is hooked to the hooking groove 3410 as described earlier, and when the "clicking sound" is heard, for example, the engagement between the terminal lead-out box main body 3401 and the lid member 3404 is released.

Since the terminal lead-out box main body 3401 and the lid member 3403 are integrally structured through the flexible hinge 5811, there is no possibility that the lid member 3403 is lost, while it becomes easier to carry out examination and maintenance. The operativity is enhanced accordingly.

Embodiment 21

Figure 59:
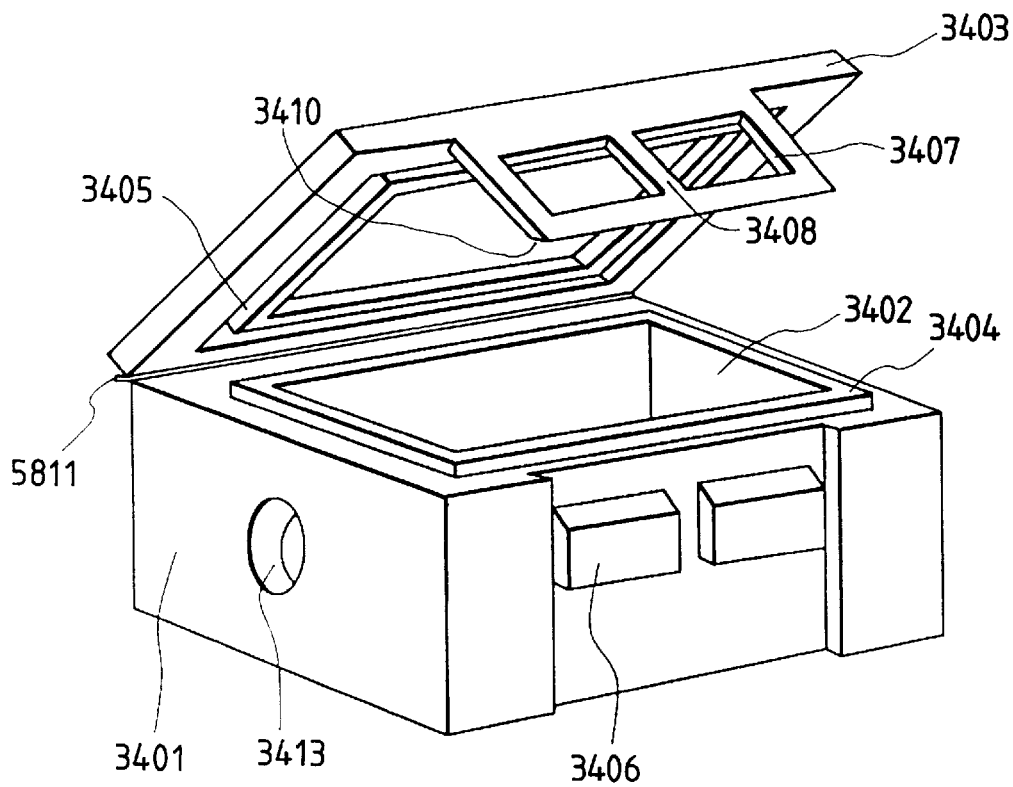

FIG. 59 is a perspective view schematically showing a terminal lead-out box in accordance with the present embodiment.

As shown in FIG. 59, an extrusion 3404 of 1 mm high is arranged on the upper circumferential wall of a terminal lead-out box main body 3401. Further, a recessed groove 3405 of 1 mm deep is arranged on the lower circumferential edge of a lid member 3403 to fit the extrusion 3404 of the terminal lead-out box main body 3401. In this way, it is possible to prevent water from entering the interior of the terminal lead-out box having a lid member for a solar cell module, thus implementing the enhancement of its water-proof capability.

Figure 60:
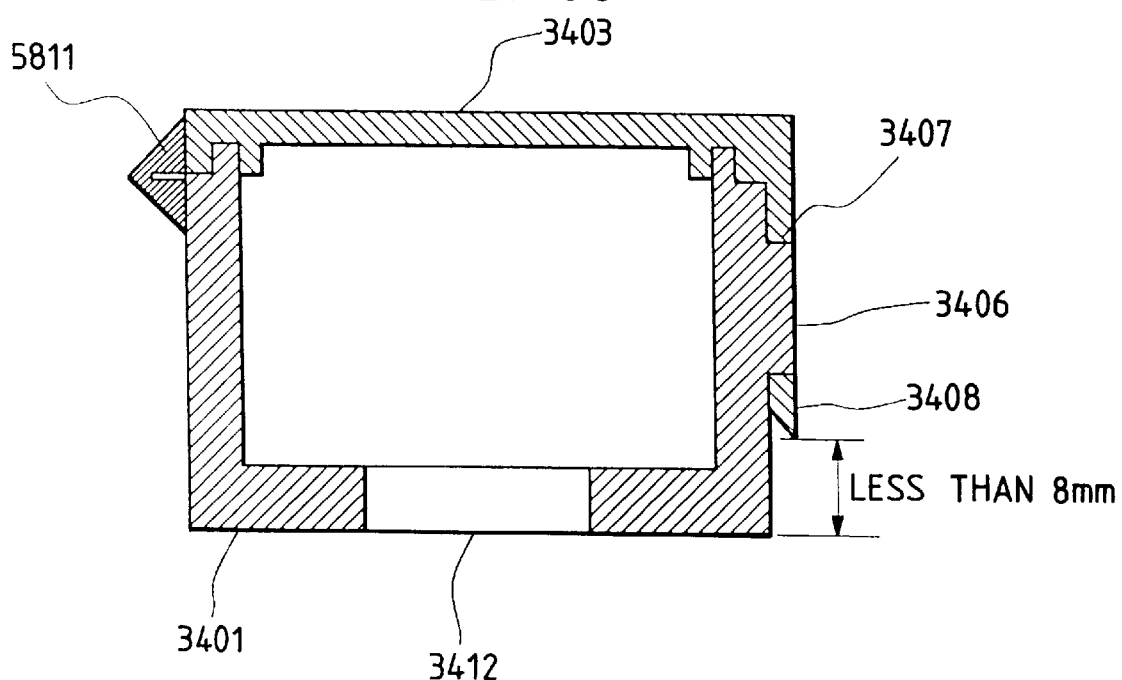

FIG. 60 is a cross-sectional view schematically showing a terminal lead-out box in a state of engagement.

When the terminal lead-out box main body 3401 and the lid member 3403 are fitted together, the distance from the bottom side of the flexible engagement portion 3408 and the bottom face of the terminal lead-out box main body 3401 is less than 8 mm. Therefore, the disengagement is possible only when a special tool is used. In other words, the structure is arranged so that the engagement can be released only when the special tool is hooked to the hooking groove 3410 for releasing the engagement between the extrusion 3406 and the recessed portion 3407. Since the distance from the bottom side of the flexible engagement portion 3408 for the bottom face of the terminal lead-out box main body 3401 is made less than 8 mm, no fingers can be used to release the engagement. Thus, there is no fear that any mischievous conduct is committed, while improving the reliability of the terminal lead-out box of a solar cell module.

Figure 61A:
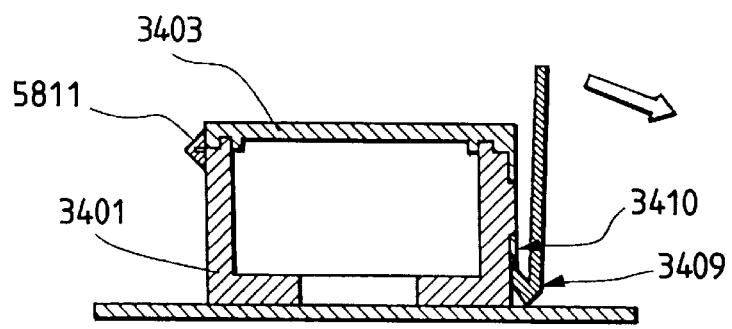
Figure 61B:
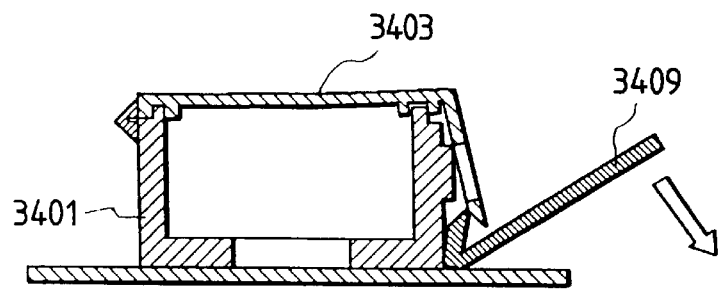
Figure 61C:
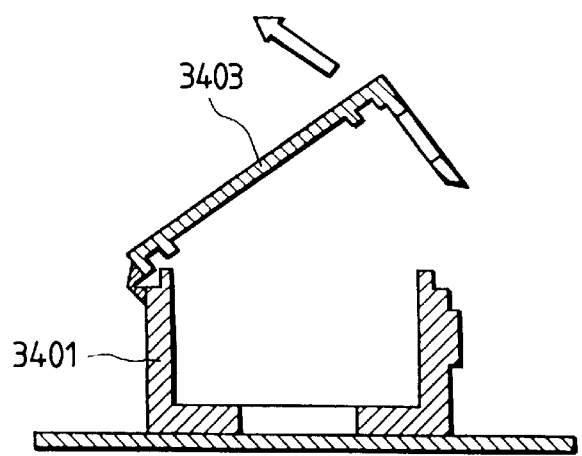

FIGS. 61A to 61C are views which show one example of a method for releasing the engagement of the terminal lead-out box illustrated in FIG. 60.

As shown in FIG. 61A, a special tool 3409 is hooked to a hooking groove 3410, and a force is exerted in the direction indicated by an arrow in FIG. 61A. Then, as shown in FIG. 61B, the engagement is released with a "click sound", for example. With a lid member 3401 being raised as it is, the engagement between the terminal lead-out box main body 3401 and the lid member 3403 is released as shown in FIG. 61C.

Embodiment 22

Figure 64:
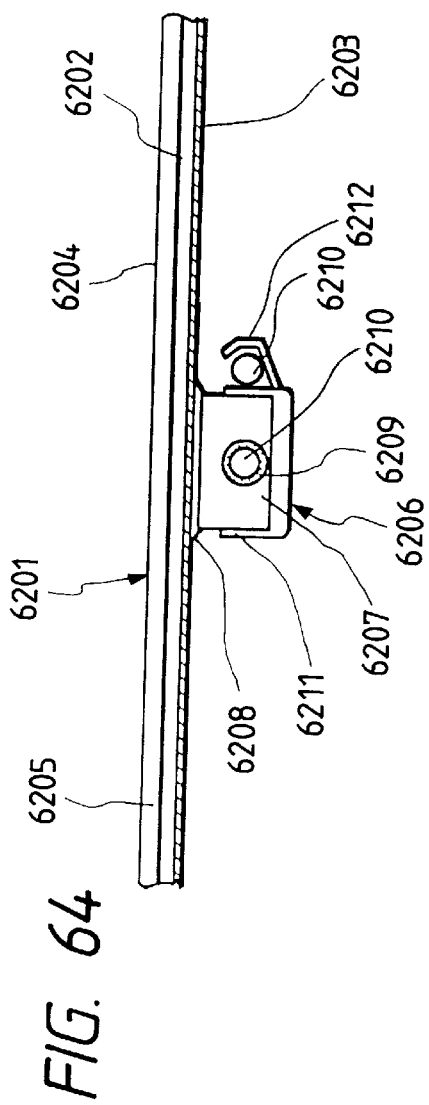

FIG. 62, FIG. 63, and FIG. 64 are schematic perspective views showing a solar cell module, observed from the light receiving surface side, a schematic perspective view showing the solar cell module, observed from its rear side, and a partially sectional view schematically showing the solar cell module, respectively.

The solar cell module is the one integrally formed with a roofing material, which is suitably applicable to the conventional tiled roofing method.

As shown in FIG. 64, a solar cell module 6201 is fabricated by arranging a metal reinforcement plate 6203 on its rear side, and a fluororesin film 6204 on the surface of the light receiving side, and then, the solar cell elements 6202, which are prepared on a stainless steel board by the film formation of amorphous silicon, are resin sealed by means of transparent resin 6205.

With respect to this solar cell module, a base member 6207 is adhesively bonded by the application of silicone adhesive agent 6208 to the terminal lead-out unit provided with a terminal lead-out hole on its metal reinforcement plate 6203. From the base member 6207, a cable 6210 for use of electrical output is drawn out with the inclusion of a bushing 6209. A lid member 6211 engages with the base member 6207. The fitting between the base member 6207 and the lid member 6211 is arranged in a structure that keeps water-proof capability. Further, by means of bushing 6209, the cable lead-out portion is water-proofed.

For the lid member 6211, a hooking member 6212 to be able to hook the cable 6210 is integrally formed with the lid member 6211 when it is formed. As shown in FIG. 63 and FIG. 64, the cable 6210 is hooked by means of this hooking member 6212, thus making it possible to prevent the cable from hanging down and to fix the cable to the solar cell module.

In this way, the hooking member 6212 can be formed integrally with the lid member 6211 when it is formed. As a result, it is possible to omit any manufacturing steps to prepare the hooking members 6212 separately, and also, to omit its fixing operation. This arrangement makes the operation simpler, and contributes to curtailing costs significantly.

After the base member 6207 is fixed by the application of the silicone adhesive agent 6208, it is left intact for 24 hours. Then, after the silicone adhesive agent 6208 is hardened, a folding process is executed by means of a roller making machine to obtain the configuration shown in FIG. 62 and FIG. 63, thus completing the solar cell module. At this juncture, the cable does not hang down. It is fixed to the solar cell module as described above. There is no problem at all in executing the intended process by use of the roller making machine.

Also, when transportation is needed to the cite of installation, there is no fear that the cables are hooked unexpectedly, and a smoother operation is possible.

Embodiment 23

A solar cell module of the present embodiment is an example in which two cable hooking members are arranged for one terminal lead-out box. Here, all the points are the same as those of the Embodiment 22 unless otherwise specified.

Figure 65:
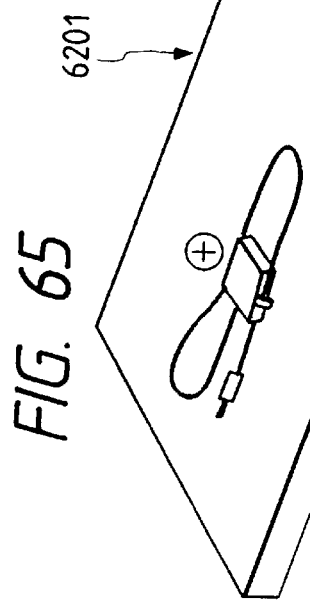
Figure 66:
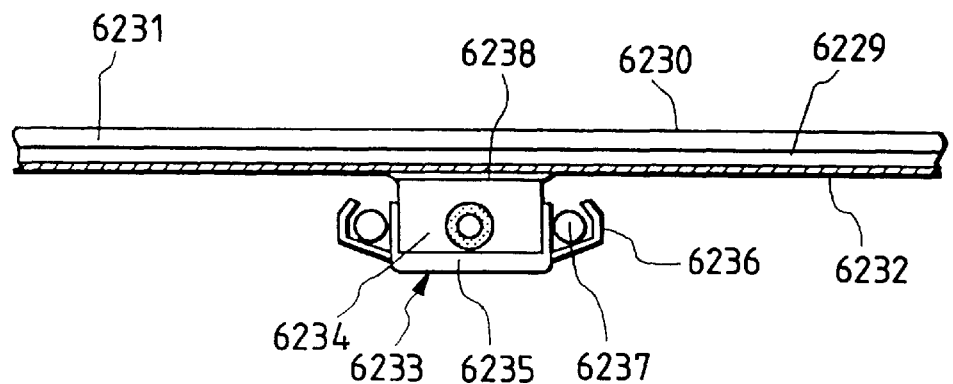

FIG. 65 is a perspective view schematically showing this solar cell module, observed from its rear side. FIG. 66 is a partially sectional view schematically the solar cell module.

In accordance with the present embodiment, a solar cell module is provided by means of an amorphous silicon solar cell 6229 provided with a stainless steel base board as solar cell elements; a non-drawing type fluororesin film 6230 (Dupont's "Tefzel") of 50 $\mu$m thick as the surface film; an EVA 6230 (provided for both the surface and rear side of the solar cell elements, each in the thickness of 900 $\mu$m) as the transparent resin; and a galvanized steel plate 6231 of 0.4 mm thick as the metal reinforcement plate.

Then, as shown in FIG. 65, each terminal lead-out box 6233 is arranged for the positive pole and negative pole on both ends of the rear side of the solar cell module. The terminal lead-out box 6233 comprises a base member 6234 and a lid member 6235, which are resin formed by use of dies. In this case, when the lid member 6235 is formed, a cable hooking member 6236 portion is integrally formed as shown in FIG. 66. In this respect, the adhesive bonding of the base member 6234 and the metal reinforcement plate 6232 is made by the application of a silicone adhesive agent 6238 (Dow Corning's 739), and is hardened by leaving them intact for 24 hours.

A CV cable 6237 is used as the cable for use of electrical output. The length of the cable is 50 cm in consideration of the installation of solar cell modules. A connector is provided for the leading end of each cable. Since the length of the cable is 50 cm, it tends to hand down if a hooking portion is arranged at only one location. However, as in the present embodiment, if it is held by two locations, there is no possibility that the cable hangs down.

In this way, when the folding operation is executed by use of a roller making machine, or any transportation is needed for installation at a cite, there is no problem at all. The folding process and installation work can be carried out favorably.

Embodiment 24

A solar cell module of the present embodiment is an example in which a hooking member is provided for a terminal lead-out box to hook a connector. All the points are the same as the Embodiment 2 unless otherwise specified.

Figure 1:
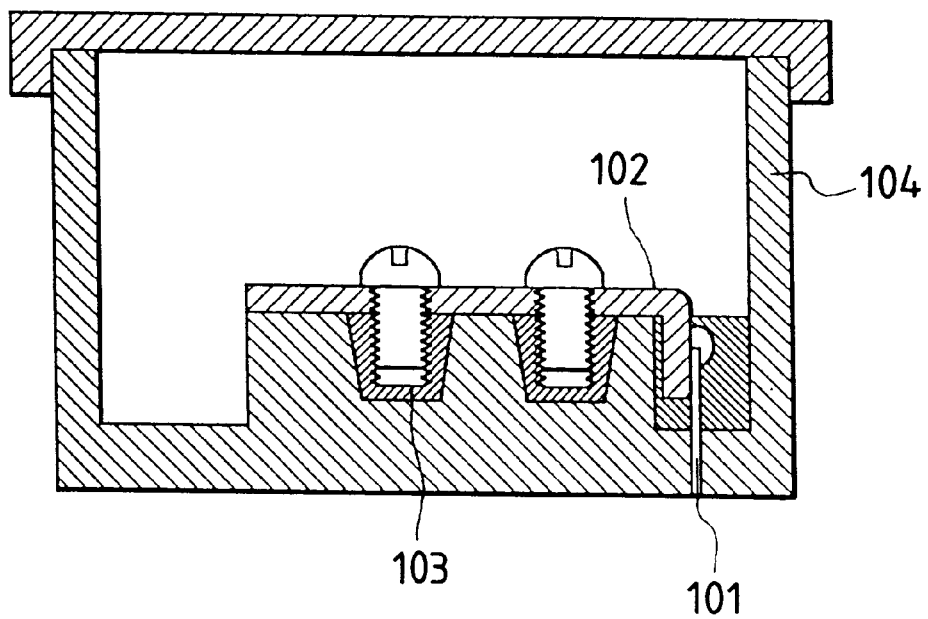
FIG. 1 and FIG. 2 are cross-sectional views schematically illustrating terminal stands.
Figure 2:
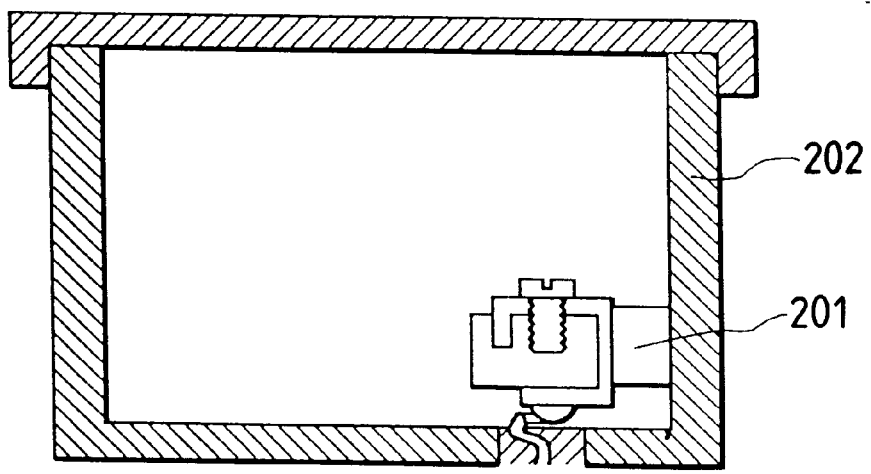
Figure 3:
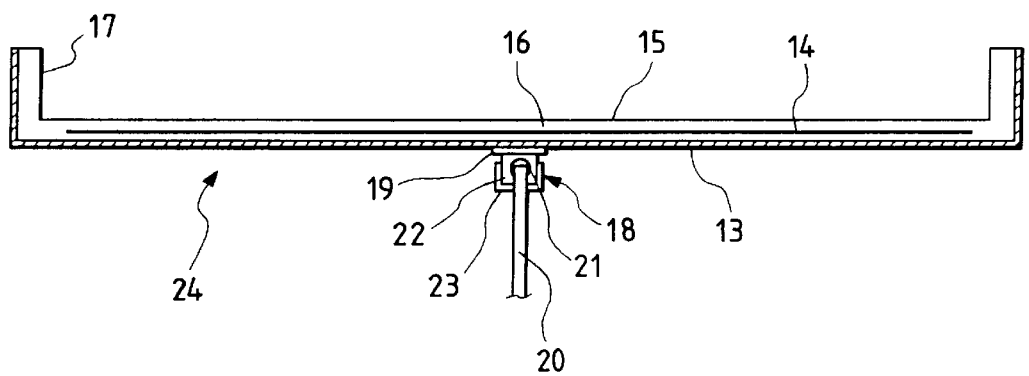
FIG. 3, FIG. 8, FIG. 9, FIG. 47, FIG. 64, and FIG. 66 are cross-sectional views which schematically illustrate one example of a solar-cell apparatus.
Figure 4:
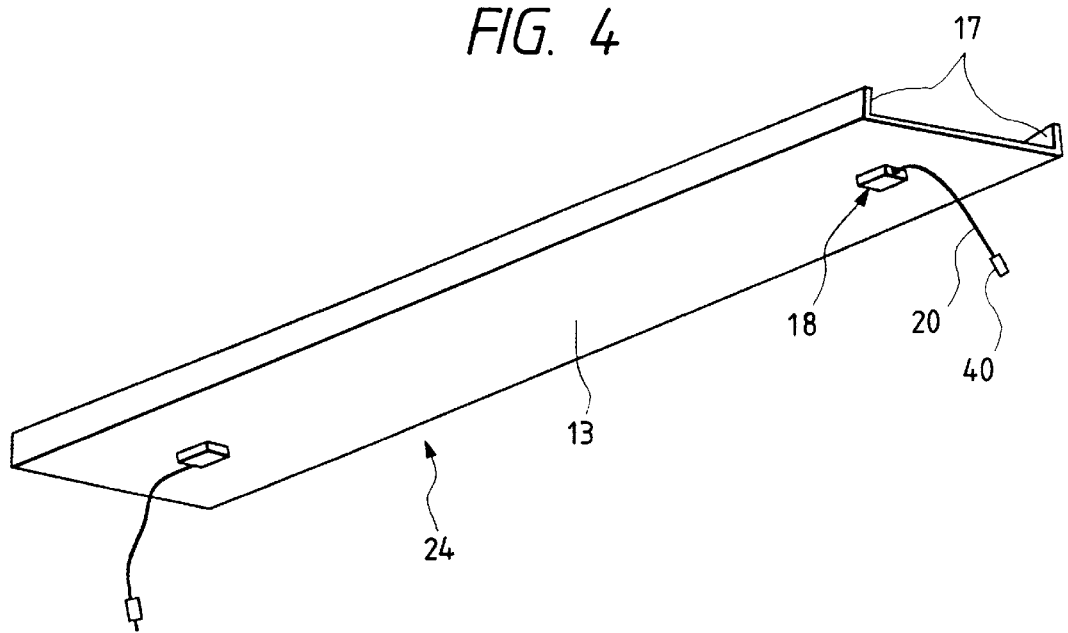
Figure 5:
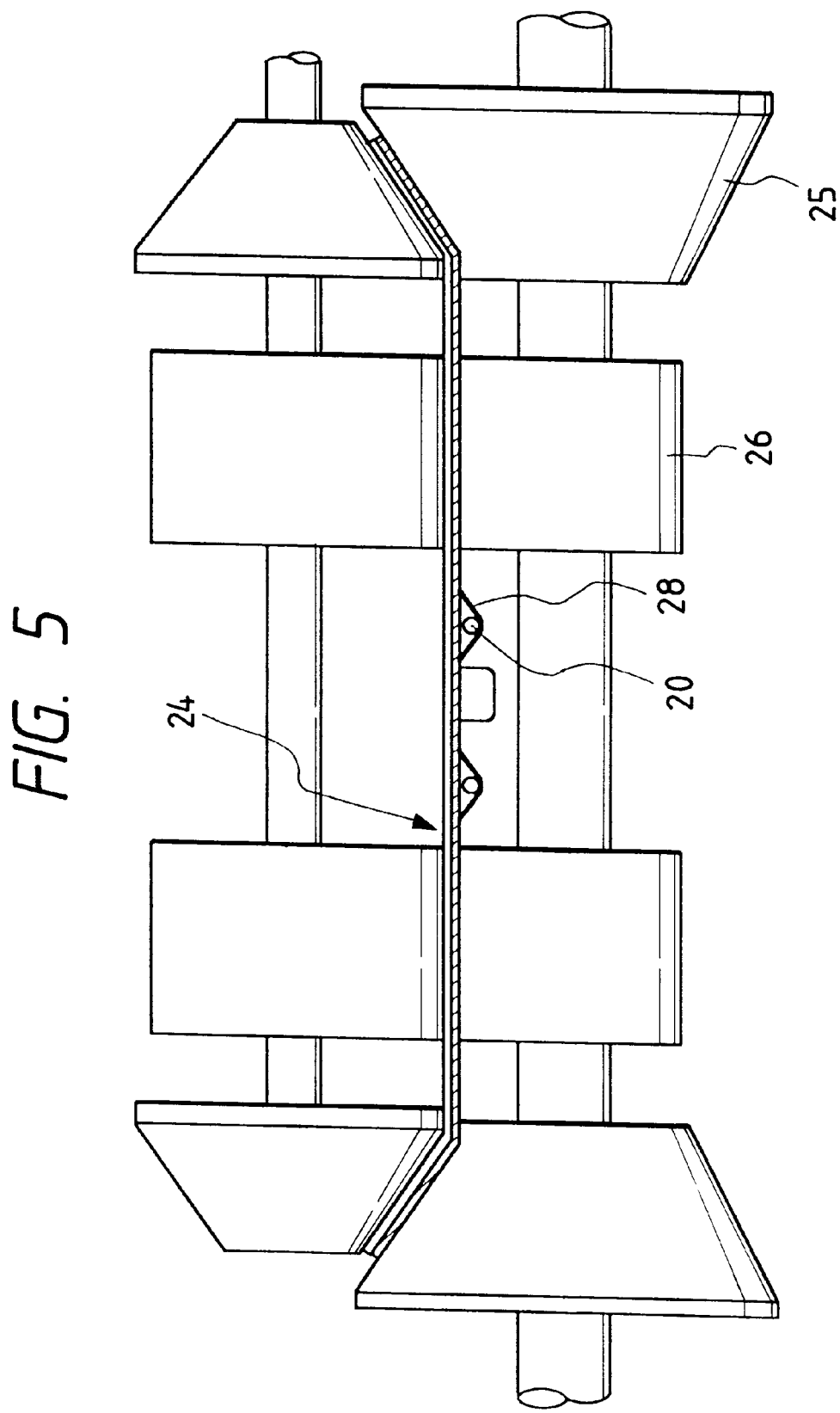
FIG. 5 is a schematically structural view which illustrates a roller making machine.
Figure 6:
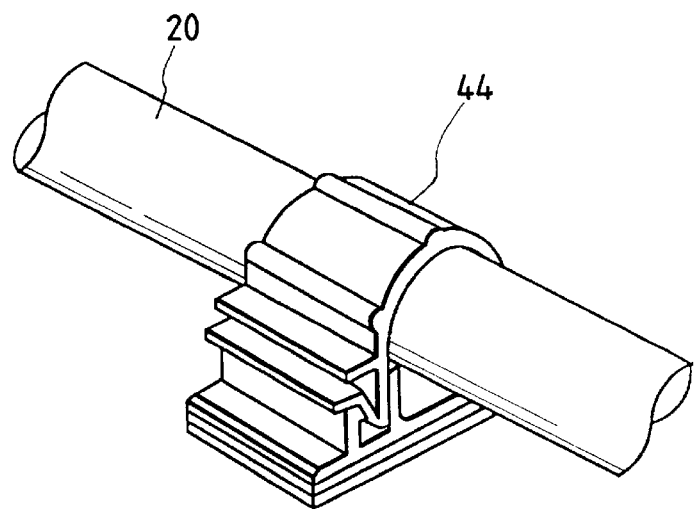
FIG. 6 is a perspective view which schematically illustrates a clamp.
Figure 7:
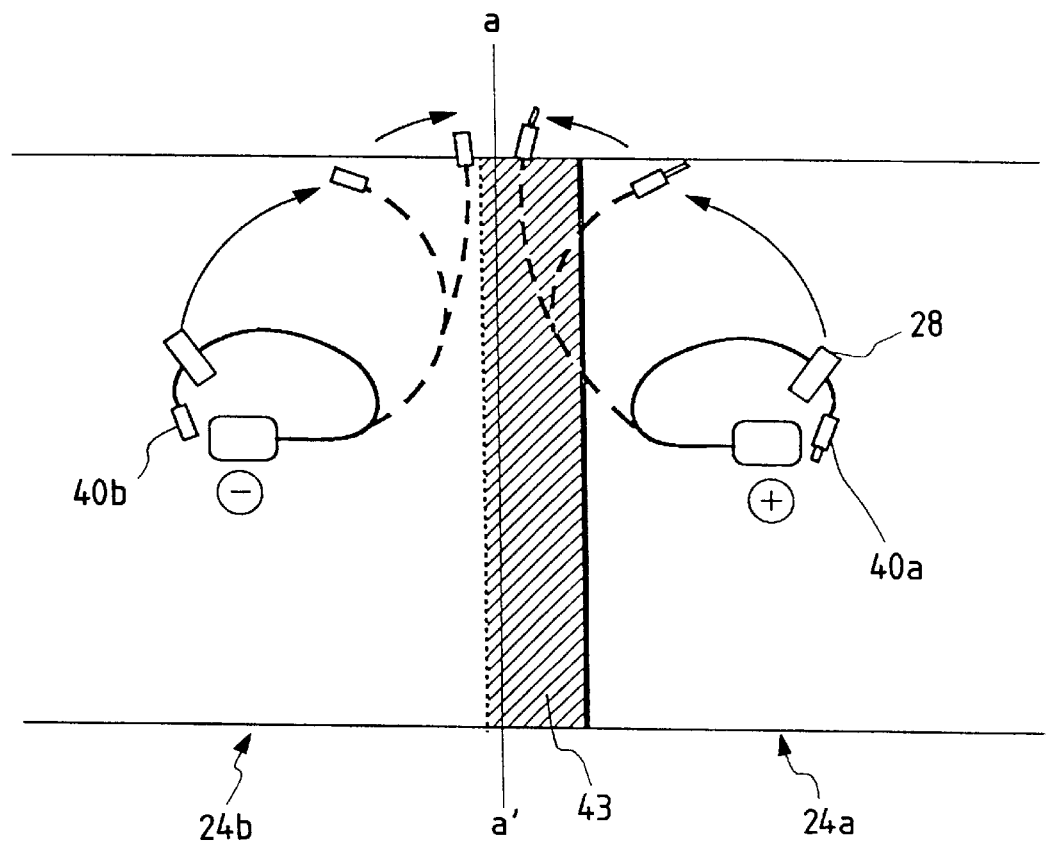
FIG. 7 and FIG. 67 are plan views schematically showing the connector portion of solar-cell apparatuses, observed from the rear side thereof.
Figure 67:
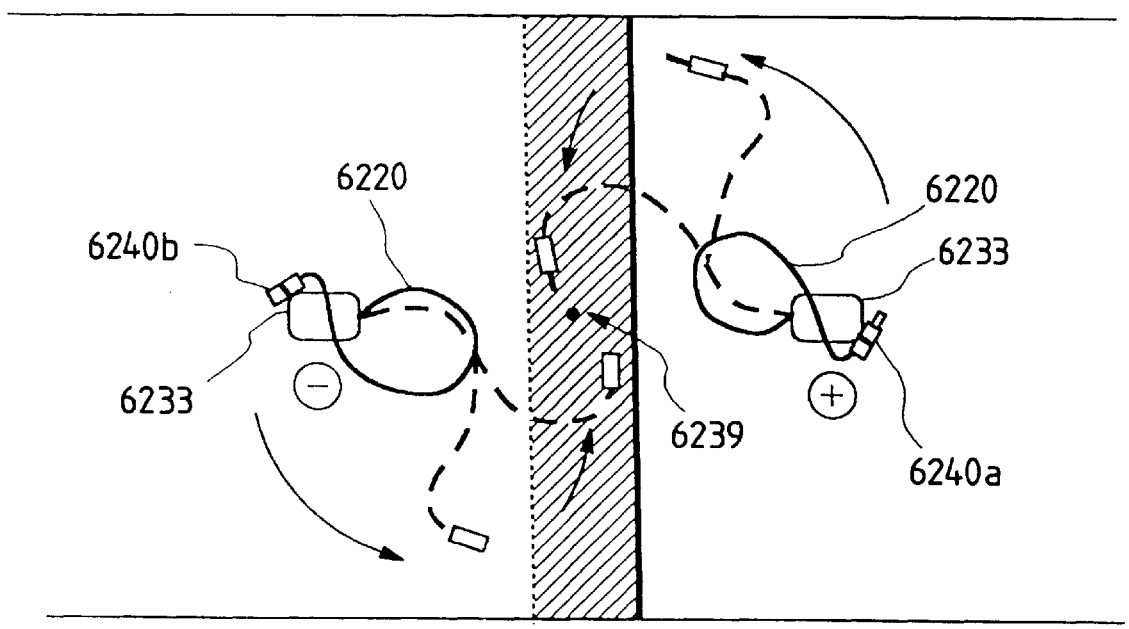

In accordance with the present embodiment, it is intended to materialize an appropriate configuration to fix a cable in consideration of the curling habit described earlier. FIG. 67 is a view showing a solar cell module, observed from its rear side as in FIG. 7.

In accordance with the present embodiment, cables 6220 of the positive and negative poles to be connected are fixed in a state of point symmetry unlike the prior art. Those indicated by broken lines illustrate a part of the processes in which the cables 6220 are deformed. As compared with the conventional technique described earlier, the present embodiment makes it possible to place the connectors 6240a and 6240b to face each other with respect to the central point 6239. Therefore, it is good enough to turn the connectors 6240a and 6240b to turn at an angle of approximately 180°. The connectors can be coupled without requiring any considerable force, thus contributing to reducing the operational load significantly.

With these conditions in view, it is arranged to prepare the mounting members so that as shown in FIG. 67, the cables 6260 and the connectors 6240a and 6240b are fixed only in one posture and configuration when the connectors 6240a and 6240b of positive and negative poles are installed to the terminal lead-out box 6233. In other words, while directional extrusions are provided for the connectors 6240a and 6240b, the mounting members arranged for the terminal lead-out box 6233 are provided with grooves to fit such extrusions of the mounting members. In this way, anyone can handle the cables 6220 and connectors 6240a and 6240b in a desired configuration and fix them as shown in FIG. 67.

In this respect, it is of course possible to reverse the relationship between the extrusion and the recessed portion of the example referred to in the above embodiment.

Now, in accordance with the terminal lead-out structure of a solar cell module, it is possible to anticipate the effects given below.

At first, since a filling agent is filled in the interior of a hollow structure, the water tightness of the terminal lead-out portion on the light receiving surface of a solar cell module is improved, thus enhancing the durability thereof. Also, the discharge treatment is given to the weatherability film on its light receiving side. As a result, the adhesiveness between the weatherability film and the filling agent is improved, hence making it possible to prevent water from entering the electrode lead-out portion, and to enable the hollow structure to be adhesively bonded to the light receiving surface of a solar cell module reliably.

Also, a hollow structure is arranged so that the tension exerted on a lead line is not carried over directly to the electrode lead-out portion. Hence the reliability of the electrode lead-out portion is improved. Particularly when a physical load is exerted on it, its reliability is enhanced.

Further, through holes are arranged for a solar cell module and the outer frame of a hollow structure, and bolts inserted to pass the through holes are tightened by nuts in order to fix the hollow structure to the solar cell module firmly. In this way, the reliability is enhanced still more when a physical load is exerted on the terminal lead-out unit.

Also, a sealing material is used between the outer frame of a hollow structure and a weatherability film in order to enhance the water tightness of the electrode lead-out portion.

Further, by use of a terminal box as a hollow structure, which comprises a base member and a lid member, it is possible to confirm whether or not a filling agent is filled in the fine parts of the interior of the hollow structure. Also, it is possible to hook a lead line to a structure for suppressing the tension of the lead line. Further, with a wider aperture, the time required for drying the filling agent can be shortened to improve the assembling operativity of the terminal lead-out unit of a solar cell module.

Also, with the provision of a supporting unit for a base member to prevent a lead line from being pulled in the vertical direction, the upper lid member is not displaced due to the physical load exerted on it. As a result, the reliability of the terminal lead-out unit is enhanced still more when a physical load is exerted on the solar cell model in the vertical direction.

Also, a structure is arranged to provide an extrusion at least on a part of the surface of a hollow structure to face a solar cell module for the insulating protection of an electrode lead-out portion of the solar cell module. In this way, the operativity is improved when the hollow structure is adhesively bonded to the solar cell module. The adhesive agent can be applied in a desired thickness to obtain stable properties. The adhesive reliability of the hollow structure is improved. The reliability of the solar cell module itself is also improved accordingly.

Also, with the hollow structure comprising the base member and the upper lid member, it is possible to easily confirm the state of insulating protection of the electrode lead-out portion, and to enhance the reliability of the terminal lead-out unit of a solar cell module still more.

Further, a series of extrusions are arranged on the surface of a hollow structure to face a solar cell module to surround an electrode lead-out hole on such surface for the insulating protection of the electrode lead-out portion of the solar cell module. Then, a structure is arranged so that the outer surface from the outer edge of the extrusions is adhesively bonded by the application of an adhesive agent, and that the inner side from inner edge of the extrusions is filled in by means of a filling agent. In this way, the operativity is improved when the hollow structure is adhesively bonded to the rear side of the solar cell module. The thickness of the adhesive agent can be made as desired to obtain stable properties. The adhesive reliability of the hollow structure is improved, and further, the reliability of the terminal lead-out unit of the solar cell module is enhanced.

Further, an extrusion is arranged on the outer circumferential edge of the surface of a hollow structure to face a solar cell module for the insulating protection of an electrode lead-out portion of the solar cell module, thus making it possible to improve the operativity when the hollow structure is adhesively bonded to the solar cell module. The thickness of the adhesive agent can be made as desired to obtain stable properties. At the same time, it is possible to prevent the adhesive agent from overflowing by the provision of the extrusion when an adhesive bonding is executed or to wipe off the overflowing adhesive agent easily, thus making the outer appearance of the solar cell module beautiful. Also, there is no possibility that the overflowing adhesive agent is exposed to the sunlight. As a result, the adhesive reliability of the hollow structure is improved, and further, the reliability of the solar cell module itself is enhanced.

Further, the hollow structure comprises the base member and the upper lid member, thus making it possible to confirm the state of insulating protection easily. Accordingly, the reliability of the terminal lead-out unit of the solar cell module is enhanced still more.

Also, the extrusion and the solar cell module is adhesively bonded by means of a double coated adhesive tape. The overflowing of adhesive agent can be prevented, thus improving the adhesive operativity.

Also, a filling sealant whose viscosity is less than 1,000 poise is used for the adhesive bonding of the hollow structure and the solar cell module. As a result, the filling sealant is filled in all the parts of the interior of the hollow structure to improve the adhesive reliability.

In addition, extrusions are arranged on both sides of the terminal lead-out box adjacent to one side thereof, while the lid member is provided with a flexible hooking portion including recessed portions to match the extrusions. In this way, there is no need for any other elements than the terminal lead-out box main body and the lid member to fit them together. Also, this fitting is possible just by one touch action. Therefore, the costs of materials, such as screws and others, can be reduced, and the fitting operativity is improved at the same time.

Also, a special tool is needed for releasing the engagement between the main body and the lid member. As a result, there is no fear that any mischievous conduct is committed, yet it is possible to release such engagement just by one action. Hence, both the reliability and the operativity are enhanced.

Further, on the aspect of water-proofing, there is no need for a rubber packing or any other water-proofing elements to be included between the terminal lead-out box main body and the lid member. The aging problem of such water-proofing material itself is not encountered. The costs can be reduced and at the same time, the reliability is enhanced accordingly.

In this way, it is possible to provide the highly reliable terminal lead-out structure of a solar cell module at low costs with a good operativity.

Further, it is possible to provide an inexpensive terminal lead-out structure of a simple and space-saving screw fixation type by screw fixing a lead line for use of leading out and an output lead line on a terminal stand by means of a first screw, which is inserted into a hole of the terminal stand extruded from the inner wall of a hollow structure, and a second screw, which is screw fitted with the first screw through an aperture of the terminal stand.

Also, on the side wall of the hole of the terminal stand, into which the first screw is inserted, an extrusion is provided to hook the first screw or a spacer is inserted to prevent the first screw from falling off or prevent it from being displaced. In this way, the first screw is inserted into such hole more reliably. Particularly when the output lead line (external lead line) drawn out from the hollow structure is replaced, it is possible to prevent the first screw from being displaced, and to enhance the reliability accordingly.

Also, by arranging the spacer in a recessed configuration or making it cylindrical, it is possible to relax the stress exerted on the hollow structure. Also, it is possible to secure a space for the second screw, which is a male screw, to be inserted into the spacer when the screw fixation is conducted. In this way, the first screw, which is a female screw, can be inserted into a desired position, hence making it possible to enhance the operativity accordingly.

Further, by use of a screw fixture member comprising a first screw, a second screw, and a washer, it is possible to connect a lead line for use of leading out (inner lead line) and output lead line (external lead line) more assuredly.

Also, as a washer to be adopted, a spring washer, a toothed washer, or the like is used, thus making it possible to prevent the screw fixation from being untightened, and also, to prevent any increase of contact resistance, and defective contact as well.

Also, by giving a surface treatment, such as chrome plating, to the first and second screws, and washer, it is possible to improve the corrosion inhibition and weather-ability of each component, and to enhance the reliability of the screw fixation terminal unit.

Then, by giving a pressure contact terminal treatment as a terminal process with respect to each of the lead lines on the contacting side of the lead line for use of leading out and that of the output lead line, it is possible to enhance the contact reliability between the lead lines, as well as the contact reliability of each of the lead lines with respect to the screw fixation terminal unit.

Further, for the pressure contact terminal treatment, solder flows in the location where the axial center of each lead line is in contact under pressure, thus avoiding any increase in the contact resistance of the pressure contact terminal unit, and preventing the output of a solar cell module from being lowered.

In addition, there is no need for any drying process with respect to a part of the adhesive surface of a terminal lead-out box. By use of a sticky adhesive agent, the adhesive bonding is conducted just by means of compression at the room temperature in a solventless condition. Therefore, immediately after the installation of the terminal lead-out box, it is possible to carry out the installation of the output lead-out conductor and others. As a result, any drying process of adhesive agent can be omitted, thus improving the operativity. Then, using an adhesive agent whose structure changes by physical action or chemical reaction to demonstrate its adhesive properties for the remaining adhesive surface, it is possible to obtain a sufficient adhesive power for a practical use once the adhesive agent is dried.

Also, as the adhesive agent to be adopted, an adhesive agent whose water-proofing standard is more than JIS-4-Class is used, and then, the adhesive bonding is conducted to surround the output lead line lead-in hole and the sticky adhesive agent. As a result, it is possible to provide a terminal lead-out box having an excellent water-proof capability, insulation, and reliability.

Also, since the sticky adhesive agent is surrounded by an adhesive agent whose water-proof capability is excellent, it is unnecessary for the sticky adhesive agent itself to be provided with any water-proof capability. Therefore, an inexpensive sticky adhesive agent can be adopted for the purpose.

Also, when a terminal lead-out box is adhesively bonded to the output lead-out portion by means of compression, the distance from the output lead-out portion to the bottom face of the terminal lead-out box depends on the thickness of the sticky adhesive agent irrespective of the intensity of pressure to be exerted appropriately. Therefore, the operativity and the uniformity of operation are enhanced, requiring no skilled work.

Further, the structure is arranged to provide fine irregularities on the adhesive surface of the terminal lead-out box, thus making it possible to widen the area of the adhesive surface to increase the adhesive strength.

Hence, it is possible to provide a highly reliable terminal lead-out box for use of a solar cell having a good operativity and a good uniformity of operation at low costs of operation, as well as an installation method therefor.

Also, by arranging a structure so that a terminal lead-out box and a lid member are integrally formed through a flexible hinge, there is no possibility that only the lid members are lost. Accordingly, the operativity is enhanced.

Also, extrusions are provided for the terminal lead-out box main body on the side opposite to the side where the hinge is arranged, while the lid member is provided with a flexible hooking portion including recessed portions to engage with the extrusions. As a result, there is no need for the provision of any elements other than the terminal lead-out main body and the lid member to fit them together. Also, one touch action enables the fitting, making it possible to reduce the costs of materials, such as screws, and at the same time, to improve the operativity.

Also, a disengagement tool is needed for releasing the fitting. Hence, there is no fear that any mischievous conduct is committed, yet the disengagement is possible by the application of one action, thus improving both the reliability and operativity significantly.

Further, regarding the water-proofing aspect, there is no inclusion of rubber packing or any other water-proofing materials between the terminal lead-out box main body and the lid member. Hence, there is no problem of aging or the like with respect to the water-proofing material itself. Accordingly, the costs can be reduced, while the reliability is enhanced.

In accordance with the present invention, it is possible to provide a highly reliable terminal lead-out box of a solar cell module having a good operativity and reliability at lower costs.

In addition, a terminal lead-out box of the present invention is provided with a fixing member to fix a cable for use of electrical output, hence making it possible to prevent the cable from hanging from the rear side of the solar cell module without using any tape. Hence, at the time of post processing of a solar cell module or at the time of transporting it to a cite of installation, it is possible to eliminate the problem that the cables appear themselves an obstacle in handling solar cell modules.

Also, connectors are installed in only one mode, thus enabling anyone to fix cables in a desired configuration. Therefore, even in a state where cables have lost its flexibility due to a low temperature or the like, the connectors can be fixed easily.

What is claimed is:

1. A terminal lead-out structure, comprising:
   a lead line drawn out from an electrode lead out portion on a light receiving surface side of a solar cell module provided with a weatherability film treated with electrical discharge at least on a part of said light receiving surface as a surface coating material; and
   a hollow structure providing insulating protection of said electrode lead-out portion, wherein
      an interior of said hollow structure is filled with a filler agent.

2. A terminal lead-out structure according to claim 1, further comprising a structure so as not to carry over tension of said lead line directly to said electrode lead-out portion.

3. A terminal lead-out structure according to claim 1, wherein said solar cell module and an outer frame of said hollow structure have a plurality of through holes to fix said hollow structure to said solar cell module.

4. A terminal lead-out structure according to claim 3, wherein bolts standing by means of a plate are inserted to pass the through holes and tightened by nuts to fix said hollow structure to said solar cell module.

5. A terminal lead-out structure according to claim 3, wherein a sealing material is arranged between said outer frame of said hollow structure and said weatherability film.

6. A terminal lead-out structure according to claim 1, wherein said hollow structure comprises a stand unit and an upper lid member.

7. A terminal lead-out structure according to claim 6, wherein said stand unit is provided with a supporting portion to prevent said lead line from being pulled in a direction perpendicular to said light receiving surface of said solar cell module.

8. A terminal lead-out structure according to claim 1, wherein said hollow structure includes an opening for leading out a terminal and has a projection disposed adjacent to the opening and projecting into the interior of said hollow structure between said electrode lead-out portion and the opening.

9. A solar-cell apparatus, comprising:
   a solar cell element;
   a filling material in contact with said solar cell element;
   a weatherability film, having a light-receiving surface treated with an electrical discharge on at least part of said surface;
   a substrate on which said solar cell element and said filling material are provided and sandwiched between said weatherability film and said substrate;
   an electrode lead-out portion having a lead line and disposed on said light receiving surface; and
   a hollow structure arranged on the treated light-receiving surface and providing insulating protection for said electrode lead-out portion, wherein
      an interior of said hollow structure is filled with a filler agent.

10. A solar-cell apparatus according to claim 9, further comprising a structure so as not to carry over tension of said lead line directly to said electrode lead-out portion.

11. A solar-cell apparatus according to claim 9, wherein through holes are formed on said substrate and an outer frame of said hollow structure to fix said hollow structure on said weatherability film.

12. A solar-cell apparatus according to claim 11, wherein bolts standing by means of a plate are inserted to pass said through holes and tightened by nuts to fix said hollow structure on said weatherability film.

13. A solar-cell apparatus according to claim 11, wherein a sealing material is arranged between said outer frame of said hollow structure and said weatherability film.

14. A solar-cell apparatus according to claim 9, wherein said hollow structure comprises a stand unit and an upper lid member.

15. A solar-cell apparatus according to claim 14, wherein said stand unit is provided with a supporting portion to prevent said lead line from being pulled in a direction perpendicular to said light receiving surface.

16. A solar-cell apparatus according to claim 9, wherein said hollow structure includes an opening for leading out a terminal and has a projection disposed adjacent to the opening and projecting into the interior of said hollow structure between said electrode lead-out portion and the opening.

17. A solar-cell apparatus, comprising:
a solar-cell element;
a filling material in contact with said solar cell element;
a weatherability film;
a reinforcement material on which said solar-cell element is provided, with said weatherability film provided on a light-receiving side of said solar cell element;
an electrode lead-out portion having a lead line; and
a hollow structure arranged on at least one of said weatherability film and a rear side of said reinforcement material, wherein
said hollow structure is provided with an extrusion at least on a part thereof to be bonded by the application of an adhesive agent.

18. A solar-cell apparatus according to claim 17, wherein said hollow structure comprises a stand unit and a lid member.

19. A solar-cell apparatus, comprising:
a solar-cell element;
a filling material in contact with said solar cell element;
a weatherability film;
a reinforcement material on which said solar-cell element is provided, with said weatherability film provided on a light-receiving side of said solar cell element;
an electrode lead-out portion having a lead line; and
a hollow structure arranged on at least one of said weatherability film and a rear side of said reinforcement material, wherein
said hollow structure is provided with a series of extrusions on a first surface thereof to surround an electrode lead-out hole, and a through hole on a second surface other than said first surface to fill in a filling agent in said hollow structure, and
an outer surface from an outer edge of said extrusions being bonded by the application of an adhesive agent, and at the same time, an inner side of said extrusions being filled in by a filling agent for the insulating protection of said electrode lead-out portion.

20. A solar-cell apparatus according to claim 19, wherein the viscosity of said adhesive agent for bonding the apparatus and said hollow structure is more than about 300 poise.

21. A solar-cell apparatus according to claim 19, wherein the viscosity of said filling agent to fill in the inner side from an inner edge of said extrusions for the insulating protection of said electrode lead-out portion is less than 1,000 poise.

22. A solar-cell apparatus, comprising:
a solar-cell element;
a filling material in contact with said solar cell element;
a weatherability film;
a reinforcement material on which said solar-cell element is provided, with said weatherability film provided on a light-receiving side of said solar cell element;
an electrode lead-out portion having a lead line; and
a hollow structure arranged on at least one of said weatherability film and a rear side of said reinforcement material, wherein
said hollow structure is provided with an extrusion on a circumferential edge of a surface to be bonded by application of an adhesive agent.

23. A solar-cell apparatus according to claim 22, wherein said hollow structure comprises a stand unit and a lid member, and said extrusion is formed on said stand unit.

24. A solar-cell apparatus according to claim 23, wherein said stand unit is bonded by filling in a filling sealant agent having the viscosity of less than about 1,000 poise in an interior of said hollow structure.

25. A solar-cell apparatus according to claim 22, wherein said extrusion and an apparatus to which it is bonded are formed together by means of a double coated adhesive tape.

26. A solar-cell apparatus, comprising:
a solar-cell element;
a filling material in contact with said solar cell element;
a weatherability film;
a reinforcement material on which said solar-cell element is provided, with said weatherability film provided on a light-receiving side of said solar cell element;
an electrode lead-out portion having a lead line; and
a hollow structure arranged on at least one of said weatherability film and a rear side of said reinforcement material, wherein
a hollow structure having a lead-in hole on a bottom thereof for drawing in a lead line drawn out from an electrode lead-out portion, a lead-out hole on one side thereof to lead-out an output cable, and an aperture on an upper part thereof, and with a lid member to cover said aperture,
said hollow structure being provided with an extrusion on said one side adjacent to both side faces, and said lid member being provided with a flexible hooking portion including a recessed portion to engage with said extrusion.

27. A solar-cell apparatus according to claim 26, wherein a bottom of said flexible hooking portion comprises a hooking portion to release engagement between said extrusion and said recessed portion, and when said hollow structure and said lid member are fitted together, the distance from the bottom of said flexible hooking portion to that of said hollow structure is less than 8 mm, and said engagement is released only when a disengagement tool is used, and then, the disengagement is possible only when the disengagement tool is hooked to said hooking portion.

28. A solar-cell apparatus, comprising:
a solar-cell element;
a filling material in contact with said solar cell element;
a weatherability film;
a reinforcement material on which said solar-cell element is provided, with said weatherability film provided on a light-receiving side of said solar cell element;
an electrode lead-out portion having a lead line; and
a hollow structure arranged on at least one of said weatherability film and a rear side of said reinforcement material, wherein
said hollow structure has a lead-in hole on a bottom thereof for drawing in a lead line drawn out from an electrode lead-out portion, a lead-out hole on one side thereof to lead-out an output cable, and an aperture on an upper part thereof, and with a lid member to cover said aperture,
said hollow structure is provided on a fitting surface with a first connector being either one of an extrusion and a recessed groove, and said lid member is provided on the fitting surface with a second connector being the other one of either an extrusion and a recessed groove to fit said first connector, and said hollow structure is provided with a receiving portion of a flexible hooking portion, and the width thereof is made equal to the width of said flexible hooking portion, and then, said receiving portion is arranged in a recess from the outer circumference of said hollow structure corresponding to the thickness of said flexible hooking portion so that when said hollow structure and said lid member are fitted together, the outer surface of said hollow structure and that of said flexible hooking portion make substantially a flat surface.

29. A solar-cell apparatus according to claim 28, wherein the bottom of said flexible hooking portion comprises a hooking portion to release the engagement between said extrusion and said recessed portion, and when said hollow structure and said lid member are fitted together, the distance from the bottom of said flexible hooking portion to that of said hollow structure is less than 8 mm, and said engagement is released only when a disengagement tool is used, and then, the disengagement is possible only when the disengagement tool is hooked to said hooking portion.

30. A solar-cell apparatus, comprising:
a solar-cell element;
a filling material in contact with said solar cell element;
a weatherability film;
a reinforcement material on which said solar-cell element is provided, with said weatherability film provided on a light-receiving side of said solar cell element;
an electrode lead-out portion having a lead line; and
a hollow structure arranged on at least one of said weatherability film and a rear side of said reinforcement material, wherein
said hollow structure is installed on said electrode lead-out portion for insulating protection, a lead line for use of leading out drawn out from said electrode lead-out portion, an output lead line connecting with another solar cell module, and a terminal unit for connecting said lead line for use of leading out and said output lead line in said hollow structure,
said hollow structure being provided with a through hole arranged on said electrode lead-out portion to guide said lead line for use of leading out into said hollow structure through said through hole, and said terminal unit being arranged to extrude from an inner wall of said hollow structure, at the same time being provided with a terminal stand having an aperture therein at the leading end of said extrusion, a first screw having a threaded surface inserted into the aperture of said terminal stand, and a second screw having a threaded surface to be screwed with said first screw through said aperture to connect the end portion of said lead line for leading out and that of said output lead line by means of screw fixation, wherein
said terminal stand extrudes from the inner wall of the installation surface side of said hollow structure, and a spacer is arranged in the aperture of said terminal stand in order to prevent said first screw from falling off or being displaced from a given position.

31. A solar-cell apparatus according to claim 30, wherein the said first screw is a hexagon nut.

32. A solar-cell apparatus according to claim 30, wherein the aperture of said terminal stand is provided with an extrusion to hook said first screw.

33. A solar-cell apparatus according to claim 30, wherein a washer is arranged between said first screw and said second screw.

34. A solar-cell apparatus according to claim 33, wherein said second screw is a cross recessed round head screw.

35. A solar-cell apparatus according to claim 33, wherein said washer is either one of a spring washer and flat washer, a disc washer, and a toothed washer and flat washer.

36. A solar-cell apparatus according to claim 33, wherein the threaded surfaces of said first and second screws and said washer are chrome plated.

37. A solar-cell apparatus according to claim 30, wherein the threaded surfaces of said first and second screws are chrome plated.

38. A solar-cell apparatus according to claim 30, wherein a pressure contact terminal treatment is provided for each end portion of said lead line for leading out and said output lead line to be screw fixed.

39. A solar-cell apparatus according to claim 38, wherein the location of the axial center of said lead lines is soldered on the portion of said pressure contact terminal treatment that is processed for each of them.

40. A solar-cell apparatus, comprising:
a solar-cell element;
a filling material in contact with said solar cell element;
a weatherability film;
a reinforcement material on which said solar-cell element is provided, with said weatherability film provided on a light-receiving side of said solar cell element;
an electrode lead-out portion having a lead line; and
a hollow structure arranged on at least one of said weatherability film and a rear side of said reinforcement material, with
said hollow structure installed on an electrode lead-out portion of an apparatus for the insulating protection of said electrode lead-out portion, a lead line for use of leading out drawn out from said electrode lead-out portion, an output lead line connecting with another solar cell module, and a terminal unit for connecting said lead line for use of leading out and said output lead line in said hollow structure,
said hollow structure being provided with a through hole arranged on said electrode lead-out portion to guide said lead line for use of leading out into said hollow structure through said through hole, and said terminal unit being arranged to extrude from the inner wall of said hollow structure, at the same time being provided with a terminal stand having an aperture therein at the leading end of said extrusion, a first screw having a threaded surface inserted into the aperture of said terminal stand, and a second screw having a threaded surface to be screwed with said first screw through said aperture to connect the end portion of said lead line for use of leading out and that of said output lead line by means of screw fixation.

41. A solar-cell apparatus according to claim 40, wherein said first screw is a hexagon unit.

42. A solar-cell apparatus according to claim 40, wherein the aperture of said terminal stand is provided with an extrusion to hook said first screw.

43. A solar-cell apparatus according to claim 40, wherein said spacer is configured to be a recess having the plane or configured to be cylindrical.

44. A solar-cell apparatus according to claim 40, wherein a washer is arranged between said first screw and said second screw.

45. A solar-cell apparatus according to claim 44, wherein said second screw is a cross recessed round head screw.

46. A solar-cell apparatus according to claim 44, wherein said washer is either one of a spring washer and flat washer, a disc washer, and a toothed washer and flat washer.

47. A solar-cell apparatus according to claim 44, wherein the threaded surfaces of said first and second screws and said washer are chrome plated.

48. A solar-cell apparatus according to claim 40, wherein the threaded surfaces of said first and second screws are chrome plated.

49. A solar-cell apparatus according to claim 40, wherein a pressure contact terminal treatment is provided for each end portion of said lead line for use of leading out and said output lead line to be screw fixed.

50. A solar-cell apparatus according to claim 49, wherein the location of the axial center of said lead line is soldered on the portion of said pressure contact terminal treatment that is processed for each of them.

51. A solar-cell apparatus, comprising:
a solar-cell element;
a filling material in contact with said solar cell element;
a weatherability film;
a reinforcement material on which said solar-cell element is provided, with said weatherability film provided on a light-receiving side of said solar cell element;
an electrode lead-out portion having a lead line; and
a hollow structure arranged on at least one of said weatherability film and a rear side of said reinforcement material, wherein
an adhesive agent fixes the apparatus to cover an output lead-out portion, including a lead-in hole near a central part of the bottom thereof to draw in an output lead line drawn out from said output lead-out portion,
a sticky adhesive agent being applied to a circumference of said output lead-out portion and said lead-in hole, on the outer side of said sticky adhesive agent, said adhesive agent being applied, and said terminal lead-out structure being bonded to the apparatus by the application of said sticky adhesive agent and said adhesive agent.

52. A solar-cell apparatus according to claim 51, provided with a lead-out hole on one side thereof for drawing out an output lead-out conductor connected with said output lead line in said terminal lead out structure.

53. A solar-cell apparatus according to claim 52, provided with irregularities on a bottom face having said sticky adhesive agent and said adhesive agent being applied.

54. A solar-cell apparatus, comprising:
a solar-cell element;
a filling material in contact with said solar cell element;
a weatherability film;
a reinforcement material on which said solar-cell element is provided, with said weatherability film provided on a light-receiving side of said solar cell element;
an electrode lead-out portion having a lead line; and
a hollow structure arranged on at least one of said weatherability film and a rear side of said reinforcement material, wherein
said hollow structure has a lead-in hole on a bottom thereof to draw in a lead line drawn out from an electrode lead-out portion of an apparatus, and said hollow structure has a hole on one side thereof to lead out an output cable and an aperture on an upper part thereof, and with a lid member to cover said aperture by fitting it with said hollow structure,
said hollow structure being integrally formed with said lid member through a flexible hinge portion, and said hollow structure being provided with a first connector of one of either an extrusion and a recessed portion on the side face opposite to the side having said flexible hinge portion thereon, while said lid member being provided with a flexible hooking portion including a second connector of the other of either an extrusion and a recessed portion to engage with said first connector, and a hooking portion being arranged on a bottom side of said flexible hooking portion to release the engagement between said extrusion and said recessed portion.

55. A solar-cell apparatus according to claim 54, wherein said hollow structure is provided on the fitting surface thereof with a first connector being either one of an extrusion and a recessed groove, and said lid member is provided on the fitting surface thereof with a second connector being the other one of an extrusion and a recessed groove to fit said extrusion.

56. A solar-cell apparatus according to claim 54, wherein when said hollow structure and said lid member engage with each other, the distance from the bottom side of said flexible hooking portion to the bottom face of said hollow structure is less than 8 mm, and only when a disengagement tool is used, said engagement can be released, and said engagement is released only by means of the disengagement tool being hooked to said hooking portion.

57. A solar-cell apparatus, comprising:
a solar-cell element;
a filling material in contact with said solar cell element;
a weatherability film;
a reinforcement material on which said solar-cell element is provided, with said weatherability film provided on a light-receiving side of said solar cell element;
an electrode lead-out portion having a lead line;
a hollow structure disposed on at least one of said weatherability film and a rear side of said reinforcement material; and
a terminal lead-out structure and a cable for use of electrical output, said terminal lead-out structure being provided with a fixing member to fix said cable for use of electrical output.

58. A solar-cell according to claim 57, wherein said fixing member fixes said cable for use of electrical output directly.

59. A solar-cell according to claim 57, wherein a connector is arranged for the leading end of said fixing member to fix said connector.

60. A solar-cell according to claim 59, wherein said fixing member fixes said cable for use of electrical output and said connector only in one posture and configuration, and said connector has a directional extension and said fixing member is provided with a groove to match said extrusion.

61. A solar-cell apparatus, comprising:
a solar-cell element having a light-receiving side treated with an electrical discharge;
a filling material in contact with said solar cell element;
a weatherability film;
a substrate on which said solar-cell element is provided, with said weatherability film provided on said light-receiving side;
an electrode lead-out portion having a lead line and disposed on said weatherability film; and
a hollow structure disposed on said treated light-receiving surface for the insulating protection of said electrode lead-out portion; and
a filling agent filled in an interior of said hollow structure.

62. A terminal lead-out structure, comprising:
a lead line drawn out from an electrode lead out portion on a light receiving surface side of a solar cell module provided with a weatherability film treated with electrical discharge at least on a part of said light receiving surface as a surface coating material; and a hollow structure providing insulating protection of said electrode lead-out portion.

63. A solar-cell apparatus, comprising:

a solar cell element;

a weatherability film, having a light-receiving surface treated with an electrical discharge on at least part of said surface;

a substrate on which said solar cell element and said filling material are provided and sandwiched between said weatherability film and said substrate;

an electrode lead-out portion having a lead line and disposed on said light receiving surface; and a hollow structure arranged on the treated light-receiving surface and providing insulating protection for said electrode lead-out portion.

* * * * *

UNITED STATES PATENT AND TRADEMARK OFFICE
CERTIFICATE OF CORRECTION

PATENT NO.   : 6,462,265 B1
DATED        : October 8, 2002
INVENTOR(S)  : Makoto Sasaoka et al.

It is certified that error appears in the above-identified patent and that said Letters Patent is hereby corrected as shown below:

Column 11,
Line 60, "schematically" should read -- schematical --.

Column 12,
Line 41, "form" should read -- from --.

Column 16,
Line 45, "improved,-" should read -- improved, --.

Column 17,
Line 18, "allows" should read -- allow --.

Column 22,
Line 47, "the-" should read -- the --.

Column 32,
Line 38, "hollows" should read -- hollow --.

Signed and Sealed this

Sixth Day of May, 2003

JAMES E. ROGAN
*Director of the United States Patent and Trademark Office*